United States Patent
Chandrashekar et al.

(10) Patent No.: US 9,240,347 B2
(45) Date of Patent: Jan. 19, 2016

(54) TUNGSTEN FEATURE FILL

(71) Applicant: Novellus Systems, Inc., Fremont, CA (US)

(72) Inventors: Anand Chandrashekar, Fremont, CA (US); Esther Jeng, Los Altos, CA (US); Raashina Humayun, Los Altos, CA (US); Michal Danek, Cupertino, CA (US); Juwen Gao, San Jose, CA (US); Deqi Wang, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 14/502,817

(22) Filed: Sep. 30, 2014

(65) Prior Publication Data
US 2015/0056803 A1 Feb. 26, 2015

Related U.S. Application Data

(63) Continuation of application No. 13/851,885, filed on Mar. 27, 2013.

(60) Provisional application No. 61/616,377, filed on Mar. 27, 2012.

(51) Int. Cl.
*H01L 21/44* (2006.01)
*H01L 21/768* (2006.01)
(Continued)

(52) U.S. Cl.
CPC ........ *H01L 21/76879* (2013.01); *C23C 16/045* (2013.01); *H01L 21/28556* (2013.01);
(Continued)

(58) Field of Classification Search
CPC ................... H01L 21/76879; H01L 21/76877; H01L 21/76898

USPC .................................................. 438/666, 675
See application file for complete search history.

(56) References Cited

U.S. PATENT DOCUMENTS 4,714,520 A 12/1987 Gwozdz
4,746,375 A 5/1988 Iacovangelo
(Continued)

FOREIGN PATENT DOCUMENTS

EP 0 437 110 7/1991
EP 1 055 746 11/2000
(Continued)

OTHER PUBLICATIONS

US Notice of Allowance dated Mar. 18, 2015 issued in U.S. Appl. No. 14/285,505.
(Continued)

*Primary Examiner* — Bradley K Smith
(74) *Attorney, Agent, or Firm* — Weaver Austin Villeneuve & Sampson LLP

(57) ABSTRACT

Described herein are methods of filling features with tungsten and related systems and apparatus. The methods include inside-out fill techniques as well as conformal deposition in features. Inside-out fill techniques can include selective deposition on etched tungsten layers in features. Conformal and non-conformal etch techniques can be used according to various implementations. The methods described herein can be used to fill vertical features, such as in tungsten vias, and horizontal features, such as vertical NAND (VNAND) word lines. Examples of applications include logic and memory contact fill, DRAM buried word line fill, vertically integrated memory gate/word line fill, and 3-D integration with through-silicon vias (TSVs).

20 Claims, 36 Drawing Sheets

(51) Int. Cl.
    *H01L 21/285*     (2006.01)
    *H01L 27/105*     (2006.01)
    *H01L 27/108*     (2006.01)
    *C23C 16/04*     (2006.01)
    *H01L 21/321*     (2006.01)
    *H01L 21/3213*     (2006.01)

(52) U.S. Cl.
    CPC .... *H01L21/28562* (2013.01); *H01L 21/32133* (2013.01); *H01L 21/76874* (2013.01); *H01L 21/76877* (2013.01); *H01L 21/76883* (2013.01); *H01L 21/76898* (2013.01); *H01L 27/1052* (2013.01); *H01L 27/10891* (2013.01); *H01L 21/321* (2013.01); *H01L 21/32136* (2013.01)

(56) References Cited

U.S. PATENT DOCUMENTS

| | | | |
|---|---|---|---|
| 4,804,560 A | 2/1989 | Shioya et al. | |
| 4,874,719 A | 10/1989 | Kurosawa | |
| 4,962,063 A | 10/1990 | Maydan et al. | |
| 5,028,565 A | 7/1991 | Chang et al. | |
| 5,037,775 A | 8/1991 | Reisman | |
| 5,164,330 A | 11/1992 | Davis et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,489,552 A | 2/1996 | Merchant et al. | |
| 5,567,583 A | 10/1996 | Wang et al. | |
| 5,661,080 A | 8/1997 | Hwang et al. | |
| 5,719,410 A | 2/1998 | Suehiro et al. | |
| 5,726,096 A | 3/1998 | Jung | |
| 5,747,379 A | 5/1998 | Huang et al. | |
| 5,767,015 A | 6/1998 | Tabara | |
| 5,795,824 A | 8/1998 | Hancock | |
| 5,804,249 A | 9/1998 | Sukharev et al. | |
| 5,807,786 A | 9/1998 | Chang | |
| 5,817,576 A | 10/1998 | Tseng et al. | |
| 5,833,817 A | 11/1998 | Tsai et al. | |
| 5,866,483 A | 2/1999 | Shiau et al. | |
| 5,913,145 A | 6/1999 | Lu et al. | |
| 5,916,365 A | 6/1999 | Sherman | |
| 5,926,720 A | 7/1999 | Zhao et al. | |
| 5,956,609 A | 9/1999 | Lee et al. | |
| 5,963,833 A | 10/1999 | Thakur | |
| 5,994,749 A | 11/1999 | Oda | |
| 6,001,729 A | 12/1999 | Shinriki et al. | |
| 6,011,311 A | 1/2000 | Hsing et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,100,193 A | 8/2000 | Suehiro et al. | |
| 6,107,200 A | 8/2000 | Takagi et al. | |
| 6,110,822 A | 8/2000 | Huang et al. | |
| 6,143,082 A | 11/2000 | McInerney et al. | |
| 6,174,812 B1 | 1/2001 | Hsiung et al. | |
| 6,184,158 B1 | 2/2001 | Shufflebotham et al. | |
| 6,206,967 B1 | 3/2001 | Mak et al. | |
| 6,221,754 B1 | 4/2001 | Chiou et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,376,376 B1 | 4/2002 | Lim et al. | |
| 6,383,910 B2 | 5/2002 | Okada et al. | |
| 6,404,054 B1 | 6/2002 | Oh et al. | |
| 6,429,126 B1 | 8/2002 | Herner et al. | |
| 6,432,830 B1 | 8/2002 | Merry | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,683,000 B2 | 1/2004 | Fukui et al. | |
| 6,696,337 B2 | 2/2004 | Asano et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,193,369 B2 | 3/2007 | Min et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,355,254 B2 | 4/2008 | Datta et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,578,944 B2 | 8/2009 | Min et al. | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 7,993,460 B2 | 8/2011 | Steger | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,071,478 B2 | 12/2011 | Wu et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,119,527 B1 | 2/2012 | Chandrashekar et al. | |
| 8,124,531 B2 | 2/2012 | Chandrashekar et al. | |
| 8,129,270 B1 | 3/2012 | Chandrashekar et al. | |
| 8,153,520 B1 | 4/2012 | Chandrashekar et al. | |

(56) References Cited

U.S. PATENT DOCUMENTS

| | | |
|---|---|---|
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,435,894 B2 | 5/2013 | Chandrashekar et al. |
| 8,501,620 B2 | 8/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 8,835,317 B2 | 9/2014 | Chandrashekar et al. |
| 8,853,080 B2 | 10/2014 | Guan et al. |
| 8,975,184 B2 | 3/2015 | Chen et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0090796 A1 | 7/2002 | Desai et al. |
| 2002/0117399 A1 | 8/2002 | Chen et al. |
| 2002/0132472 A1 | 9/2002 | Park |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0177325 A1 | 11/2002 | Takewaka et al. |
| 2003/0017701 A1 | 1/2003 | Nakahara et al. |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen et al. |
| 2003/0190802 A1 | 10/2003 | Wang et al. |
| 2004/0014315 A1 | 1/2004 | Lai et al. |
| 2004/0025091 A1 | 2/2004 | Totman et al. |
| 2004/0044127 A1 | 3/2004 | Okubo et al. |
| 2004/0077161 A1 | 4/2004 | Chen et al. |
| 2004/0079632 A1 | 4/2004 | Ahmad et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0245091 A1 | 12/2004 | Karim et al. |
| 2004/0247788 A1 | 12/2004 | Fang et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 | 9/2005 | Matsuse et al. |
| 2005/0250316 A1 | 11/2005 | Choi et al. |
| 2005/0275941 A1 | 12/2005 | Liu et al. |
| 2006/0003581 A1 | 1/2006 | Johnston et al. |
| 2006/0075966 A1 | 4/2006 | Chen et al. |
| 2006/0084269 A1 | 4/2006 | Min et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0214244 A1 | 9/2006 | Minakata |
| 2006/0284317 A1 | 12/2006 | Ito et al. |
| 2007/0087560 A1 | 4/2007 | Kwak et al. |
| 2007/0099420 A1 | 5/2007 | Dominguez et al. |
| 2007/0187362 A1 | 8/2007 | Nakagawa et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2009/0045517 A1 | 2/2009 | Sugiura et al. |
| 2009/0053893 A1 | 2/2009 | Khandelwal et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0035427 A1 | 2/2010 | Chan et al. |
| 2010/0055904 A1 | 3/2010 | Chen et al. |
| 2010/0072623 A1 | 3/2010 | Prindle et al. |
| 2010/0130002 A1* | 5/2010 | Dao et al. ............... 438/628 |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0240212 A1 | 9/2010 | Takahashi |
| 2010/0244141 A1 | 9/2010 | Beyer et al. |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0156154 A1 | 6/2011 | Hoentschel et al. |
| 2011/0159690 A1 | 6/2011 | Chandrashekar et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1* | 1/2012 | Chandrashekar et al. .... 438/669 |
| 2012/0015518 A1 | 1/2012 | Chandrashekar et al. |
| 2012/0040530 A1 | 2/2012 | Humayun et al. |
| 2012/0115329 A1 | 5/2012 | Chandrashekar et al. |
| 2012/0164832 A1 | 6/2012 | Chandrashekar et al. |
| 2012/0199887 A1 | 8/2012 | Chan et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0171822 A1 | 7/2013 | Chandrashekar et al. |
| 2013/0285195 A1 | 10/2013 | Piper |
| 2013/0302980 A1 | 11/2013 | Chandrashekar et al. |
| 2013/0330926 A1 | 12/2013 | Chandrashekar et al. |
| 2014/0011358 A1 | 1/2014 | Chen et al. |
| 2014/0017891 A1 | 1/2014 | Chandrashekar et al. |
| 2014/0027664 A1 | 1/2014 | Lei et al. |
| 2014/0030889 A1 | 1/2014 | Chen et al. |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |
| 2014/0349477 A1 | 11/2014 | Chandrashekar et al. |
| 2015/0024592 A1 | 1/2015 | Chandrashekar et al. |
| 2015/0056803 A1 | 2/2015 | Chandrashekar et al. |

FOREIGN PATENT DOCUMENTS

| | | |
|---|---|---|
| EP | 1 156 132 | 11/2001 |
| EP | 1 179 838 | 2/2002 |
| JP | H04-56130 | 2/1992 |
| JP | H07-094488 | 4/1995 |
| JP | H07-226393 | 8/1995 |
| JP | 08-115984 | 5/1996 |
| JP | 09-027596 | 1/1997 |
| JP | H09-326436 | 12/1997 |
| JP | H10-144688 | 5/1998 |
| JP | H10-163132 | 6/1998 |
| JP | H10-178014 A | 6/1998 |
| JP | 11-330006 | 11/1999 |
| JP | 2000-208516 | 7/2000 |
| JP | 2000-235962 | 8/2000 |
| JP | 2001-007048 | 1/2001 |
| JP | 2001-274114 | 10/2001 |
| JP | 2001-525889 | 12/2001 |
| JP | 2002-009017 | 1/2002 |
| JP | 2002-124488 | 4/2002 |
| JP | 2002-305162 | 10/2002 |
| JP | 2003-007677 | 1/2003 |
| JP | 2003-142484 | 5/2003 |
| JP | 2004-235456 | 8/2004 |

(56) References Cited

FOREIGN PATENT DOCUMENTS

| | | |
|---|---|---|
| JP | 2004-273764 | 9/2004 |
| JP | 2005-029821 | 2/2005 |
| JP | 2005-518088 | 6/2005 |
| JP | 2006-278496 | 10/2006 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-533877 | 9/2009 |
| JP | 2009-540123 | 11/2009 |
| JP | 2010-225697 | 10/2010 |
| KR | 10-2002-0049730 | 6/2002 |
| KR | 10-2003-0035877 | 5/2003 |
| KR | 10-2003-0058853 | 7/2003 |
| KR | 10-2004-0087406 | 10/2004 |
| KR | 10-2005-0011479 | 1/2005 |
| KR | 10-2005-0013187 | 2/2005 |
| KR | 10-2005-0022261 | 3/2005 |
| KR | 10-2005-0087428 | 8/2005 |
| KR | 10-2006-0087844 | 8/2006 |
| KR | 705936 | 4/2007 |
| KR | 10-2008-0036679 | 4/2008 |
| KR | 10-2008-0110897 | 12/2008 |
| KR | 10-2009-0103815 | 10/2009 |
| KR | 10-2010-0067065 | 6/2010 |
| KR | 1201074 | 11/2012 |
| TW | 557503 | 10/2003 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/148444 | 10/2013 |
| WO | WO 2013/148880 | 10/2013 |
| WO | WO 2014/058536 | 4/2014 |

OTHER PUBLICATIONS

US Office Action dated Dec. 30, 2009 issued in U.S. Appl. No. 12/332,017.
US Final Office Action dated Jul. 26, 2010 issued in U.S. Appl. No. 12/332,017.
US Office Action dated Nov. 15, 2010 issued in U.S. Appl. No. 12/332,017.
US Final Office Action dated Jul. 22, 2011 issued in U.S. Appl. No. 12/332,017.
US Notice of Allowance dated Oct. 28, 2011 issued in U.S. Appl. No. 12/332,017.
US Office Action dated Nov. 1, 2010 issued in U.S. Appl. No. 12/535,377.
US Office Action dated Jun. 14, 2011 issued in U.S. Appl. No. 12/535,377.
US Final Office Action dated Dec. 1, 2011 issued in U.S. Appl. No. 12/535,377.
US Office Action dated Mar. 7, 2013 issued in U.S. Appl. No. 12/535,377.
US Final Office Action dated Oct. 7, 2013 issued in U.S. Appl. No. 12/535,377.
US Office Action dated Nov. 23, 2012 issued in U.S. Appl. No. 13/412,534.
US Notice of Allowance dated Apr. 8, 2013, issued in U.S. Appl. No. 13/412,534.
US Office Action dated Apr. 11, 2014 issued in U.S. Appl. No. 13/934,089.
US Office Action dated Nov. 12, 2014 issued in U.S. Appl. No. 13/934,089.
US Office Action dated Sep. 13, 2010 issued in U.S. Appl. No. 12/535,464.
US Final Office Action dated Apr. 14, 2011 issued in U.S. Appl. No. 12/535,464.
US Office Action dated Jul. 28, 2011 issued in U.S. Appl. No. 12/535,464.
US Office Action dated Oct. 12, 2011 issued in U.S. Appl. No. 12/535,464.
US Notice of Allowance dated Dec. 30, 2011 issued in U.S. Appl. No. 12/535,464.
US Office Action dated Sep. 2, 2011 issued in U.S. Appl. No. 12/534,566.
US Notice of Allowance dated Dec. 20, 2011 issued in U.S. Appl. No. 12/534,566.
US Office Action dated Mar. 13, 2012 issued in U.S. Appl. No. 12/833,823.
US Final Office Action dated Dec. 21, 2012 issued in U.S. Appl. No. 12/833,823.
US Office Action dated Sep. 9, 2013 issued in U.S. Appl. No. 12/833,823.
US Final Office Action dated Apr. 1, 2014 issued in U.S. Appl. No. 12/833,823.
US Notice of Allowance dated Jan. 14, 2015 issued in U.S. Appl. No. 12/833,823.
US Office Action dated Nov. 25, 2011 issued in U.S. Appl. No. 13/016,656.
US Notice of Allowance dated Jan. 9, 2012 issued in U.S. Appl. No. 13/016,656.
US Office Action dated Mar. 27, 2012 issued in U.S. Appl. No. 13/351,970.
US Final Office Action dated Sep. 11, 2012 issued in U.S. Appl. No. 13/351,970.
US Notice of Allowance dated Jan. 9, 2013 issued in U.S. Appl. No. 13/351,970.
US Office Action dated Jan. 6, 2014 issued in U.S. Appl. No. 13/888,077.
US Notice of Allowance, dated May 12, 2014 issued in U.S. Appl. No. 13/888,077.
US Office Action, dated Jan. 15, 2015, issued in U.S. Appl. No. 13/774,350.
US Office Action, dated Dec. 23, 2014, issued in U.S. Appl. No. 13/851,885.
JP Office Action dated Mar. 11, 2014 issued in Japanese Application No. 2009-278990.
JP Final Office Action dated Mar. 17, 2015 issued in Japanese Application No. 2009-278990.
KR Office Action dated Aug. 8, 2011 issued in Korean Application No. 10-2009-0122292.
KR Office Action dated Jun. 26, 2012 issued in Korean Application No. 10-2009-0122292.
KR Office Action dated Nov. 6, 2012, issued in Korean Application No. 2012-0104518.
TW Office Action dated Mar. 27, 2014, issued in Taiwan Application No. 098142115.
TW Office Action (Decision) dated Oct. 13, 2014, issued in Taiwan Application No. 098142115.
JP Office Action dated Feb. 25, 2014 issued in Japanese Application No. 2009-292610.
JP Office Action dated Feb. 10, 2015 issued in Japanese Application No. 2009-292610.
KR Office Action dated Sep. 12, 2012 issued in Korean Application No. 2012-0104518.
TW Office Action dated Apr. 29, 2014, issued in Taiwan Application No. 098146010.

(56) References Cited

OTHER PUBLICATIONS

SG Examination and Search Report dated Dec. 14, 2011 issued in Singapore Application No. 201005237-1.
KR Provisional Rejection dated Nov. 16, 2012, issued in Korean Application No. 2011-0068603.
PCT International Search Report and Written Opinion, dated Jun. 28, 2013, issued in PCT/US2013/033174.
Chen et al., (Aug. 2003) "Advances in Remote Plasma Sources for Cleaning 300 mm and Flat Panel CVD Systems," *Semiconductor Magazine*, 6 pp.
Deposition Process, Oxford Electronics, 1996, 1 page.
Dimensions of Wafer as described by Wikepedia, 2008, 1 page.
Rosner et al., (1971) "Kinetics of the attack of refractory solids by atomic and molecular fluorine," *The Journal of Physical Chemistry*, 75(3):308-317.
Tsang, C.K. et al., "CMOS-Compatible Through Silicon Vias for 3D Process Integration", Materials Research Society 2007 Symposium Proceedings vol. 970, paper 0970-Y01-01.
U.S. Appl. No. 14/135,375, filed Dec. 19, 2013, entitled "Method for Depositing Extremely Low Resistivity Tungsten,".
U.S. Appl. No. 13/758,928, filed Feb. 4, 2013, entitled "Methods for Forming All Tungsten Contacts and Lines.".
US Office Action, dated Apr. 7, 2014, issued in U.S. Appl. No. 13/633,502.
US Final Office Action, dated Nov. 5, 2014, issued in U.S. Appl. No. 13/633,502.
US Notice of Allowance, dated Mar. 2, 2015, issued in U.S. Appl. No. 13/633,502.
US Notice of Allowance (Supplemental Notice of Allowability), dated Apr. 16, 2015, issued in U.S. Appl. No. 13/633,502.
US Office Action, dated May 30, 2014, issued in U.S. Appl. No. 13/862,048.
US Final Office Action, dated Oct. 16, 2014, issued in U.S. Appl. No. 13/862,048.
US Office Action, dated Dec. 11, 2014, issued in U.S. Appl. No. 14/173,733.
US Office Action, dated Jul. 17, 2002, issued in U.S. Appl. No. 09/975,074.
US Notice of Allowance, dated Mar. 12, 2003, issued in U.S. Appl. No. 09/975,074.
US Office Action, dated Feb. 8, 2005, issued in U.S. Appl. No. 10/649,351.
US Final Office Action, dated Jul. 14, 2005, issued in U.S. Appl. No. 10/649,351.
US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435,010.
US Notice of Allowance, dated Jan. 19, 2005, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2005, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Allowance dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.

(56) References Cited

OTHER PUBLICATIONS

US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2013, issued in U.S. Appl. No. 12/723,532.
US Notice of Allowance dated Dec. 24, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013, issued in U.S. Appl. No. 12/755,259.
US Office Action, dated Dec. 18, 2014, issued in U.S. Appl. No. 14/097,160.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Feb. 24, 2014, issued in U.S. Appl. No. 13/020,748.
US Final Office Action, dated Jul. 2, 2014, issued in U.S. Appl. No. 13/020,748.
US Office Action, dated Sep. 18, 2014, issued in U.S. Appl. No. 13/928,216.
US Notice of Allowance, dated Jan. 22, 2015, issued in U.S. Appl. No. 13/928,216.
US Office Action, dated Jun. 20, 2013, issued in U.S. Appl. No. 13/560,688.
US Final Office Action, dated Feb. 14, 2014, issued in U.S. Appl. No. 13/560,688.
US Notice of Allowance, dated Nov. 4, 2014, issued in U.S. Appl. No. 13/560,688.
US Office Action, dated Jun. 14, 2013, issued in U.S. Appl. No. 13/633,798.
US Final Office Action, dated Nov. 26, 2013, issued in U.S. Appl. No. 13/633,798.
US Notice of Allowance, dated May 23, 2014, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. 200980133560.1.
Chinese Second Office Action dated Aug. 7, 2013 issued in Application No. 200980133560.1.
Chinese Third Office Action dated Apr. 22, 2014 issued in Application No. 200980133560.1.
Chinese Fourth Office Action dated Jan. 5, 2015 issued in Application No. 200980133560.1.
Japanese Office Action dated Dec. 3, 2013 issued in Application No. 2011-525228.
Korean Office Action dated Sep. 6, 2012 issued in Application No. 2011-7004322.
Korean Office Action dated Jul. 19, 2013 issued in Application No. 2011-7004322.
Korean Office Action dated Nov. 4, 2013 issued in Application No. 10-2013-7027117.
Korean Office Action dated Jun. 17, 2014 issued in Application No. 10-2013-7027117.
Japanese Office Action dated Jun. 17, 2014 issued in Application No. JP 2010-055163.
Korean Office Action dated Mar. 21, 2013 issued in KR Application No. 10-2010-0024905.
Korean Notification of Provisional Rejection dated Jul. 17, 2012, issued in Application No. 2010-0087997.
Taiwan Office Action and Search Report dated Feb. 12, 2015 issued in TW 099130354.
Japanese Office Action dated Mar. 4, 2014 issued in JP 2010-093522.
Korean Office Action dated Mar. 4, 2013 in KR Application No. 2010-0035449.
Taiwan Office Action dated Dec. 27, 2014 issued in TW 099111860.
Japanese Office Action dated Jul. 29, 2014 issued in JP 2010-093544.
Korean Second Office Action dated Jan. 25, 2014 in KR Application No. 10-2010-0035453.
PCT International Preliminary Report on Patentability and Written Opinion, dated Oct. 9, 2014, issued in PCT/US2013/033174.

(56) References Cited

OTHER PUBLICATIONS

PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Becker, Jill (Apr. 7, 2003) "Diffusion barrier properties of tungsten nitride films grown by atomic layer deposition from bis(*tert*-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on SiO$_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf], *Materials Transactions*, 43(7):1585-1592.

Hoover, Cynthia (Jul. 2007) "Enabling Materials for Contact Metallization," *Praxair Electronic Materials R&D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of WN$_x$C$_y$ Thin Films by ALCVD™ Method for Diffusion Barriers in Metallization," *IITC Conference Report*, 3 pp.
Manik. P, et al. (2012) "Fermi-level unpinning and low resistivity in contacts to n-type Ge with a thin ZnO interfacial layer," *App. Phys. Lett.* 101:182105-5.
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.
US Examiner's Answer to Appeal Brief dated Apr. 17, 2015 issued in U.S. Appl. No. 12/535,377.

* cited by examiner

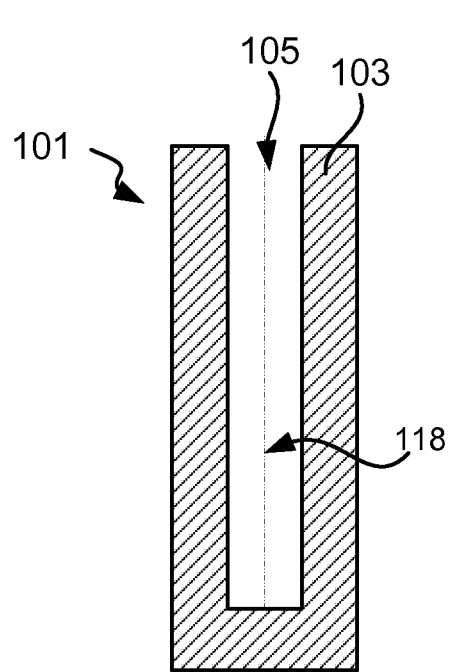
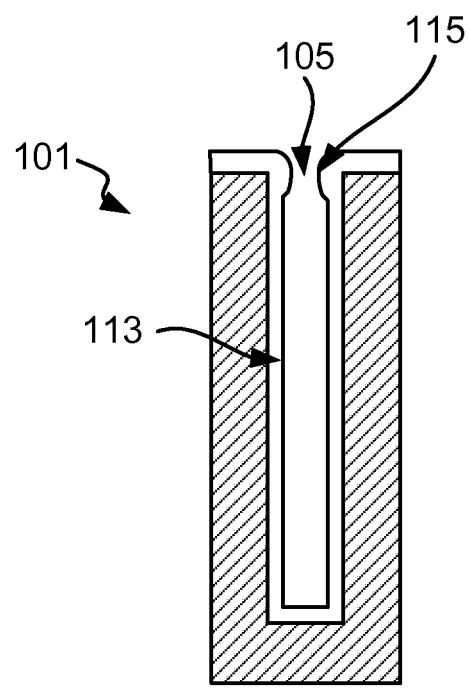
FIG. 1A       FIG. 1B
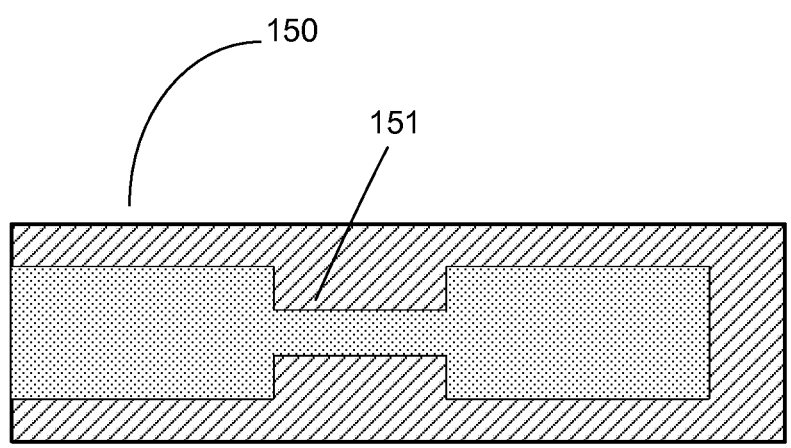
FIG. 1D

Constrictions 151

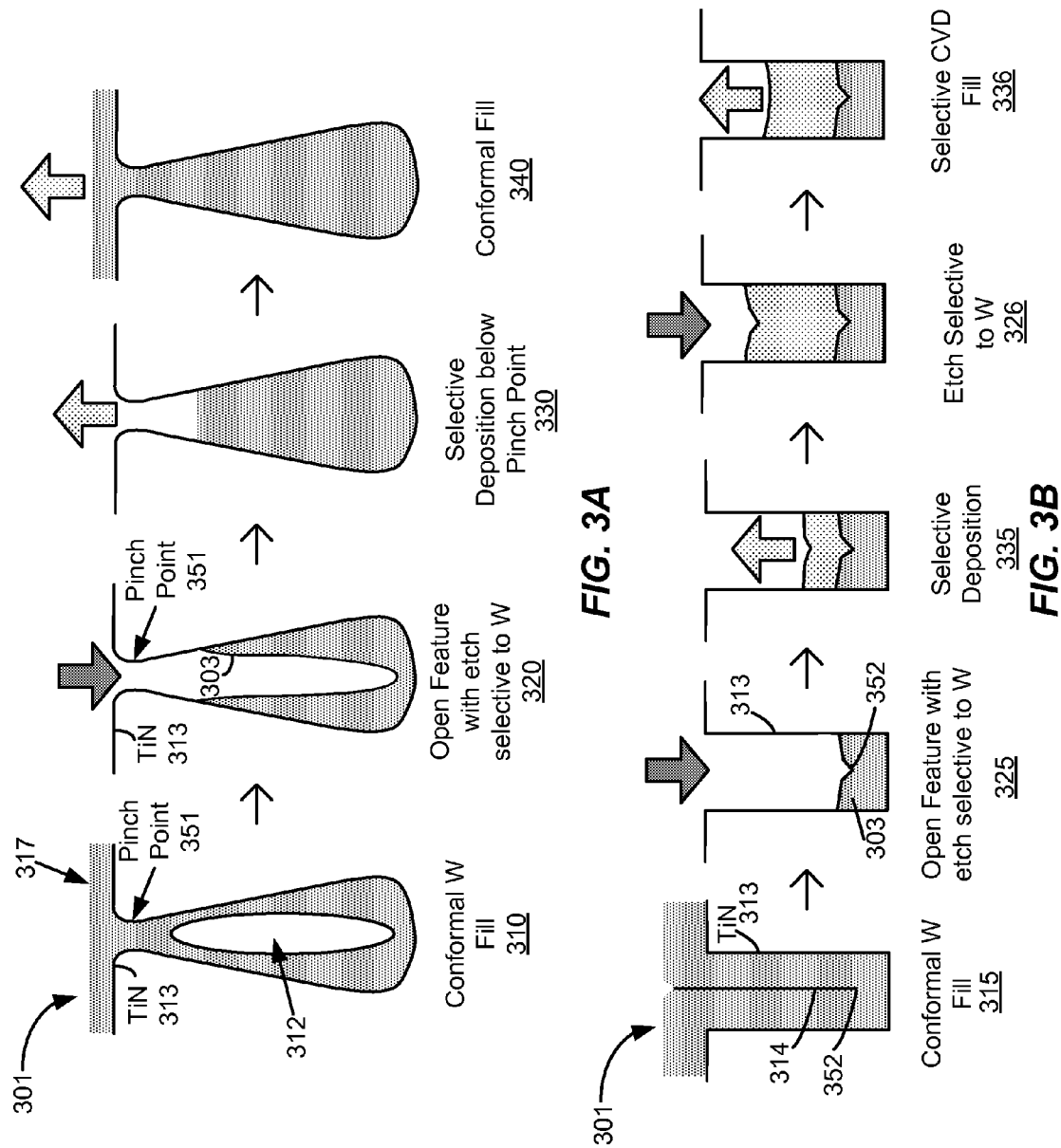

TUNGSTEN FEATURE FILL

CROSS-REFERENCE TO RELATED APPLICATIONS

This application is a continuation of and claims priority to U.S. application Ser. No. 13/851,885, filed Mar. 27, 2013, which claims the benefit of priority under 35 USC §119(e) of U.S. Provisional Patent Application No. 61/616,377, filed Mar. 27, 2012, both of which are incorporated herein by this reference for all purposes.

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing material that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and high aspect ratio features may cause formation of seams and voids inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

One aspect of the subject matter described in this disclosure can be implemented in a method of filling a feature with tungsten including conformally depositing tungsten in the feature to fill the feature with a first bulk tungsten layer, removing a portion of the first bulk tungsten layer to leave an etched tungsten layer in the feature; and selectively depositing a second bulk tungsten layer on the etched tungsten layer. According to various implementations, the second bulk tungsten layer may fill the feature, or one or more additional tungsten layers may be selectively or conformally deposited to complete feature fill. In some implementations, the second bulk tungsten layer may partially fill the feature with the remaining portion of the feature left unfilled.

According to various implementations, conformally filling the feature with the first tungsten bulk layer may include allowing one or more voids and/or seams to be formed in the feature. One or more of the seams and/or voids can be removed or opened when removing a portion of the deposited tungsten layer.

Selectively depositing the second tungsten bulk layer can involve deposition directly on the etched tungsten layer without forming a nucleation layer in the feature. In some implementations, the direction and/or length of grain growth in the second bulk tungsten layer differs from that of the first bulk tungsten layer.

According to various implementations, the feature may be vertically-oriented or horizontally-oriented with reference to the plane of the substrate. In some implementations, the feature may include one or more constrictions or overhangs, and/or have a re-entrant profile. Examples of constrictions include pillar constrictions in a 3-D structure. Removing a portion of the first bulk tungsten layer can include etching past a constriction or overhang.

The first bulk tungsten layer may be deposited on a feature surface, including on a dielectric surface, on an under-layer lining the feature, or on a previously deposited tungsten nucleation layer or bulk tungsten layer. Examples of under-layers include titanium (Ti), titanium nitride (TiN), tungsten nitride (WN), fluorine-free tungsten (FFW), and TiAl (titanium aluminide).

Removing a portion of the first tungsten bulk layer can include exposing the layer to activated species generated in a plasma generator, including those generated in a remotely-generated and/or in-situ generated plasma. Examples of plasma generators that may be used include capacitively coupled plasma (CCP) generators, inductively coupled plasma (ICP) generators, transformer coupled plasma (TCP) generators, electron cyclotron resonance (ECR) generators, and helicon plasma generators. Examples of activated species can include ions, radicals and atomic species. In some implementations, the methods can include exposing the tungsten to radical and atomic species with substantially no ionic species present. In some other implementations, the methods can include exposing the tungsten to ionic species.

In some implementations, the feature is filled with tungsten having a step coverage of over 100%. In some implementations, the second bulk layer of tungsten may be non-conformal to the feature.

Another aspect of the subject matter described herein can be implemented in methods of filling a feature with tungsten that involve providing a substrate including a feature having one or more feature openings, feature sidewalls, a feature interior, and a feature axis extending along the length of the feature, depositing tungsten in the feature to fill the feature with a first bulk tungsten layer, wherein grain growth is substantially orthogonal to the feature axis; removing a portion of the first bulk tungsten layer to leave an etched tungsten layer in the feature; and selectively depositing a second bulk tungsten layer on the etched tungsten layer, wherein grain growth is substantially parallel to the feature axis.

Another aspect of the subject matter described herein can be implemented in methods that involve conformally depositing tungsten in the feature to fill the feature with a first bulk tungsten layer, receiving the substrate after a portion of the tungsten is removed, the received feature including an etched tungsten layer; and selectively depositing a second bulk tungsten layer on the etched tungsten layer. In some implementations, the second bulk tungsten layer can be non-conformal to the feature.

Another aspect of the subject matter described herein can be implemented in methods that involve receiving a substrate including a feature having a feature opening, feature sidewalls, and a closed feature end, the feature filled with a conformal bulk tungsten layer including a void and/or seam formed in the conformal bulk tungsten layer; and etching a portion of the conformal tungsten bulk layer, including removing tungsten from the sidewalls of the feature such that tungsten remains only substantially at the closed end of the feature.

Another aspect of the subject matter described herein can be implemented in methods that involve receiving a substrate including a feature having a feature opening, feature sidewalls, and a closed feature end, the feature filled with a conformal bulk tungsten layer including a void and/or seam formed in the conformal bulk tungsten layer; and etching a portion of the conformal tungsten bulk layer, including removing tungsten from the sidewalls of the feature such that tungsten remains only substantially in the feature interior.

Another aspect of the subject matter described herein can be implemented in methods that involve providing a substrate including a feature having one or more feature openings, feature sidewalls, and a feature interior, depositing a first bulk tungsten layer in the feature; etching the first bulk tungsten layer to form an etched tungsten layer, wherein etching the first bulk tungsten layer includes removing substantially all tungsten in the feature up to a recess depth extending from the one or more feature openings; and depositing a second bulk tungsten layer in the feature.

According to various implementations, the first bulk layer may wholly or partially fill a feature. In some implementations, a void or seam may be formed in the first bulk layer. In some implementations, etching the first bulk layer includes lateral etching of at least a region of the first bulk layer. The second bulk layer may be selectively or conformally deposited in the feature.

Another aspect of the subject matter described herein can be implemented in methods that involve conformally depositing a boron layer in the feature; converting a portion of the boron layer in the feature to tungsten, leaving a remaining boron layer in the feature; selectively etching the tungsten without etching the remaining boron layer; and converting the remaining boron layer to tungsten.

Another aspect of the subject matter described herein can be implemented in methods that involve conformally depositing a boron layer in the feature, the boron layer having a thickness of at least about 5 nm; converting the entire thickness of the boron layer feature to tungsten such that the filled portion of the feature undergoes volumetric expansion; and repeating the conformal deposition and conversion operations one or more times to partially or wholly fill the feature with tungsten.

Another aspect of the subject matter described herein can be implemented in methods that involve conformally depositing a fluorine-free tungsten nitride layer in the feature; and converting the fluorine tungsten nitride layer to a fluorine-free tungsten layer.

Yet another aspect of the subject matter described herein can be implemented in methods that involve conformally depositing a tungsten layer in the feature using a halogen-containing reducing agent; pumping out halogen-containing byproducts; and depositing a fluorine free tungsten-containing on the conformal tungsten layer.

Further aspects can be implemented in apparatus configured to implement any of the methods described herein.

These and other aspects are described further with reference to the Figures.

BRIEF DESCRIPTION OF DRAWINGS

FIGS. 1A-1G show examples of various structures that can be filled with tungsten-containing materials according to the processes described herein.

DETAILED DESCRIPTION OF EXAMPLE IMPLEMENTATIONS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific implementations, it will be understood that it is not intended to limit the invention to the implementations.

Described herein are methods of filling features with tungsten and related systems and apparatus. Examples of application include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as vertical NAND (VNAND) wordlines. The methods may be used for conformal and bottom-up or inside-out fill.

Figure 1C:
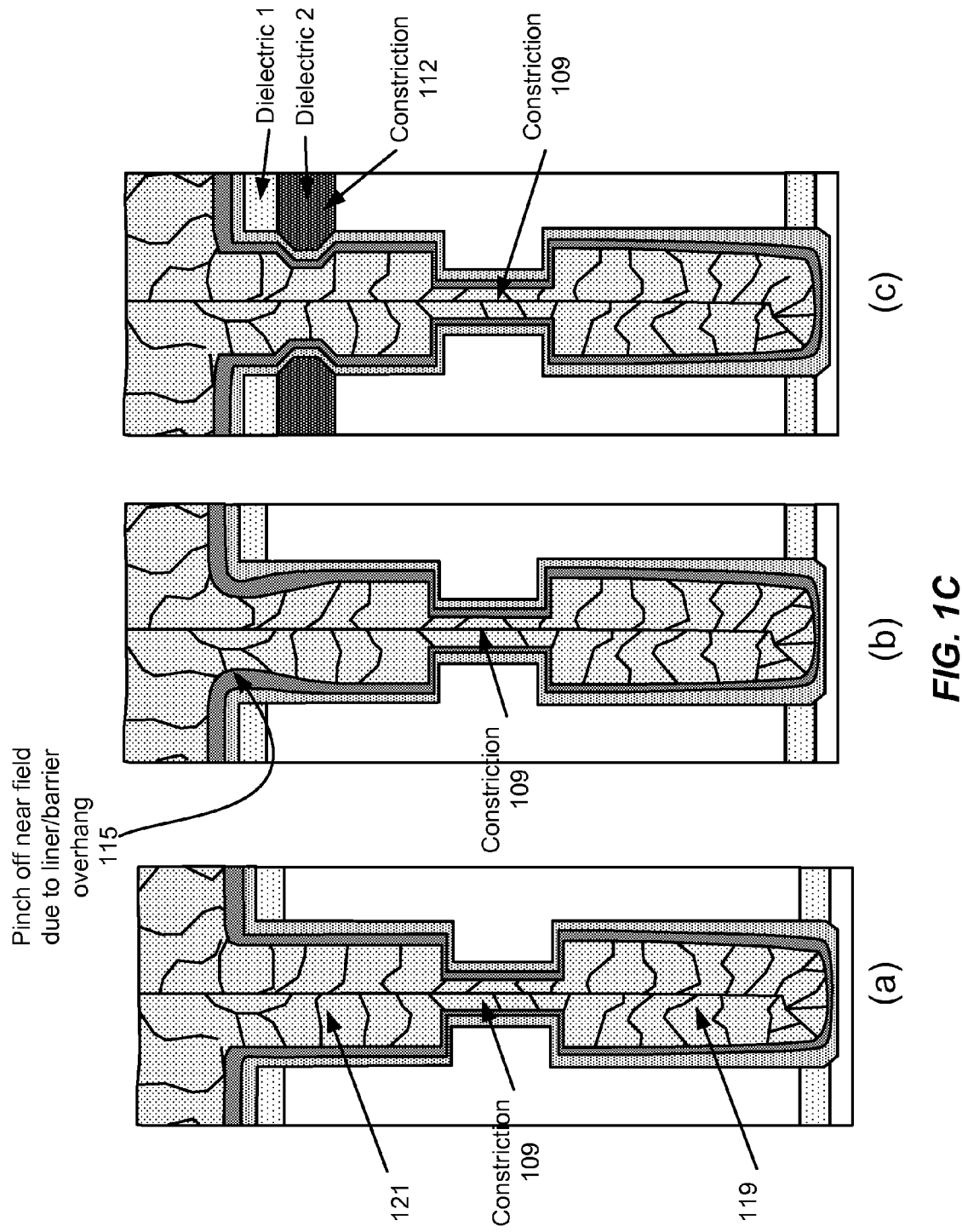

According to various implementations, the features can be characterized by one or more of narrow and/or re-entrant openings, constrictions within the feature, and high aspect ratios. Examples of features that can be filled are depicted in FIGS. 1A-1C. FIG. 1A shows an example of a cross-sectional depiction of a vertical feature 101 to be filled with tungsten. The feature can include a feature hole 105 in a substrate 103. The substrate may be a silicon wafer, e.g., a 200-mm wafer, a 300-mm wafer, or a 450-mm wafer, including wafers having one or more layers of material such as dielectric, conducting, or semi-conducting material deposited thereon. The feature may be formed in one or more of these layers. For example, the feature may be formed at least partially in a dielectric layer. In some implementations, the feature hole 105 may have an aspect ratio of at least about 2:1, at least about 4:1, at least about 6:1 or higher. The feature hole 105 may also have a dimension near the opening, e.g., an opening diameter or line width, of between about 10 nm to 500 nm, for example between about 25 nm to 300 nm. The feature hole 105 can be referred to as an unfilled feature or simply a feature. The feature 101, and any feature, may be characterized in part by an axis 118 that extends through the length of the feature, with vertically-oriented features having vertical axes and horizontally-oriented features having horizontal axes.

FIG. 1B shows an example of a feature 101 that has a re-entrant profile. A re-entrant profile is a profile that narrows from a bottom, closed end, or interior of the feature to the feature opening. According to various implementations, the profile may narrow gradually and/or include an overhang at the feature opening. FIG. 1B shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of Ti, TiN, WN, TiAl, and W. The under-layer 113 forms an overhang 115 such that the under-layer 113 is thicker near the opening of the feature 101 than inside the feature 101.

In some implementations, features having one or more constrictions within the feature may be filled. FIG. 1C shows examples of views of various filled features having constrictions. Each of the examples (a), (b) and (c) in FIG. 1C includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b). As described further below, methods described herein allow void-free fill as depicted in FIG. 1C.

Horizontal features, such as in 3-D memory structures, can also be filled. FIG. 1D shows an example of a horizontal feature 150 that includes a constriction 151. For example, horizontal feature 150 may be a word line in a VNAND structure.

Figure 1E:
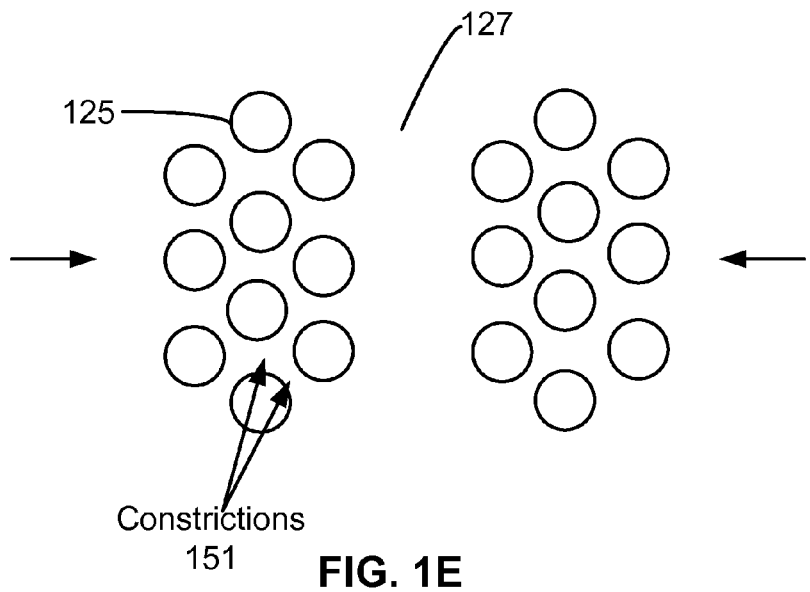
Figure 1F:
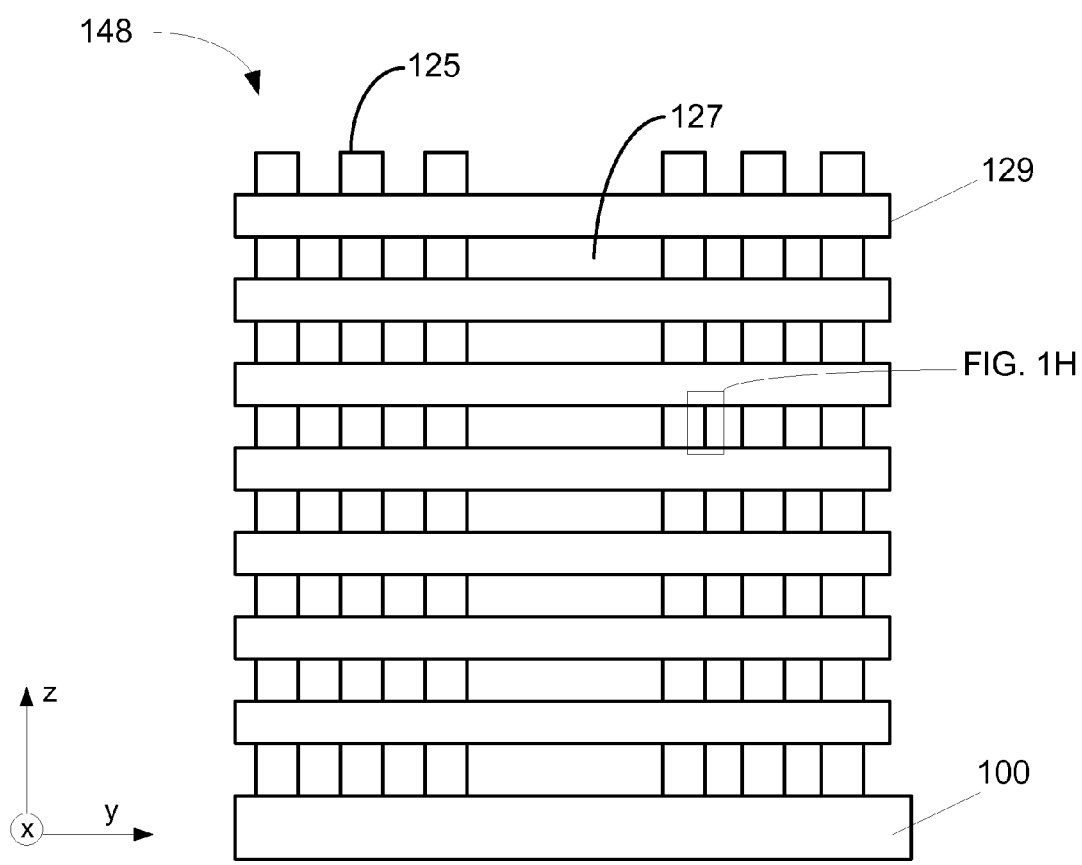

In some implementations, the constrictions can be due to the presence of pillars in a VNAND or other structure. FIG. 1E, for example, shows a plan view of pillars 125 in a VNAND or vertically integrated memory (VIM) structure 148, with FIG. 1F showing a simplified schematic of a cross-sectional depiction of the pillars 125. Arrows in FIG. 1E represent deposition material; as pillars 125 are disposed between an area 127 and a gas inlet or other deposition source, adjacent pillars can result in constrictions 151 that present challenges in void free fill of an area 127.

The structure 148 can be formed, for example, by depositing a stack of alternating interlayer dielectric layers 154 and sacrificial layers (not shown) on a substrate 100 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 125, which can include channel regions of the completed memory device.

The main surface of substrate 100 can extend in the x and y directions, with pillars 125 oriented in the z-direction. In the example of FIGS. 1E and 1F, pillars 125 are arranged in an offset fashion, such that pillars 125 that are immediately adjacent in the x-direction are offset with each other in the y-direction and vice versa. According to various implementations, the pillars (and corresponding constrictions formed by adjacent pillars) may be arranged in any number of manners. Moreover, the pillars 125 may be any shape including circular, square, etc. Pillars 125 can include an annular semi-conducting material, or circular (or square) semi-conducting material. A gate dielectric may surround the semi-conducting material. The area between each interlayer dielectric layer 129 can be filled with tungsten; thus structure 148 has a plurality of stacked horizontally-oriented features that extend in the x and/or y directions to be filled.

Figure 1G:
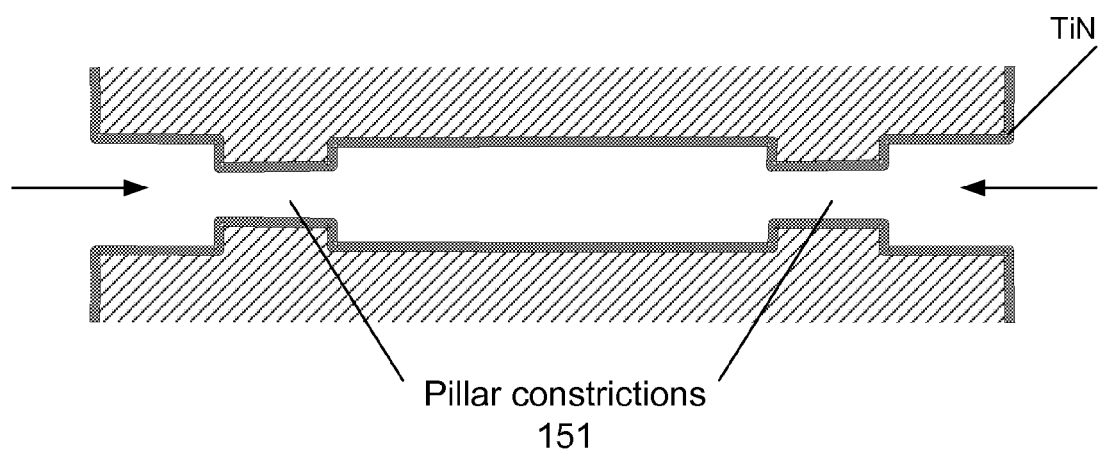

FIG. 1G provides another example of a view horizontal feature, for example, of a VNAND or other structure including pillar constrictions 151. The example in FIG. 1G is open-ended, with material to be deposited able to enter horizontally from two sides as indicated by the arrows. (It should be noted that example in FIG. 1G can be seen as a 2-D rendering 3-D features of the structure, with the FIG. 1G being a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 1F), and can present more challenges for fill than filling holes or trenches that extend along one or two dimensions. For example, controlling fill of a 3-D structure can be challenging as deposition gasses may enter a feature from multiple dimensions.

Filling features with tungsten-containing materials may cause formation of voids and seams inside the filled features. A void is region in the feature that is left unfilled. A void can form, for example, when the deposited material forms a pinch point within the feature, sealing off an unfilled space within the feature preventing reactant entry and deposition.

There are multiple potential causes for void and seam formation. One is an overhang formed near the feature opening during deposition of tungsten-containing materials or, more typically, other materials, such as a diffusion barrier layer or a nucleation layer. An example is shown in FIG. 1B.

Another cause of void or seam formation that is not illustrated in FIG. 1B but that nevertheless may lead to seam formation or enlarging seams is curved (or bowed) side walls of feature holes, which are also referred to as bowed features. In a bowed feature the cross-sectional dimension of the cavity near the opening is smaller than that inside the feature. Effects of these narrower openings in the bowed features are somewhat similar to the overhang problem described above. Constrictions within a feature such as shown in FIGS. 1C, 1D and 1G also present challenges for tungsten fill without few or no voids and seams.

Even if void free fill is achieved, tungsten in the feature may contain a seam running through the axis or middle of the via, trench, line or other feature. This is because tungsten growth can begin at the sidewall and continues until the grains meet with tungsten growing from the opposite sidewall. This seam can allow for trapping of impurities including fluorine-containing compounds such as hydrofluoric acid (HF). During chemical mechanical planarization (CMP), coring can also propagate from the seam. According to various implementations, the methods described herein can reduce or eliminate void and seam formation. The methods described herein may also address one or more of the following:

1) Very challenging profiles: Void free fill can be achieved in most re-entrant features using dep-etch-dep cycles as described in U.S. patent application Ser. No. 13/351,970, incorporated by reference herein. However, depending on the dimensions and geometry, multiple dep-etch cycles may be needed to achieve void-free fill. This can affect process stability and throughput. Implementations described herein can provide feature fill with fewer or no dep-etch-dep cycles.

2) Small features and liner/barrier impact: In cases where the feature sizes are extremely small, tuning the etch process without impacting the integrity of the underlayer liner/barrier can be very difficult. In some cases intermittent Ti attack—possibly due to formation of a passivating TiFx layer during the etch—can occur during a W-selective etch.

3) Scattering at W grain boundaries: Presence of multiple W grains inside the feature can result in electron loss due to grain boundary scattering. As a result, actual device performance will be degraded compared to theoretical predictions and blanket wafer results.

4) Reduced via volume for W fill: Especially in smaller and newer features, a significant part of the metal contact is used up by the W barrier (TiN, WN etc.). These films are typically higher resistivity than W and negatively impact electrical characteristics like contact resistance etc.

Provided herein are various methods of filling features with tungsten that reduce or eliminate void and seam formation. The methods may be used for feature fill of features of any orientation, including vertical and horizontal orientations. In some implementations, the methods may be used to fill features having an angled orientation with respect to the plane of the substrate. In some implementations, the methods may be used to fill a feature having multiple orientations. Examples of such features include 3-D features in which deposition gasses may enter a feature vertically and laterally. Further, in some implementations, the methods may be used to fill multiple features of different orientations on a single substrate.

Examples of feature fill for horizontally-oriented and vertically-oriented features are described below. It should be noted that in most cases, the examples applicable to both horizontally-oriented or vertically-oriented features. Moreover, it should also be noted that in the description below, the term "lateral" may be used to refer to a direction generally orthogonal to the feature axis and the term "vertical" to refer to a direct generally along the feature axis.

While the description below focuses on tungsten feature fill, aspects of the disclosure may also be implemented in filling features with other materials. For example, feature fill using one or more techniques described above of inside-out feature fill, etch conformality modulation, reducing agent conversion, partial reducing agent conversion with the unconverted reducing agent used as an etch stop, and halogen-free fill may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium alumide (TiAl)), tantalum-containing materials (e.g., tantalum (Ta), and tantalum nitride (TaN)), and nickel-containing materials (e.g., nickel (Ni) and nickel silicide (NiSi).

Inside-Out Fill

Conventional tungsten deposition in a re-entrant feature starts from a sidewall surface and progresses laterally (i.e., orthogonal to the sidewall surface and feature axis) until the feature is pinched off. With the inside-out fill described herein, tungsten growth progresses vertically (i.e., along the feature axis) from with the feature. In some implementations, tungsten growth from feature sidewalls is eliminated or delayed, allowing tungsten to grow from the inside-out. This can result in large tungsten grains and lower resistivity, no seam down the feature axis and reducing coring during chemical mechanical planarization (CMP), eliminating and reducing voids in the feature.

Implementations described herein can involve deposition of a tungsten in a feature, followed by an etch to remove all or some of the tungsten deposited on the sidewalls while leaving tungsten further within the feature, e.g., at a closed end of a feature such as on the bottom of a vertically-oriented feature or at a closed end of a horizontally-oriented feature, or in the interior of a horizontally-oriented feature having multiple openings. The initial deposition may be conformal with the tungsten growing evenly from all accessible surfaces of the feature. A subsequent deposition then can be "selective" in that the tungsten preferentially grows on the tungsten remaining in the feature, rather than on an under-layer or substrate structure. In some implementations, the overall deposition process (e.g., conformal deposition—etch—selective deposition) can be characterized as inside-out rather than conformal. Inside-out fill refers to the growth occurring from the interior of the feature, and may be termed "bottom-up" fill for vertical closed-ended structures, such as in FIGS. 1A and 1B.

Figure 2:
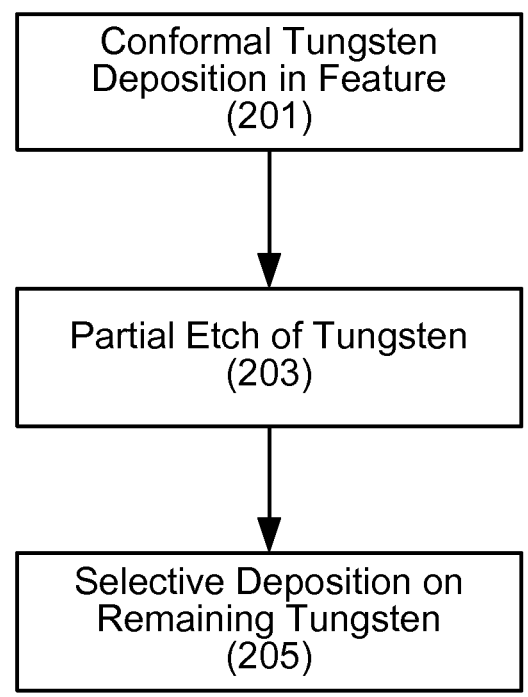
FIGS. 2 and 2A are process flow diagrams illustrating certain operations in methods of inside-out fill of features with tungsten.

FIG. 2 is a process flow diagram illustrating certain operations of a method of inside-out feature fill. The method can begin with conformally depositing tungsten in a feature in block 201. In some implementations, block 201 can involve deposition of a tungsten nucleation layer, followed by bulk deposition. Tungsten nucleation layer deposition and bulk deposition techniques are described further below. In some implementations, block 201 may involve only bulk deposition, if for example, the feature includes an under-layer that supports tungsten deposition. In features that include constrictions or are otherwise susceptible to pinch-off, block 201 can be performed at least until the feature is pinched off. In conformal deposition, deposition starts from each surface and progresses with growth generally orthogonal to the surface. Tungsten growth in features starts from each sidewall and progresses until the growth pinches off the feature. In some implementations, the amount of tungsten deposited block 201 can be determined based on the narrowest feature dimension. For example, if the narrowest dimension is 50 nm, a CVD reaction in block 201 can be allowed to run long enough to deposit 25 nm on each surface, at which point the deposited tungsten blocks further reactant diffusion into the feature. This can generally be determined prior to the reaction based on the reaction kinetics, tungsten nucleation layer thickness, etc. In some implementations, block 201 can involve multiple dep-etch-dep cycles as described in U.S. patent application Ser. No. 13/016,656, incorporated by reference herein. In some implementations, block 201 does not include any etch operations, with just a deposition until at least the feature is pinched off. Block 201 can occur in a single chamber, a single station of a multi-station or single station chamber, in multiple stations of multi-station apparatus, or in multiple chambers. For example, block 201 can involve tungsten nucleation layer deposition in one station of a chamber, followed by bulk deposition in another station of the chamber.

The process can continue with a partial etch of tungsten in a block 203. Some tungsten remains in the feature, but the etch removes tungsten from at least some of the sidewalls of the feature. Block 203 generally involves a chemical etch, with for example, fluorine-containing species or other etchant species. In some implementations, activated species may be used. Activated species can include atomic species, radical species, and ionic species. For the purposes of this application, activated species are distinguished from recombined species and from the gases initially fed into a plasma generator. For example, partially etching the deposited tungsten can involve exposure to etchant species generated in a remote or in-situ plasma generator. In some implementations, both remotely-generated and in-situ generated plasma species may be used, either sequentially or concurrently. In some implementations, a non-plasma chemical etch using $F_2$, $CF_3Cl$, or other etchant chemistry may be used. Block 203 may occur in the same chamber as block 201 or in a different chamber. Methods of etching tungsten in a feature are described further below. Depending on the feature architecture, the etch may be conformal or non-conformal. Further, the etch back may progress generally laterally (orthogonal to the feature axis) and/or vertically (along the feature axis).

According to various implementations, the etch may be preferential or non-preferential to an under-layer. For example, an etch can be preferential to W with, for example, a Ti or TiN under-layer acting as an etch stop. In some implementations, the etch can etch W and Ti or TiN with an underlying dielectric acting as an etch stop.

The process then continues at block 205 with selective deposition on the remaining tungsten. Selective deposition refers to preferential deposition on the tungsten surfaces with respect to the sidewall or other surfaces from which tungsten is removed. In some implementations, the selective deposition process may deposit substantially no tungsten on the sidewall surfaces. In some implementations, the selective deposition process may deposit a small amount of tungsten on the sidewalls surfaces, though at significantly slower growth rate than deposition on the tungsten surfaces. For example, growth rate and deposited thickness may be half as much or less on the sidewall surfaces than on the tungsten surfaces. In some implementations, it may be a tenth or even a hundredth as much.

In some implementations, block 205 may proceed without deposition of a nucleation layer. This can allow selective deposition only on the remaining tungsten in the feature. In many implementations, block 201 will involve deposition of a nucleation layer to achieve conformal deposition, while block 205 proceeds with deposition on the etched tungsten layer without an intermediate nucleation layer deposition. In some implementations, a nucleation layer may be deposited on at least the portion of the feature on which further growth is desired. If a nucleation layer is deposited in block 205 including on sidewall or other surfaces where subsequent deposition is not desired, tungsten nucleation on those surfaces can be selectively inhibited. Methods of inhibiting tungsten nucleation in features are described in U.S. patent application Ser. No. 13/774,350, incorporated by reference herein.

Figure 2A:
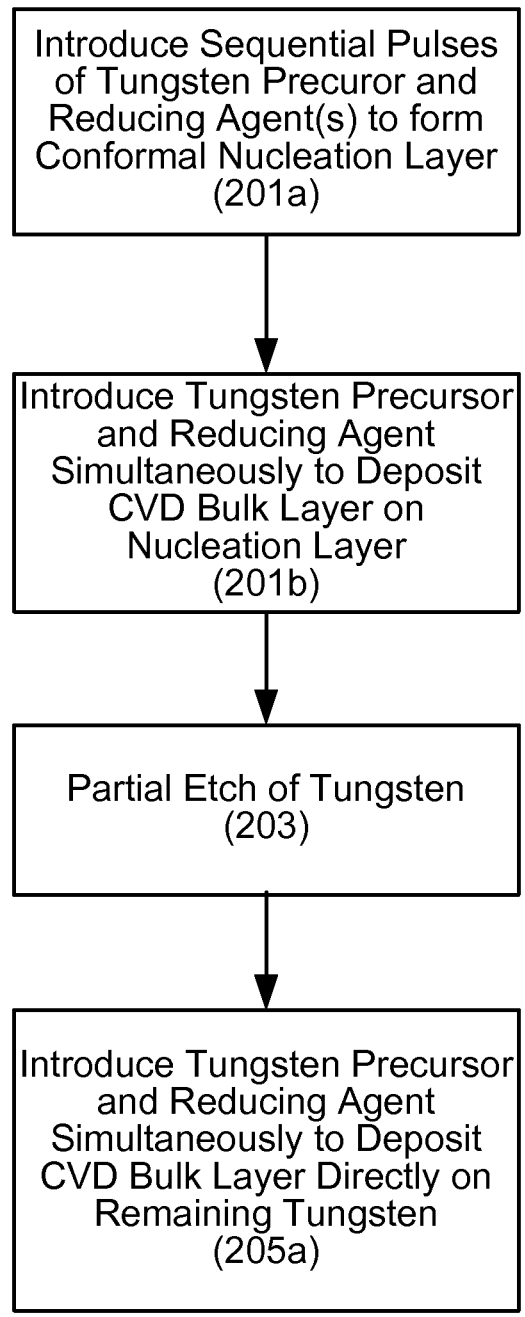
Figure 3C:
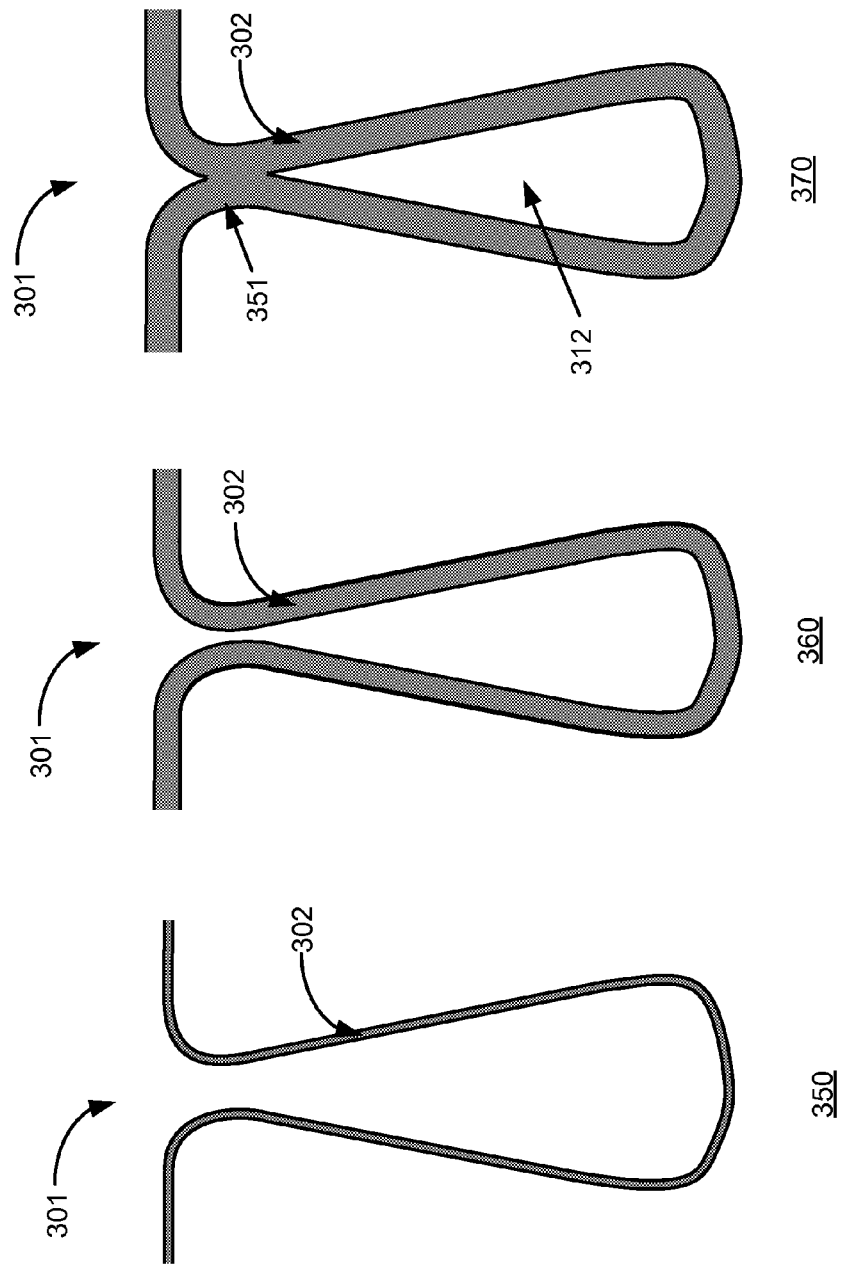
FIGS. 3A-4B are schematic representations of features at various stages of inside-out feature fill.

FIG. 2A is a process flow illustrating certain operations in an example of inside-out fill according to FIG. 2. The process can begin by sequentially pulsing a tungsten-containing precursor and one or more reducing agents to form a tungsten nucleation layer by an atomic layer deposition (ALD) or pulsed nucleation layer (PNL) process (201a). A thin conformal nucleation layer that can support subsequent bulk deposition is formed. Further description of nucleation layer deposition is provided below. Next, a tungsten-containing precursor and a reducing agent are simultaneously introduced to a chamber housing the feature (201b). This results in deposition of a bulk layer of tungsten by chemical vapor deposition (CVD) on the tungsten nucleation layer formed in block 201a. The bulk tungsten layer follows the contours of the underlying tungsten nucleation layer, which follows the contours of the feature, for conformal deposition. The tungsten is then partially etched (203) as described above with reference to FIG. 2. The process continues by again simultaneously introducing a tungsten-containing precursor and a reducing agent to deposit another bulk layer by CVD (205a). In the example of FIG. 2A, the bulk tungsten layer deposited in block 205a is deposited directly on the etched tungsten without formation of another nucleation layer.

In some implementations, feature fill can involve conformal tungsten deposition to fill a feature, allowing the deposition to proceed even with the formation of a void or seam within the feature, followed by etch back to open the feature, and selective deposition in the feature. According to various implementations the conformal deposition to fill the feature may include fill to the top of the feature or only through a constriction or pinch point. In either case, a portion of the feature including a seam and/or void may be closed off to further deposition prior to etch back.

Previous schemes involved a partial fill during a first deposition operation leaving the via or other feature open and not closed off. During a subsequent etch step, in these schemes, subsequent etching targeted at tungsten removal in the field and pinch point could have the unwanted side effect of removing the tungsten inside the via or other feature. Then, a subsequent deposition step could regrow tungsten at the same rate inside the via or other feature and at the pinch point, resulting in the same keyhole void as a deposition-only feature fill. By contrast, the methods described herein can leave partial growth within the feature, with the partial growth resulting in selective deposition in a subsequent deposition operation. For example, a process can involve etching a pinched-off via to completely remove tungsten from the field and pinch point, leaving partial tungsten growth inside the via intact. A subsequent tungsten deposition allows tungsten regrowth inside the via on the existing tungsten layer, while a significant growth delay in the field prevents pinch-off and voids in the final via fill. As discussed above, the significant growth delay may be due at least in part to the removal of a surface that supports tungsten growth. In some implementations, the etch may be preferential to tungsten with respect to an under-layer. For example, feature including a TiN/W (titanium nitride under-layer/tungsten layer) bilayer may be subjected to an etch preferential to tungsten. The preferential etch (also referred to as a selective etch) may remove tungsten from the field and pinch point without etching through the TiN at the field and pinch point. Subsequent deposition allows tungsten regrowth inside the feature, but not on the field or on the sidewalls of the pinch point. As a result, the growth is inside-out (e.g., bottom-up) rather than conformal. Various implementations are described below with respect to FIGS. 3A, 3B, 4A and 4B.

In some implementations, feature fill can involve 1) deposition to pinch off a feature; 2) etch-back to remove tungsten through the pinch point; 3) fill by selective deposition below the pinch-point; and 4) fill the remainder of the feature. In some implementations (2) involves etching conditions selective (i.e., preferential) to tungsten over a TiN, Ti, or other under-layer. FIG. 3A shows an example of cross-sectional schematic depictions of a feature fill using such a method.

First, a feature 301 including a pinch point 351 and a TiN under-layer 313 is filled using a conformal deposition technique at an operation 310. Deposition is allowed to continue such that the feature is pinched off, with tungsten deposited on the field region 317 as well. Deposition in this operation may be generally conformal to the feature, leaving void 312 in the filled feature 301. An example of conformal deposition is depicted schematically in FIG. 3C, in which illustrates tungsten growth stages 350, 360, and 370 in a feature 301. Stages 350, 360, and 370 may represent stages in a progression of a CVD process of depositing tungsten in feature 301, for example. At stage 350, a tungsten layer 302 conformally lines the feature 301. Tungsten growth continues to proceed orthogonally from the feature surfaces, with generally uniform growth as depicted at stage 360. At stage 370, growth from the sidewall surfaces at pinch point 351 closes off the feature 301, leaving void 312. Returning to FIG. 3A, fill at 310 may be strictly conformal in some implementations. In some other implementations, the fill may be generally conformal with some non-conformal aspects. For example, tungsten nucleation may be inhibited at the pinch point 351 to delay closing the feature 301 off. In either case, a void 312 is present after operation 310.

At an operation 320, the feature 301 is opened with an etch that is selective to tungsten. That is, the feature 301 is etched using an etch chemistry that etches tungsten with no significant etch of the under-layer 313. In the example of FIG. 301, tungsten is etched without etching titanium nitride. The etch is allowed to proceed until the pinch point 351 is cleared of tungsten. The feature 301 can remain closed off until the end of the etch process, keeping the tungsten below the pinch point intact. At the same time, the tungsten in the field and at or above the pinch point is over-etched, thereby exposing the under-layer. Because a selective etch is used, the titanium nitride layer 313 remains on the field region and sidewalls of the pinch point 351. As a result, there is tungsten 303 within the feature 301 below the pinch point 351, with minimal or no tungsten along the sidewalls at and above the pinch point 351. If present, any tungsten left is generally insufficient to support high quality consistent growth from the sidewalls. For example, it may be discontinuous film in some implementations.

At an operation 330, tungsten is selectively deposited in the feature 301 on the remaining tungsten 303. Because tungsten is present only below the pinch point 351, tungsten is deposited selectively below the pinch point 351. The fill in this operation may be characterized as bottom-up.

In some implementations, operation 330 may be performed directly after operation 320. The deposition is selective because there is faster regrowth on the existing tungsten 303 in the feature 301 compared to slow tungsten growth on the exposed under-layer 313 at and above the pinch point 351. In some implementations, tungsten nucleation in the pinch point 351 may be inhibited prior to operation 330. Although not depicted, in some implementations, operations 320 and 330 may be repeated one or more times. For example, if when performed operation 330 results in formation of a seam, an etch may be performed to remove the seam, prior to another selective deposition operation. Removal of a seam is described below with reference to FIG. 3B.

Fill may then be allowed to continue to completely fill the feature 301. In some implementations, the selectively faster regrowth in the feature may allow for complete fill before the top pinches off (not shown). In some implementations, the etch and selective fill process can be repeated one or more times to achieve complete fill. If the feature is not completely filled after one or more iterations of operations 320 and 330, in some implementations, an operation 340 may be performed in which a conformal fill is performed to complete fill of the feature 301. Operation 340 can involve deposition of a tungsten nucleation layer on the sidewalls of the pinch point 351 in some implementations. In some implementations, the effects of a previous selective inhibition treatment at the pinch point may be diminished at operation 340, allowing conformal fill without deposition of a nucleation layer.

In some implementations, feature fill can involve 1) deposition to fill a feature; 2) etch-back to remove tungsten through seam formation; 3) fill by selective deposition; and 4) fill the remainder of the feature. FIG. 3B shows an example of cross-sectional schematic depictions of a feature fill using such a method. First, a feature including a titanium nitride under-layer 313 is filled using a conformal deposition technique in an operation 315. In this example, feature 301 has substantially vertical sidewalls, with no constriction and so a void does not form in the feature 301. However, a seam 314 is formed along the axis of the feature 301 where the growth from each sidewall meets. As growth also occurs from the bottom of the feature 301, seam formation starts at a point 352 above the feature bottom. Deposition is halted at some point after seam formation begins; due to the conformal nature of standard CVD-W processes in features, this is generally involves completely filling the feature in operation 315 as depicted in the example of FIG. 3B. The endpoint may be determined prior to deposition based on the feature dimensions and tungsten deposition rate. In some implementations, nucleation inhibition and/or one or more non-conformal etches may be used in operation 315 to tailor the feature profile such that the feature is only partially filled at seam formation.

Next, the feature is opened with an etch selective to tungsten, with titanium nitride (or other under-layer) 313 acting as an etch stop at an operation 325. The etch is allowed to proceed to at least the point of seam formation 352, leaving a layer 303 at or below the point of seam formation 352. It should be noted that the etch performed in operation 325 may differ in some respects from that performed in operation 320 discussed in reference to FIG. 3A. In operation 325, a conformal etch is performed to remove tungsten uniformly within the feature until the point of seam formation is reached. Methods of controlling etch conformality are described further below. In contrast, in operation 320, the etch removes tungsten only near the top of the feature and is more non-conformal. However, it should be noted that conditions used for non-conformal etch may not be necessary during operation 320, as the presence of the closed pinch point 351 prevents etchant diffusion into void 312.

Returning to FIG. 3B, the tungsten in the field and above the point of seam formation is over-etched, thereby exposing the under-layer 313. Because a selective etch is used, the titanium nitride layer 313 remains on the field region and sidewalls of the feature 301. As a result, there is tungsten 303 within the feature 301 below point of seam formation, with minimal or no tungsten along the sidewalls at and above the point of seam formation 352.

Next, selective deposition that results in bottom-up fill is then performed at an operation 335, with selectivity induced by the faster growth kinetics on the tungsten layer 303 in the bottom of the feature. As in the example discussed with reference to FIG. 3A, in some implementations, selectivity may be further induced be selective inhibition of tungsten nucleation in the feature 301 after etch operation 325 and prior to deposition operation 335. Bottom-up fill methods using selective inhibition are discussed in U.S. patent application Ser. No. 13/774,350, incorporated by reference herein. In some implementations, operation 335 may be performed until the feature is filled to the top of the feature. In some other implementations, feature fill may be stopped at some point before the top of the feature is reached, particularly if some sidewall growth occurs to form another seam. In the example depicted in FIG. 3B, a second etch operation 326 is performed, after complete or partial fill of the feature 301, to again remove tungsten from the sidewalls. The seam is removed in the etch. A selective deposition 336 then is performed to fill the feature. The selective etch and deposition operations may be repeated one or more times to fill the feature.

According to various implementations, the methods described above may also be used for inside-out fill of horizontally oriented features. In addition, while the methods described above with respect to FIGS. 3A and 3B use a selective etch that removes tungsten while leaving an under-layer intact, in some implementations, a barrier layer or other under-layer may be removed during etch.

Figure 4A:
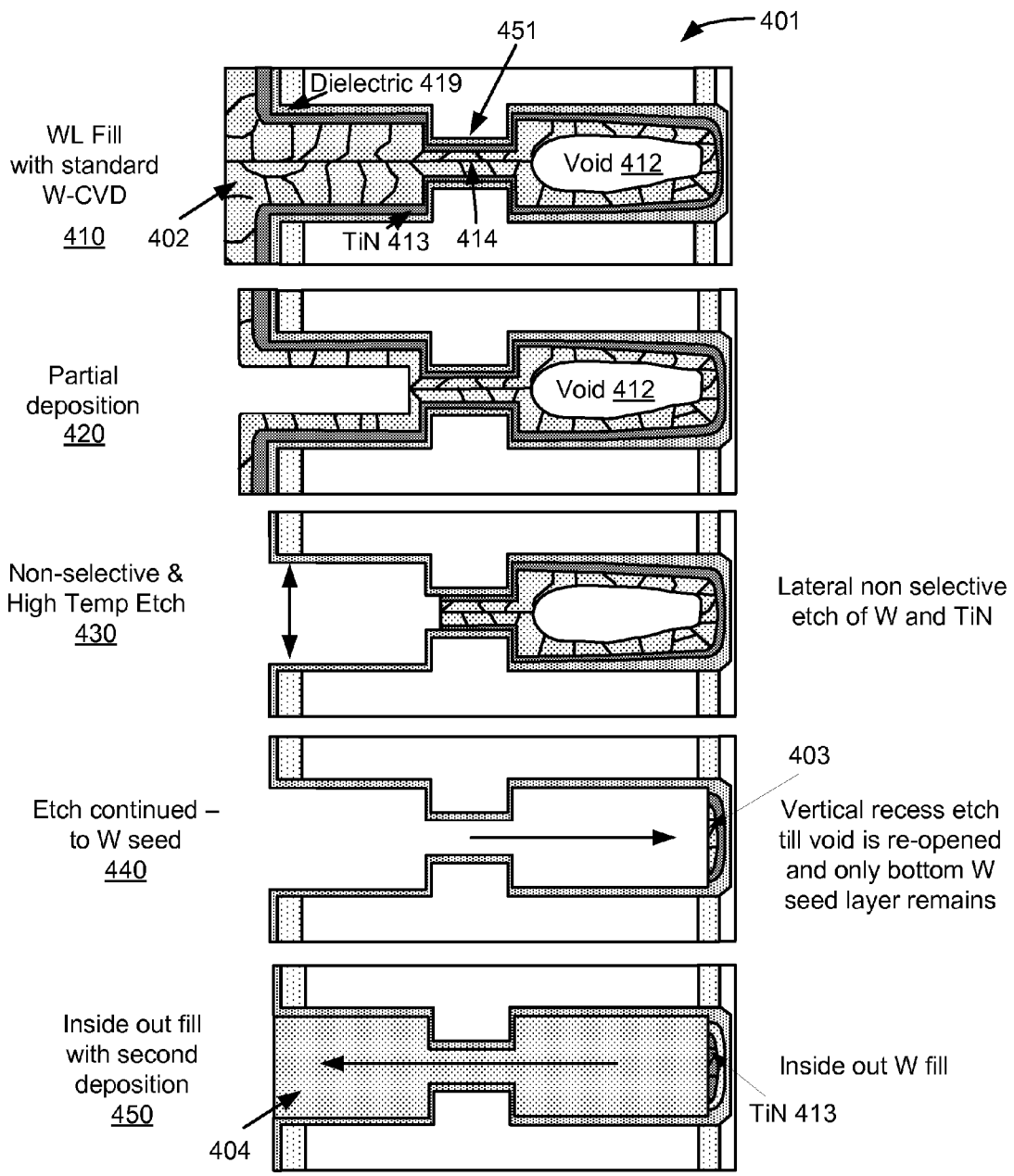

FIG. 4A shows another example of inside-out fill, in which a horizontally-oriented feature 401 such as a word line (WL) including a constriction 451 is filled. The feature 401 includes dielectric 419 and titanium nitride 413 underlayers. (It should be noted that in some implementations, if image 410 is a side view, constriction 451 may represent a constricted area in the plane extending into the page caused by pillar placement in a 3-D structure, for example.) The top image 410 shows the WL fill using standard CVD, wherein a tungsten nucleation layer is deposited conformally in the feature on titanium nitride layer 413 followed by CVD deposition on the tungsten nucleation layer. Tungsten 402 fills the feature with a significant void 412 present in the WL past the constriction 451. In addition, a seam 414 is present in the tungsten fill through the constriction 451 to the feature opening 401.

In a method as described herein, fill can begin at an operation 420 with a conformal deposition to partially fill the feature, including pinching off the void 412. Operation 420 may include conformal tungsten nucleation layer deposition on titanium nitride 413 followed by CVD deposition until the constriction is filled, thereby pinching off the void 412. As discussed above, deposition endpoint may be determined based on the dimensions of constriction 451 and the tungsten deposition rate.

A conformal etch of tungsten and titanium nitride is performed at an operation 430 to remove tungsten and titanium nitride deposited between the constriction 451 and the opening of feature 401. In some implementations, the etch temperature may be relatively high to increase etch non-selectivity. Dielectric layer 419 may function as an etch stop. The etch may be considered "lateral" or in a direction orthogonal to the feature axis. The etch can continue at an operation 440 with etching past the constriction 451 to remove the tungsten and titanium nitride until the void is removed, leaving only a bottom layer 403 of tungsten. At this point, the etch may be considered "vertical" or in a direction parallel to the feature axis. (It should be noted that the etch conditions do not necessarily change from operation 430 to 440; the direction of the etch may change due to the thickness and location of deposited tungsten to be removed.) The layer 403 can function as a bottom tungsten seed layer for subsequent selective deposition. A selective inside-out fill is then performed at an operation 450. Tungsten is selectively deposited only on the existing tungsten seed layer 403 and not on the dielectric 419. As with the methods described above, in some implementations, etch and selective deposition operations may be repeated one or more times. The result is a void-free, seam-free layer 404 with larger grains and fewer grain boundaries than layer 402 shown at 410 filled with conventional CVD. Moreover, TiN under-layer 413 is present only at the bottom of the feature. A barrier layer between tungsten layer 404 and dielectric layer 419 may not be needed; the non-selective etch of tungsten and titanium nitride can allow more of the WL volume to be occupied by tungsten layer 404.

In some implementations, to improve adhesion of inside-out filled tungsten to the substrate, an adhesion layer may be deposited in the feature or during selective deposition and/or on a field region prior to, during or after inside-out fill of the feature. For example, in FIG. 4A, inside-out growth in operation 450 may be halted at some point, followed by deposition of an adhesion layer, with the tungsten deposition then continuing. An example is shown in FIG. 4B, below.

In certain implementations, the methods can include tungsten deposition to fill the feature with suitable overburden thickness. In some cases, a dep-etch-dep sequence as described in U.S. patent application Ser. No. 13/016,656, referenced above, may be used to achieve void free fill. After the feature is filled, it can be etched at conditions that recess tungsten in the feature, and at the same time remove any under-layer, e.g., one or more of TiN, Ti, WN, or fluorine-free tungsten (FFW) at the field and along the sidewall up to the recess depth plane. According to various implementations, an under-layer dielectric may or may not be removed. Recess etch can be followed by a bulk tungsten deposition with inside-out (bottom up) growth along the axis of the feature. In some implementations, if a liner, barrier, or adhesion or other under-layer is removed, another under-layer may be deposited in the field and/or along the feature sidewall before tungsten deposition in the field and CMP.

Figure 4B:
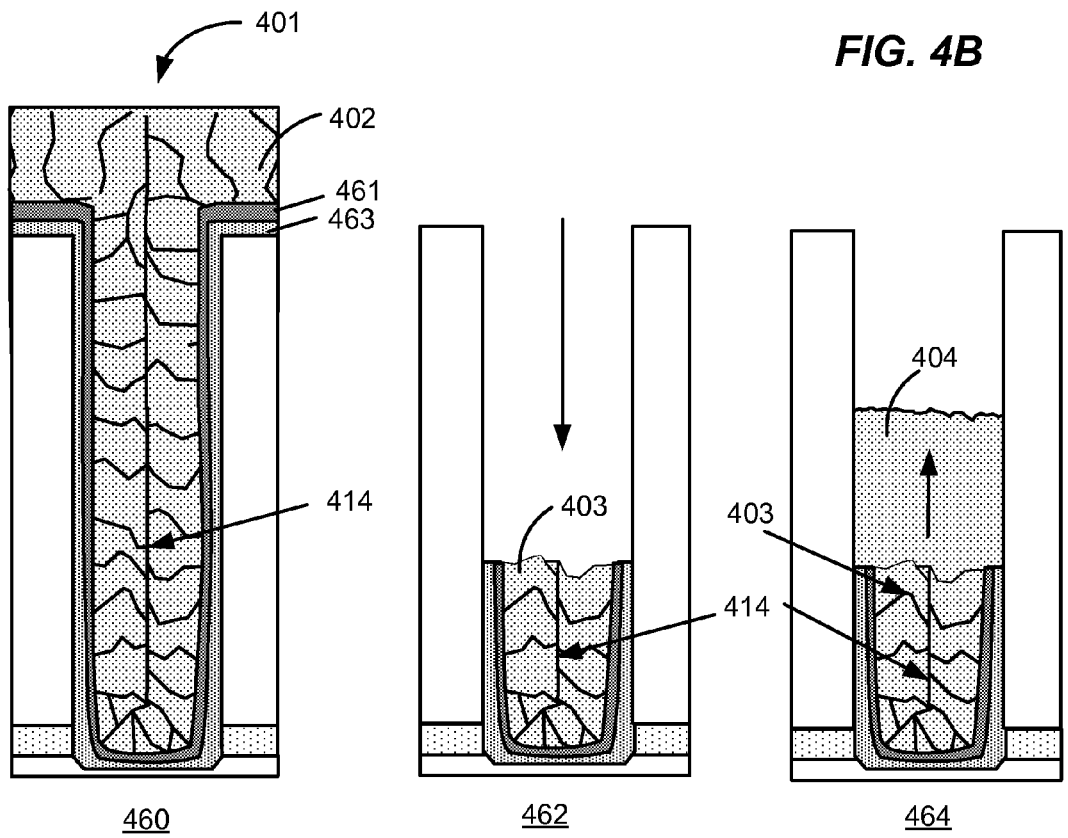
Figure 4B:
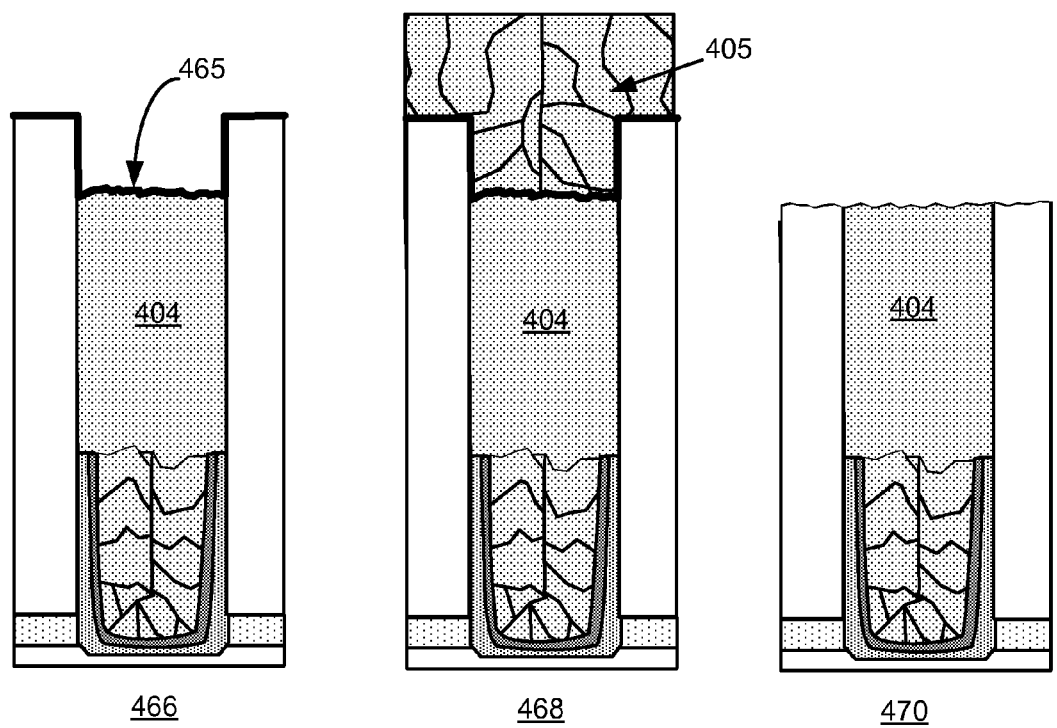

Cross-sectional depictions of a feature 401 in an example of a method of inside-out fill after a recess etch are given in FIG. 4B. First, at 460, a feature 401 is filled with tungsten 402. Feature 401 includes under-layers 461 and 463, which may be for example any of Ti, TiN, WN, TiAl, etc. A seam 414 is present in the feature 401. At 462, a recess etch is performed to remove tungsten 402, and under-layers 461 and 463 to a recess depth plane, leaving an etched tungsten layer 403. In alternate implementations, under-layer 461 or under-layers 461 and 463 may be left with a selective etch. The recess etch removes the seam 414 in the recessed volume of the feature 401, which will aid in preventing coring during a subsequent CMP operation. Accordingly, the recess depth may be chosen at least in part based on a distance far enough from the feature opening that the seam 414 will not affect CMP. Methods of performing recess etch are described further below. The feature is then filled with tungsten in an inside-out fill operation at 464. At discussed above, inside-out fill involves selective deposition on the etched tungsten 403 that remains in the feature 401. This results in an inside-out fill tungsten layer 404 with large, vertically-oriented grain growth. At 466, the inside-out growth is halted and one or more layers 465 are deposited over the feature 401. A layer 465 can be, for example, an adhesion layer or a barrier layer. Examples include Ti, TiN, Ti/TiN, and WN. Depending how well tungsten grows on the exposed surface of the one or more layers 465, a tungsten nucleation layer may then be deposited on the one or more layers 465. In some implementations, layer 465 is a tungsten nucleation layer. An overburden tungsten layer 405 is then deposited at 468. Though the overburden layer 405 may not be deposited with bottom-up growth, it will be removed during CMP and so may not present a concern with regard to coring. The feature 401 after CMP is depicted at 470. In addition to the tungsten layer 404 not presenting a coring risk during CMP, the large grains of and greater volume filled by layer 404 provide improved electrical characteristics.

The methods described with reference to FIGS. 2, 2A, 3A, 3B, 4A, and 4B have various advantages. For example, while void-free fill can be achieved in most re-entrant features using partial dep-etch-dep cycles as described in U.S. patent application Ser. No. 13/351,970, referenced above, depending on the dimensions and geometry multiple dep-etch cycles may be needed to achieve void-free fill. This can affect process stability and throughput. Implementations described herein, such as with respect to FIG. 3A, can provide feature fill of re-entrant features with fewer cycles.

Even if void free fill is achieved, tungsten in the feature may contain a seam running through the axis of the via, middle of the trench, or other feature axis. This is because tungsten growth begins at the sidewall and continues until the grains meet with tungsten growing from the opposite sidewall. This seam can allow for trapping of impurities like hydrofluoric acid (HF), and CMP coring can also propagate from the seam. As shown in FIGS. 3B, 4A, and 4B, the inside-out fill methods described herein can eliminate or reduce seams. Unlike typical tungsten growth from the sidewalls, the inside-out fill methods may promote vertical tungsten growth (i.e., growth along the feature's axis) from a bottom or interior tungsten seed layer. Thus the formation of a seam can be avoided, providing advantages such as no trapping of CMP slurry along the seam, no trapping of gaseous impurities like HF in the seam, and minimize electron transport losses at the seam in device.

The presence of multiple W grains inside the feature can result in electron loss due to grain boundary scattering. Actual device performance will be degraded compared to theoretical predictions and blanket wafer results. The methods described with reference to FIGS. 2, 2A, 3A, 3B, 4A and 4B can result in fewer grain boundaries, lowering electrical resistance and improving performance. For example, with reference to FIG. 3B, the grain boundary at seam 314 is eliminated. In some implementations, vertically oriented grains present in layer 303 may continue to grow in subsequent selective deposition operations, reducing the number of grain boundaries.

In cases where the feature sizes are extremely small, tuning the etch process without impacting the integrity of the under-layer liner/barrier can be very difficult. In some cases intermittent titanium attack—possibly due to formation of a passivating TiFx layer during the etch—can occur during a W-selective etch. Accordingly, methods that do not rely on a selective etch, can avoid intermittent titanium attack and the challenges of selectively etching small features. In certain implementations, such as the method depicted in FIGS. 4A and 4B, under-layers such as tungsten barrier and liner are removed. As such, the tungsten etch amount does not have to be tightly controlled to avoid compromising the liner/barrier integrity. This can be useful for extremely small features with very thin tungsten films. For example, in the case where the liner is titanium, fluorine attack of the titanium film may occur even if the etch process is very selective against titanium or titanium nitride etch. By removing the titanium, attack of the titanium film by fluorine can be prevented.

Further, if a significant part of the metal contact is used up by the tungsten barrier or other under-layer (TiN, WN, etc.), it may increase resistance. This is because these films have higher resistivity than tungsten. This may negatively impact electrical characteristics like contact resistance. For example, in extremely small features like 2x and 1x nm contacts, a significant part of the contact can be used up by a barrier material (TiN, WN, etc.) that has a much higher resistivity than tungsten. By etching the barrier and using that volume to grow tungsten, improved electrical performance can be expected.

In certain implementations, the inside-out fill methods can include improved process control and repeatability, as they may use conformal etch processes, rather than finely tuned etch processes that preferentially etch at feature opening. Under certain process conditions, single grain, seam free, and inside-out tungsten can be grown inside vias, trench-lines, and other features. Further examples and advantages of inside-out fill methods are discussed below with reference to FIGS. 15, 16, 17, and 19.

According to various implementations, the methods described herein may involve using etches that are selective or non-selective. The methods can employ methods of tuning etch selectivity such that etches preferential or non-preferential to W over various under-layers. For example, the methods may employ etches that are preferential to W over TiN and Ti, or preferential to TiN and Ti over W, or are non-preferential.

Figure 5A:
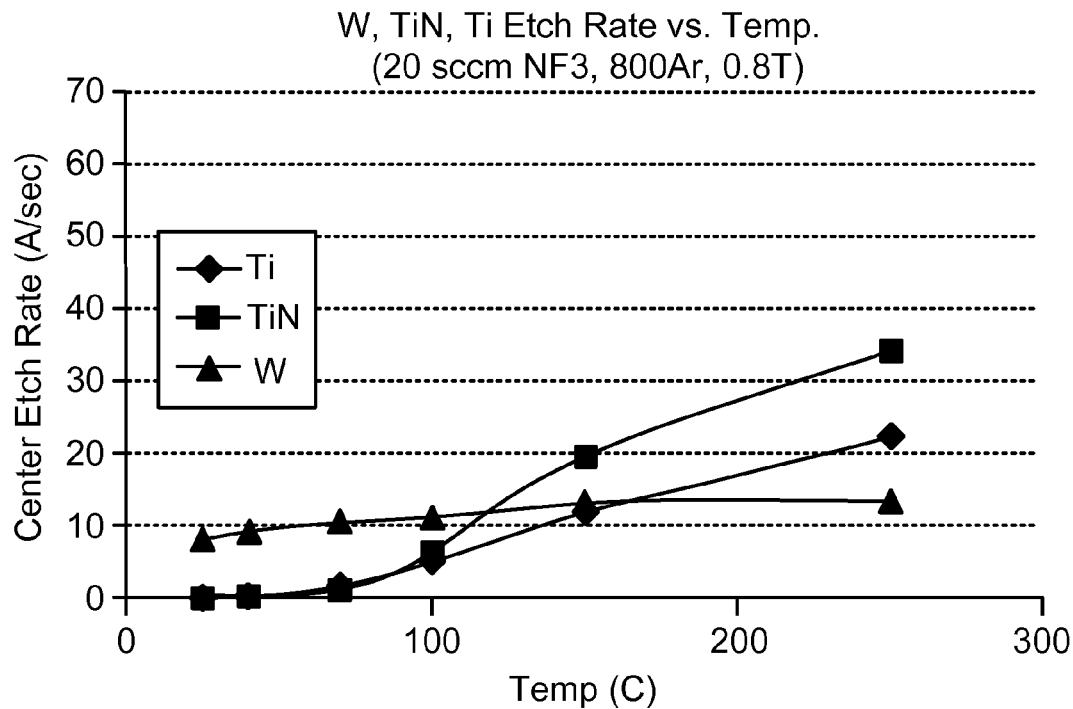
FIGS. 5A-5D are graphs illustrating tungsten (W), titanium (Ti) and titanium nitride (TiN) etch rates and etch selectivities at various temperatures.
Figure 5B:
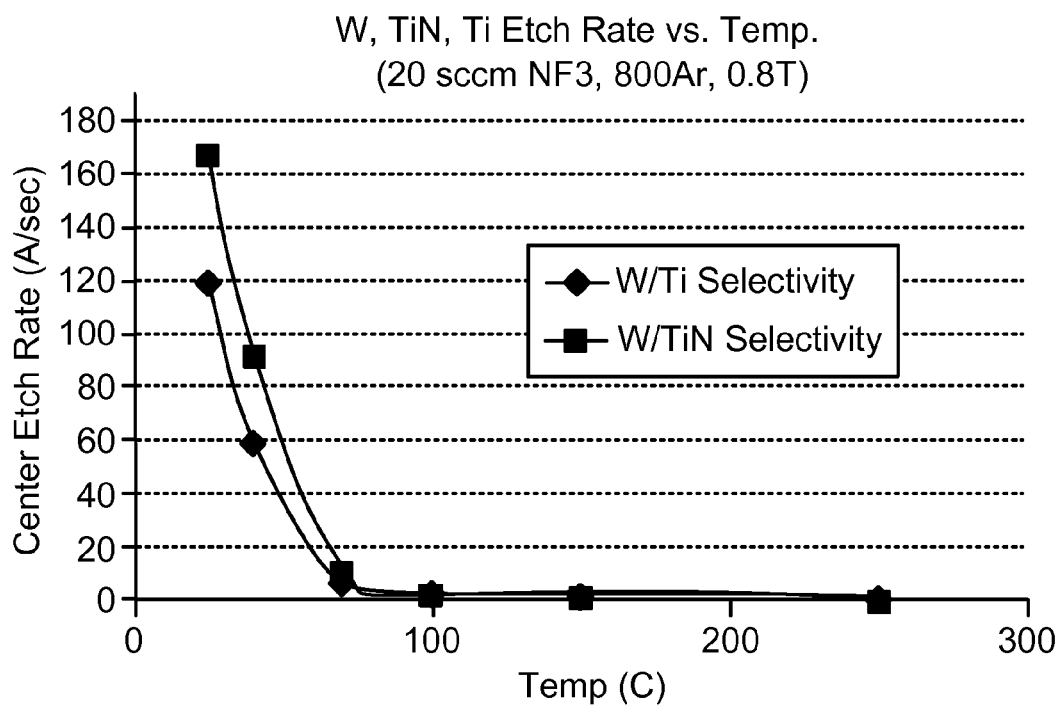
Figure 5C:
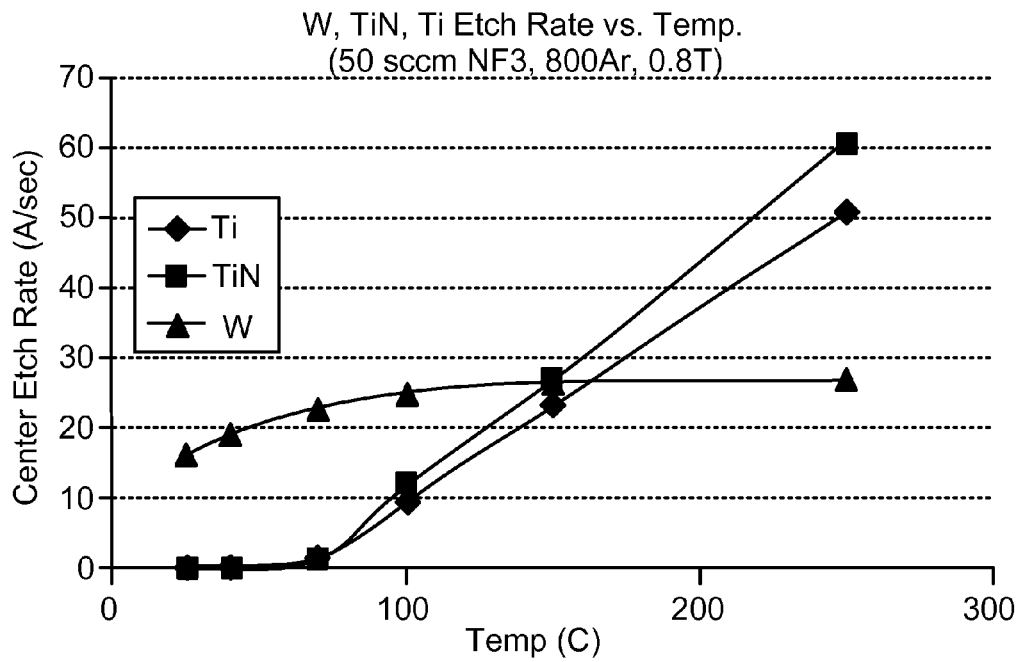
Figure 5D:
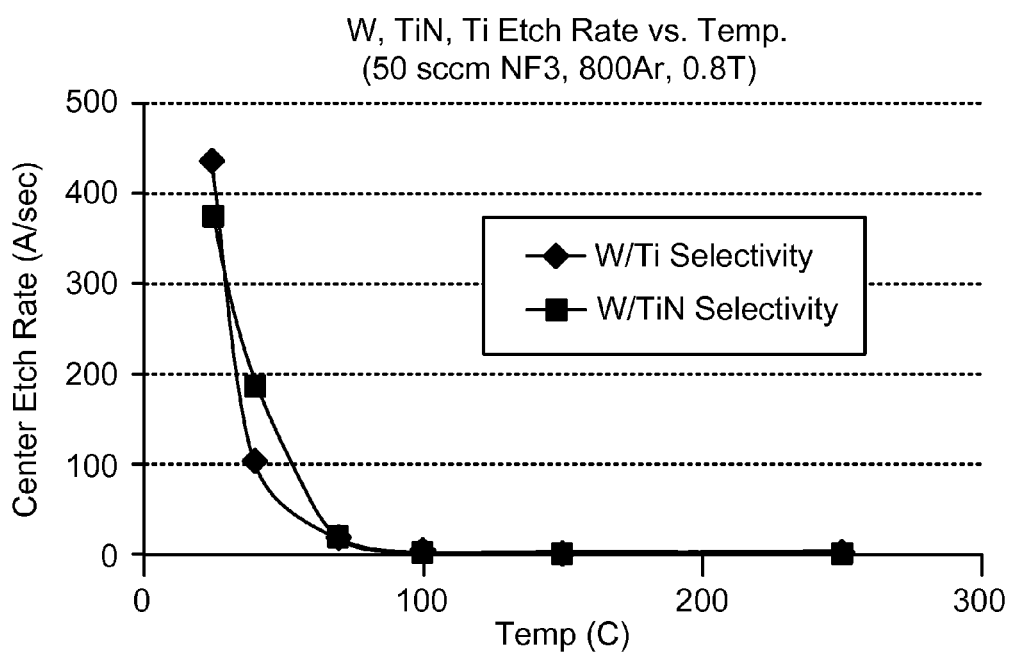

In some implementations, etching feature fill material includes a downstream (remotely-generated) F-based plasma. FIGS. 5A and 5B shows tungsten (W), titanium nitride (TiN) and titanium (Ti) etch rates and W:Ti and W:TiN etch selectivity as a function of temperature at 20 sccm nitrogen trifluoride ($NF_3$) supplied to remote plasma source. As seen in the Figures, etch selectivity of W:TiN and W:Ti can be tuned by controlling temperature, with the etch becoming preferential to W as temperature decreases. Increasing temperature can also provide etches preferential to TiN and Ti over W. FIGS. 5C and 5D show the effect of temperature at 50 sccm. The graphs demonstrate the temperature and flow rate can be adjusted to tune etch selectivity. Further information is described in U.S. patent Ser. No. 13/536,095, filed Jul. 28, 2012 and incorporated herein by reference. As described therein, temperature, etchant flow rates, and other parameters may be controlled to providing W:TiN and W:Ti etch selectivities that ranges from <0.5:1 to >100:1. For example, an etch selective to W over TiN may be performed using remotely-generated fluorine radicals, at temperatures less than 100° C. or 75° C. Similarly, a non-selective etch may be performed at higher temperatures.

Recess Etch and Etch Step Coverage Modulation

Figure 6:
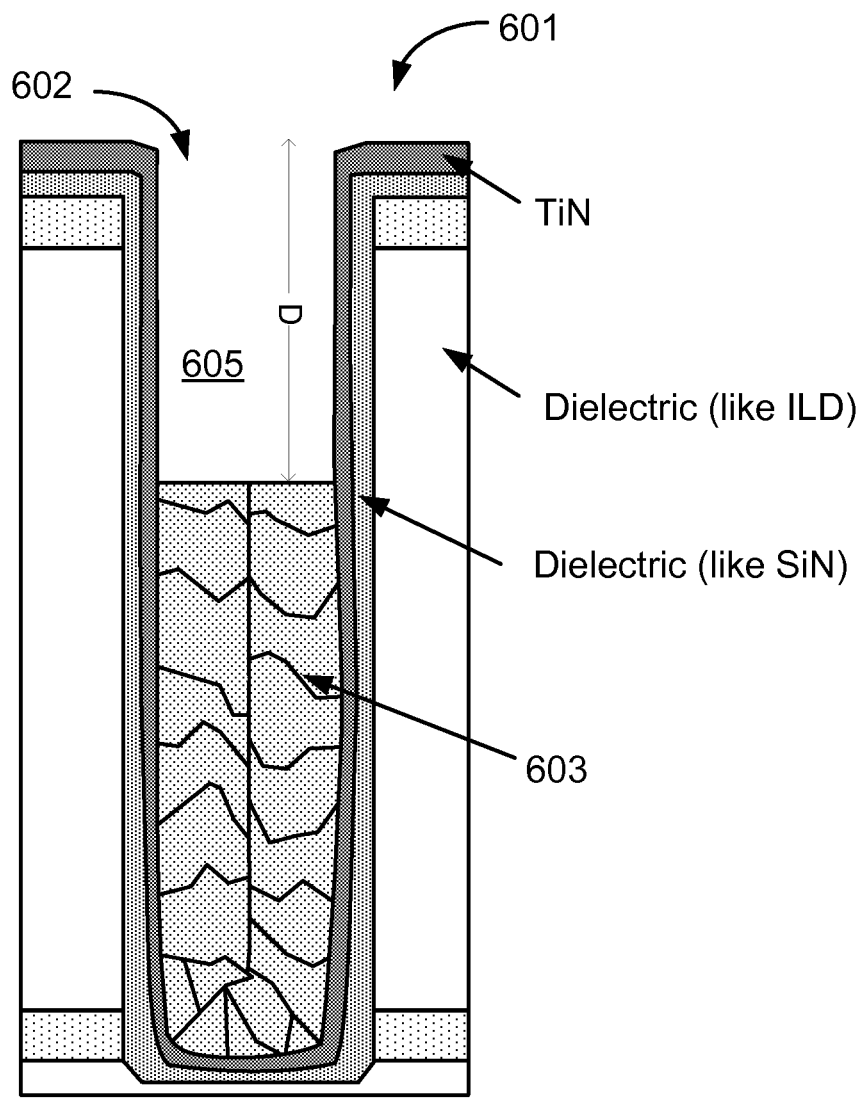
FIG. 6 is a schematic representation of a feature including a recess etched tungsten layer.

In some implementations, the methods described herein provide the ability to combine lateral etching with a desired degree of conformality along with vertical recess etching in filled features. For some new technologies and applications like buried word line (bWL) and one cylinder storage (OCS), only the lower part of the feature may be filled with tungsten, with the upper part an open volume allowing for fill with a different material. FIG. 6 shows an example of a feature 601 having a recessed tungsten layer 603. Recessed layer 603 is recessed from the opening 602, with the recessed depth D substantially uniform across the feature 601. Since standard W-CVD is a conformal deposition process and tungsten grows laterally into the feature from the sidewalls, such a profile is difficult to achieve using a standard W-CVD process. Open volume 605 is available to be filled with another material in some implementations. In addition to bWL and OCS applications in which only the lower part of the feature is filled with tungsten, a recessed tungsten layer may be used as a seed for inside-out fill in a feature. An example is discussed above with respect to FIG. 4B.

In cases like 3-D NAND and vertical integrated memory (VIM) devices, tungsten fill is expected at and beyond pinch point locations. In such applications, lateral tungsten growth, e.g., due to reaction between $WF_6$ and $H_2$ molecules or other reactants, at the pinch point location prevents diffusion of WF$_6$ and H$_2$ to the wider regions beyond the pinch point resulting in voiding. The methods provided here can overcome such voiding. In some implementations, one or both of two approaches can be used together or separately. One approach involves allowing a void to form and then vertically etching through with a etch process that may or may not have selectivity against the under-layer, opening up the void and re-filling with tungsten. The other approach involves partial tungsten deposition followed by carefully tuning the etch conditions to achieve the desired degree of etch conformality such that more tungsten is etched at the pinch point compared to beyond the pinch point. Some examples of potential incoming profiles and resulting tungsten fill are shown in FIG. 1C. Either or both approaches may be used together with the inside-out fill methods described above with respect to FIGS. 2-4B. For example, FIGS. 3A and 4A depict methods in which a void is opened up and the feature re-filled with tungsten. In another example, FIGS. 3B and 4B depict initial void-free conformal fills that may use partial dep-etch-dep approaches. Moreover, selective deposition in any of the inside-out fill methods may involve dep-etch-dep techniques in which etch conformality is tuned to shape the inside-out tungsten growth. Recessing may progress vertically (along the feature axis) or laterally (orthogonal to the feature axis, toward the sidewalls) in the feature depending on existing voids, grain positioning and feature geometry.

Figure 7:
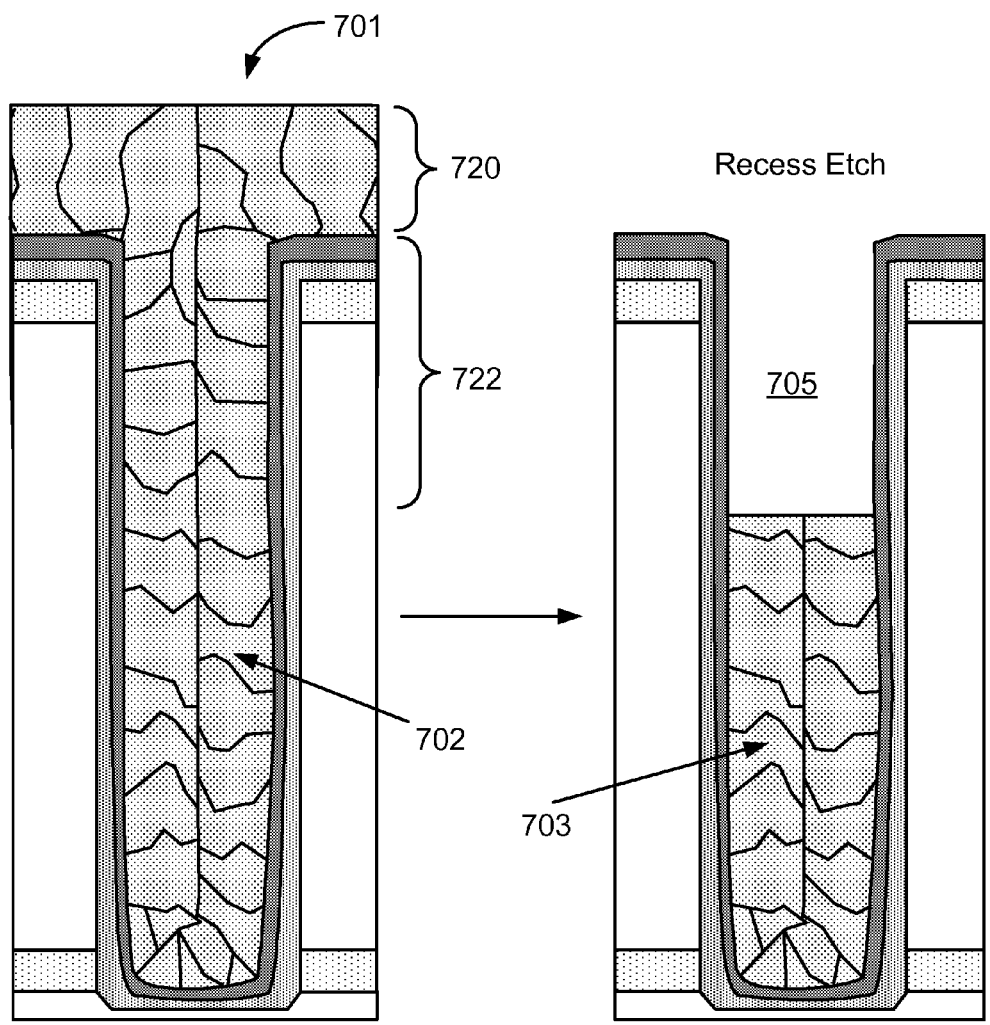
FIG. 7 is a schematic representation of a feature at various stages of recess etching.

As mentioned above, W-CVD growth is in the lateral direction from the sidewalls. To achieve a final profile as illustrated in FIG. 6, in some implementations, the structure is filled structure completely with W-CVD followed by a vertical etch to create the recess or open volume. In some implementations, the etch conditions can be selective to etch only W and avoid etching the under-layer material. FIG. 7 shows a feature 701 filled with tungsten 702 using a standard CVD-W process, for example. A recess etch is performed to form recessed tungsten layer 703 and open volume 705. The open volume 705 can be filled by WN or other material, for example. In some implementations, the recess etch may be performed in one, two, or more etch operations. For example, in a first operation, a fast process to remove tungsten in the field region 720, followed by a more finely controlled process to etch in region 722 and control the recess depth. In one example, the faster process could be performed using a higher temperature, higher etchant flow rate and, for a plasma-based etch, a higher plasma power. Example etch rates may be between 10 Å/sec-50 Å/sec for a faster etch. A slower, more controlled process may be done using lower etchant flow and, for a plasma-based etch, lower plasma power. Depending on desired etch selectivity with respect to an under-layer, the temperature may or may not be lower during the controlled etch than during the faster etch. Example etch rates may be between 3 Å/sec-20 Å/sec or 3 3 Å/sec-10 Å/sec for a controlled etch.

Figure 8:
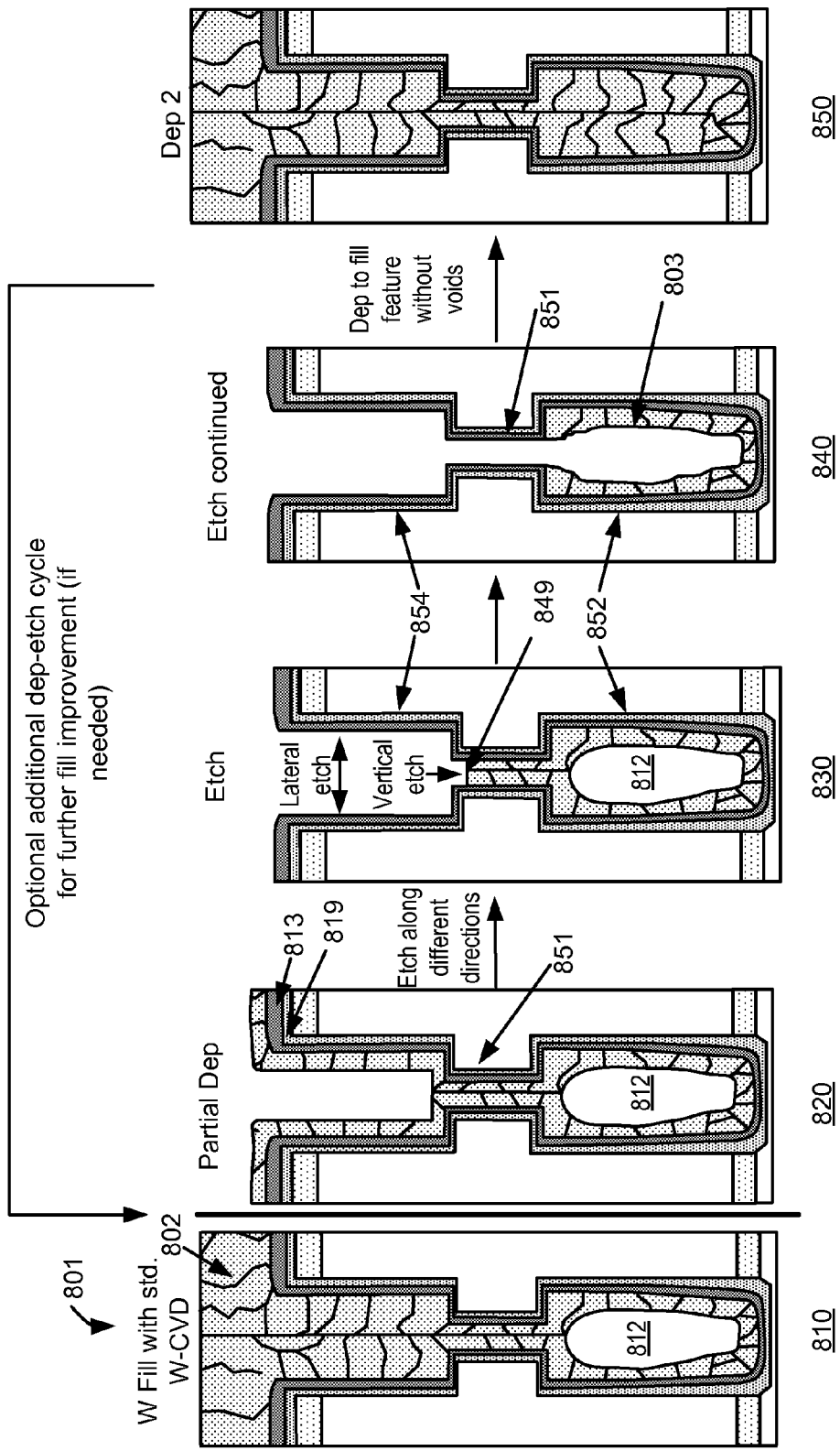
FIG. 8 is a schematic representation of a feature at various stages of feature fill employing a recess etch.

In some implementations, similar recess etching can be useful to achieve fill in structures like those shown in FIG. 1C. For the simplest of the cases in panel (a) of FIG. 1C, the constriction 109 will cause severe voiding in the lower part 119 of the feature. In some implementations, overcoming such voiding involves etch back till the void is opened up allowing for re-filling the void with W-CVD. In certain cases, due to the feature dimensions, the etch back may be lateral (toward the sidewalls) for the top part 121 of the structure and vertical (in the direction of the feature axis) in the constriction 109. In some implementations, multiple dep-etch cycles may be used to achieve complete fill throughout. FIG. 8 illustrates one potential sequence.

FIG. 8 shows a sequence in which a feature 801 including a constriction 851 is filled. It should be noted that feature 801 may be a horizontally-oriented feature (such as word line feature 401 in FIG. 4A) or a vertically-oriented feature. The feature 801 includes under-layers 813 and 819. At 810, feature fill using standard CVD-W is shown. Note that this similar to fill of feature 401 using standard CVD-W shown in FIG. 4B; tungsten 802 fills the feature with a significant void 812 present in the feature 801 past the constriction 851.

In a method as described herein, fill can begin at an operation 820 with a conformal deposition to partially fill the feature, including pinching off the void 812. Operation 820 may include conformal tungsten nucleation layer deposition on under-layer 813 followed by CVD deposition until the constriction 851 is filled, thereby pinching off the void 812. As discussed above, a deposition endpoint may be determined based on the dimensions of constriction 851 and the tungsten deposition rate. At this stage, the method is similar to that described in FIG. 4A. Next, an etch of tungsten is performed at an operation 830 to remove tungsten deposited between the constriction 851 and the opening of feature 801. Unlike the method depicted in the example of FIG. 4A, the etch in this example is selective to tungsten over the under-layer 813, such that the under-layer 813 acts as an etch stop. In some implementations, the etch performed at 830 is a recess etch as described above, with the recess depth indicated at 849. The etch can continue at an operation 840 with etching past the constriction 851 to remove the tungsten in the lower part 852 of the feature until the void is re-opened. In some implementations, the feature dimensions, including the remaining tungsten layer 803, are such that subsequent conformal fill may be performed without forming a void in an operation 850. If, for example, the dimensions are such that the constriction 851 is approximately the same or wider than the narrowest dimension in the lower part 852 of feature 801, subsequent conformal deposition may be used for void free fill.

In some implementations, tungsten is completely removed from the constriction 851, without subsequent deposition of a nucleation layer, in operation 840, to further facilitate void free fill of the lower part 852 of the feature in a subsequent operation. In this case, the tungsten may selectively deposit on the remaining tungsten 803 in the lower part of the feature. Unlike operation 450 in FIG. 4B, the selective deposition in the lower part 852 of the feature may result in conformal fill in the lower part 852 of the feature. Selective inhibition of tungsten nucleation in the constriction and, in some implementations, in the upper part 854 of the feature, may be performed to facilitate selective deposition in the lower part 852 of the feature.

In some implementations, after operation 840, one or more additional dep-etch cycles may be performed for fill improvement. If performed, one or more additional dep-etch cycles can involve repeating operations 820-840 one or more times. In some other implementations, non-conformal etches may be performed as described further below to tailor the feature profile for subsequent deposition.

In the example of FIG. 8, at 850, a conformal deposition is performed to complete void-free feature fill. This may involve conformal deposition of a tungsten nucleation layer followed by CVD deposition of a tungsten bulk layer, and as discussed above, may be performed directly after one iteration of operations 820-840 or after one or more additional etch and or deposition operations.

In more complicated geometries, the profile of the top portion may be re-entrant like examples shown in panels (b) and (c) of FIG. 1C. Due to various reasons, the re-entrant section may be near the surface/field (see, e.g., overhang 115 in panel (b)) or deeper inside the feature (see, e.g., constriction 112 in panel (c)). In such cases, the same sequence as shown in FIG. 8 could be followed up to the penultimate step. A non-conformal etch can then be performed to preferentially etch at the pinched-off section only, with minimal or no etching below.

Aspects of non-conformal etching are described in U.S. patent application Ser. No. 13/351,970, incorporated by reference herein, where a via is partially filled with tungsten, followed by fluorine based etch of tungsten to etch more tungsten near the opening than further in the feature. This may be followed by tungsten deposition to fill the feature. (It should be noted non-conformal etching in U.S. patent application Ser. No. 13/351,970 is referred in places as "selective removal," due to the fact that more material is removed at certain locations of a feature than at other locations. Selective removal as described therein is distinguished from selective etch of one material over another described above.) Non-conformal etching can also be referred to as preferential or low-step coverage etch. To obtain the preferential (or low step coverage) etch, the etch process conditions are carefully designed. A combination of the right etch temperature, etchant flow and etch pressure can help to achieve the desired conformality. If the etch conformality is not tuned right for each type of re-entrant structure, this could result in poor fill even after the dep-etch-dep sequence.

Step coverage is proportional to (reactant species available for reaction)/(reaction rate). For some implementations of feature etch described herein in which the principle etchant is atomic fluorine, this can be simplified to:

$$W\ step\ coverage \propto \frac{(atomic\ F\ concentration)}{etch\ rate}$$

Accordingly, to achieve a certain tungsten etch step coverage (or desired etch conformality or etch non-conformality), the $NF_3$ flow rate (or other F-containing flow rate) and etch temperature are key parameters since they directly affect the concentration of atomic fluorine and etch rate. Other variables like etch pressure and carrier gas flows also carry some significance.

Figure 9A:
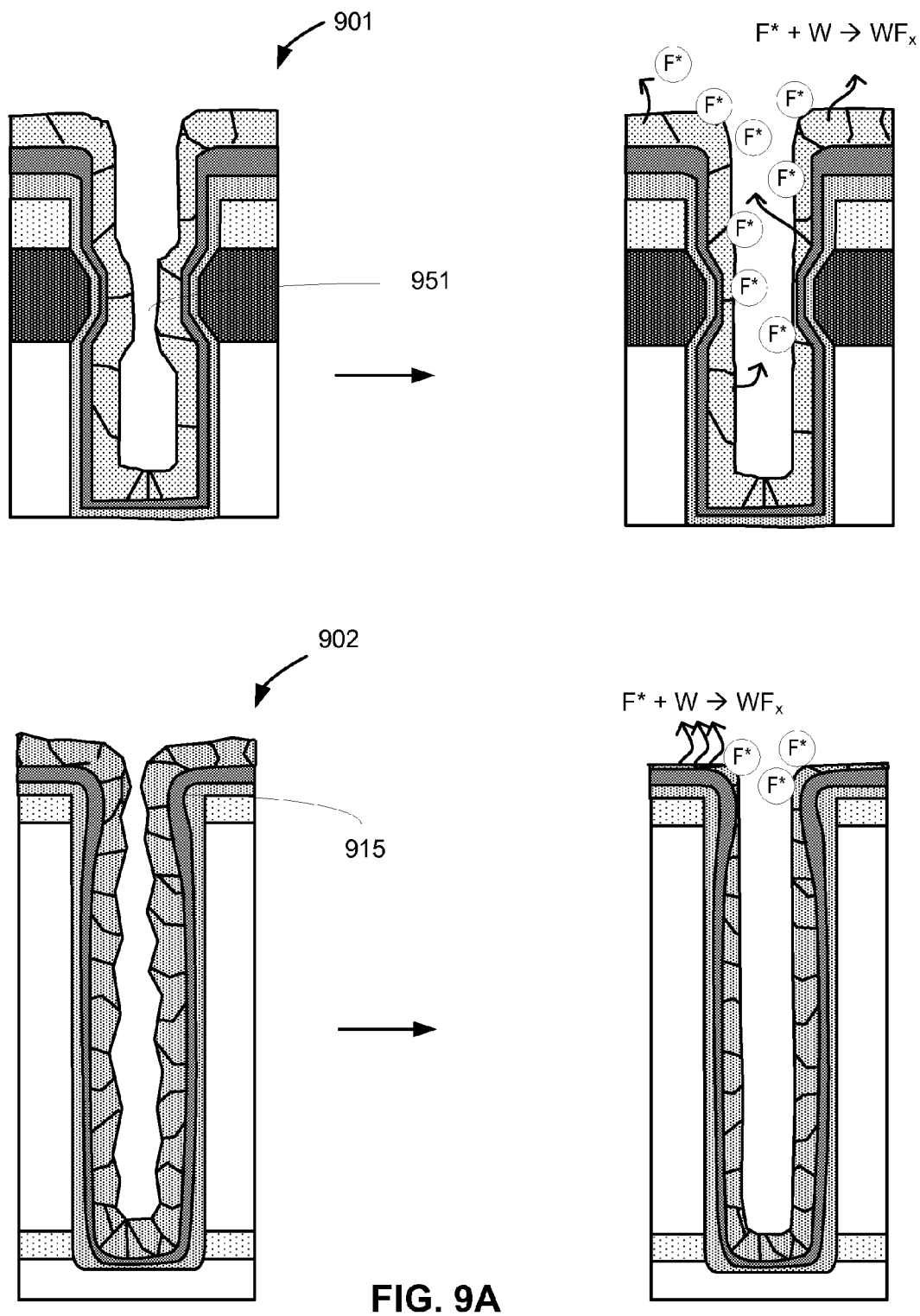
FIG. 9A is a schematic representation of features at various stages of etching that illustrates etch conformality modulation.

At higher temperatures, the incoming fluorine atoms readily react and etch at the feature entrance, resulting in a more non-conformal etch; at lower temperature, the incoming fluorine atoms are able to diffuse and etch further into the feature, resulting in a more conformal etch. Higher etchant flow rate will result in more fluorine atoms generated, causing more fluorine atoms to diffuse and etch further into the feature, resulting in a more conformal etch. Lower etchant flow rate will result in fewer fluorine atoms generated, which will tend to react and etch at the feature entrance, resulting in a more non conformal etch. Higher pressure will cause more recombination of fluorine radicals to form molecular fluorine. Molecular fluorine has a lower sticking coefficient than fluorine radicals and so diffuses more readily into the feature before etching tungsten, leading to a more conformal etch. FIG. 9A shows cross-sectional schematic illustrations of partial deposition and etch in features 901 and 902 that have different profiles. Feature 901 includes a constriction 951 mid-way down the feature; while feature 902 includes an overhang 915 near the feature opening. Standard CVD-W would result in voids within the feature due to pinch-off by constriction 951 and overhang 915, respectively. The etch of feature 901 is a more conformal etch at lower temperature and/or more etchant species, in this example fluorine radicals (F*), to allow the etchant species to diffuse further into the feature. The etch of feature 902 is a more non-conformal etch at higher temperature and/or less etchant concentration.

Figure 9B:
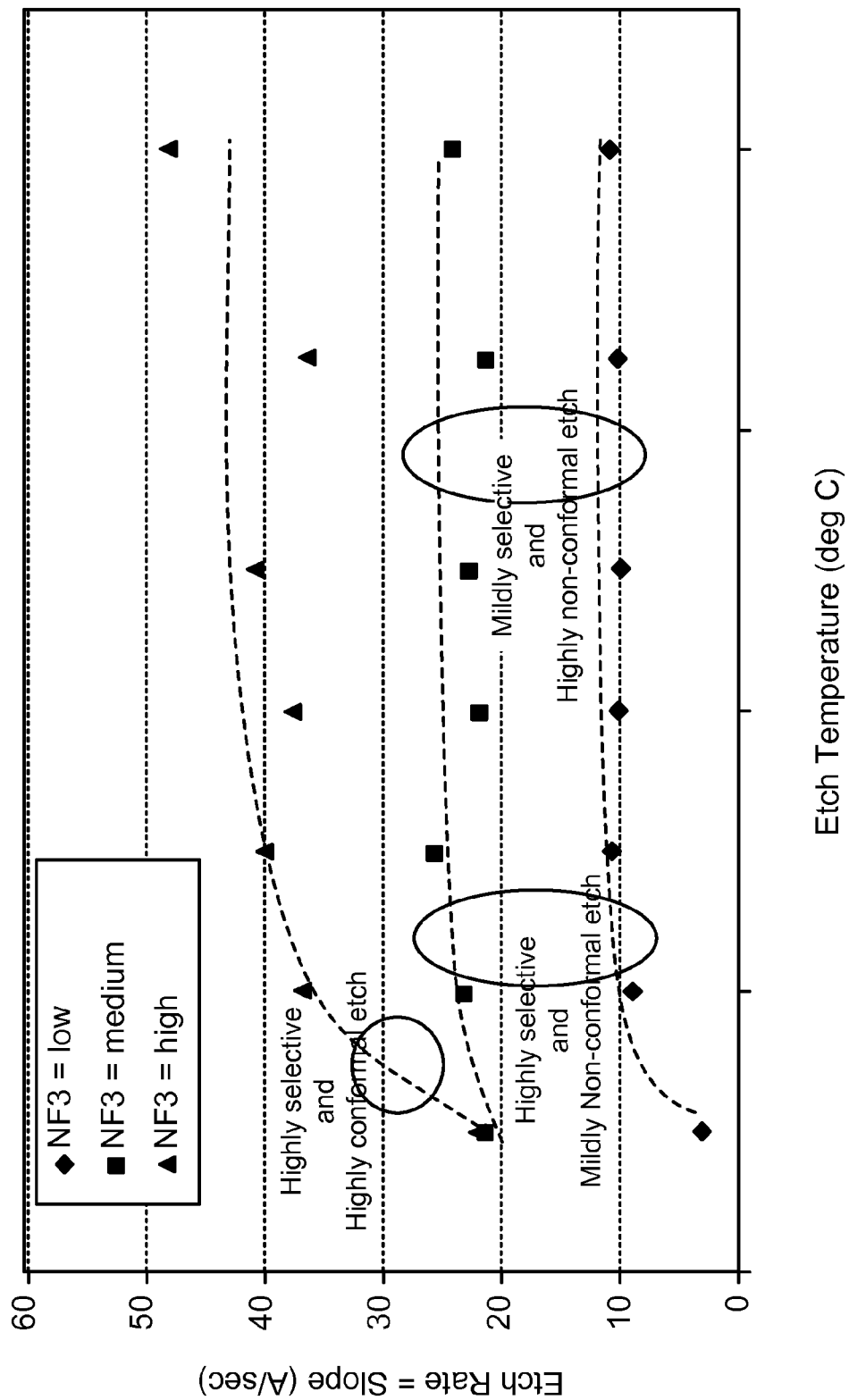
FIG. 9B is a graph showing tungsten etch rate as a function of etch temperature for different etchant flows.

FIG. 9B is a plot of the etch rate as a function of etch temperature for different $NF_3$ flows. Etch conformality can be increased by devising a low etch rate process with high $NF_3$ flow rates. In one example, the region marked "highly selective and high conformal etch" shows process conditions at which the etch is selective (to W over Ti or TiN) and highly conformal throughout the feature. While the lowest etch temperature and highest $NF_3$ flows tested were 25° C. and 100 sccm respectively, even higher conformality can be achieved by reducing the etch temperature and increasing $NF_3$ flow (more atomic F radicals) to achieve a reaction rate limited regime. Conversely, etch non-conformality can be increased by working in a mass transport limited regime wherein high etch rates are achieved with low $NF_3$ flows (fewer atomic F radicals). See, for example, the region marked "mildly selective and highly non-conformal etch." Further discussion of working in mass transport limited and reaction rate limited regimes is provided below.

In some implementations, conformal etching may involve one or more of the following process conditions: temperature below about 25° C., etchant flow above about 50 sccm, and pressure greater than about 0.5 Torr. In some implementations, non-conformal etching may involve one of the following process conditions: temperature above about 25° C., etchant flow below about 50 sccm, and pressure greater less about 2 Torr. A desired level of step coverage (e.g., 60% step coverage) may involve adjusting one or more of these process conditions to make the process more or less conformal.

Figure 10:
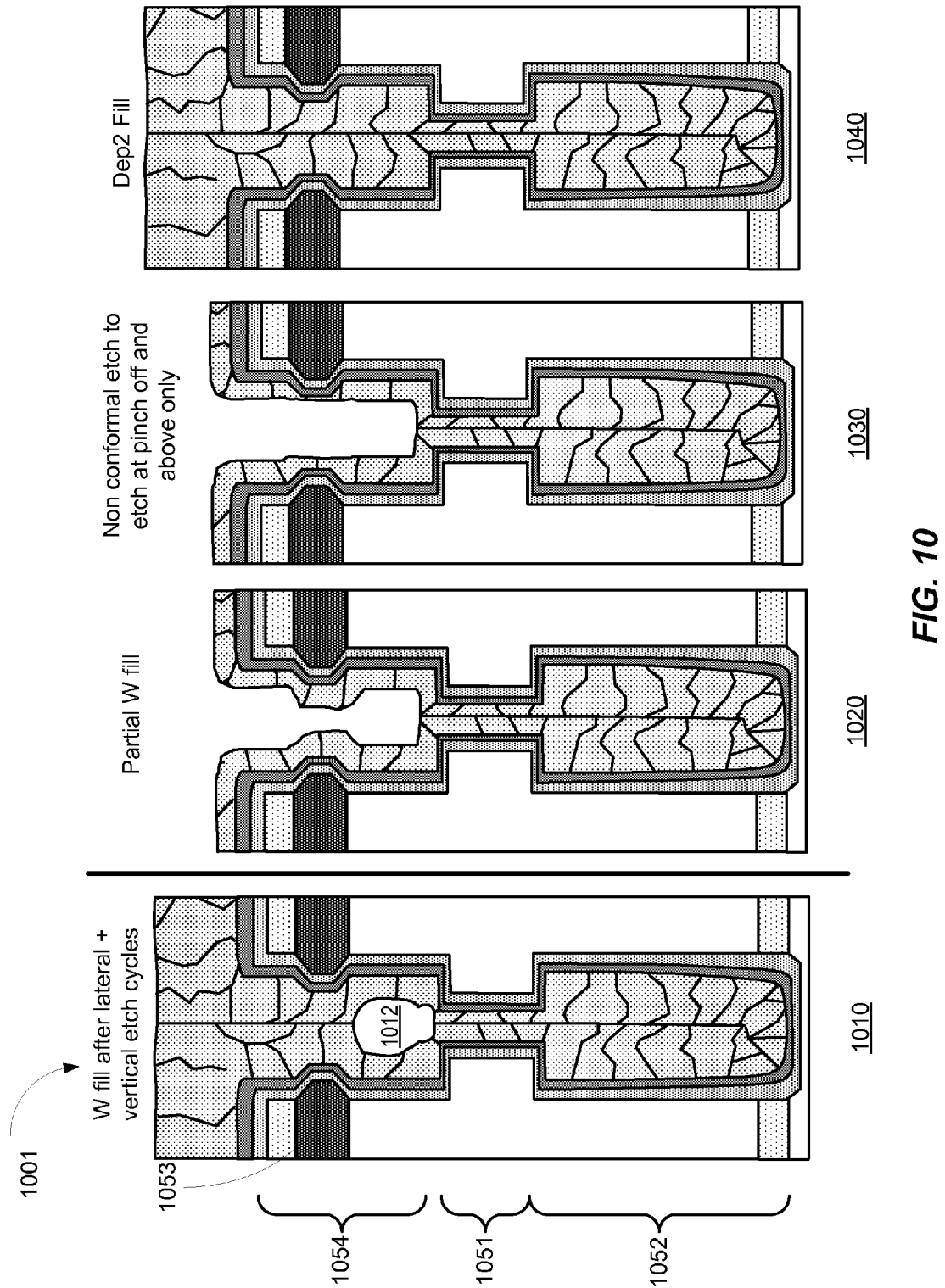
FIG. 10 is a schematic representation of a feature at various stages of feature fill employing a non-conformal etch.

Depending on the location of the pinch off in a feature, the etch process can be tailored to achieve a desired etch step coverage. The non-conformal etch process can be added to the sequence of FIG. 8 as shown in FIG. 10, discussed further below. Buried word line, one cylinder storage, VNAND and other 3D devices are applications where traditional W fill process may not be sufficient, and where the methods described herein can achieve a desired tungsten profile. Further, the ability to tailor the etch step coverage by adjusting process conditions is useful achieve good fill in different profiles. In radical-based etches, the low temperature etch regime minimizes the contribution of recombined species (e.g., $F_2$ species) and with the flow control enables radicals (e.g., F radicals) to be used both for non-conformal and conformal etch conditions. The radical-only etch is also more surface limited in that the radicals would be less likely to diffuse through and open up small seams, or penetrate pinholes as compared to recombined species. This enables a series of new approaches to etch: instead of relying on partial fill, a seam can be closed, with the overburden etched back for example. In another example, the top layer of tungsten in a buried word line (bWL) can be etched without reopening the seam. The methods can provide different types of etch capabilities at different process conditions for various operations.

While etch conformality modulation is describe above chiefly in the context of radical-based etches, etch conformality may also be modulated using other types of etches. For example, temperature, pressure, flow rate, and etchant species may be used to control non-plasma chemical etches. These parameters and any bias applied to the substrate may be used to control ionic-based etches. In one example, a higher power bias may be used to etch further within a vertically-oriented feature.

In some implementations, a non-conformal etch may be used to shape a tungsten profile prior to deposition at various stages in the methods described above with respect to FIGS. 2-8. FIG. 10 is an example of one method in which a non-conformal etch may be used in deposition in an upper part 1054 of a feature 1001 after void-free fill is achieved in the lower part 1052 of the feature 1001. At 1010, feature 1001 including constriction region 1051, upper part 1054 above the constriction region 1051, and lower part 1052 below the constriction region 1051, is depicted after tungsten fill following lateral and vertical etch cycles. The lower part 1052 of the feature 1001 below constriction region 1051 is void-free and filled with tungsten, e.g., using a process as described in FIG. 8. However, a void 1012 is present in the upper part 1054 due to the presence of constriction 1053.

In some implementations, rather than fill the feature 1001 as depicted at 1010, fill can first involve partial fill performed at an operation 1020 with deposition halted before the area of upper part 1054 below constriction 1053 is pinched off. Void-free fill in lower part 1052 can be accomplished by any of the methods described above. The upper part 1054 is partially filled with tungsten in a conformal deposition process. A non-conformal etch is then performed at 1030 to etch only at and above constriction 1053, eliminating the re-entrant profile. A conformal deposition 1040 can then be used to complete void-free feature fill.

Accordingly, one possible sequence to fill a feature having two constrictions at different feature depths may be: (1) tungsten nucleation+CVD bulk deposition until pinch off at lower constriction and void formation below lower constriction (see, e.g., operation 820 of FIG. 8), (2) conformal etch to remove all tungsten above and through lower constriction and re-open void (see, e.g., operations 830-840 of FIG. 8), (3) tungsten nucleation+CVD bulk deposition for void free fill below and at lower constriction and partial fill above lower constriction (see, e.g., operation 1020 of FIG. 10), (4) non-conformal etch above lower constriction to shape tungsten profile above lower constriction (see, e.g., operation 1030 of FIG. 10), and (5) conformal deposition to complete void free feature fill (see, e.g., operation 1040 of FIG. 10). The sequence described is an example of how etch conformality modulation may be used at different times during feature fill to achieve void-free fill, with other sequences possible depending on the feature profile. In addition to etch conformality modulation, selective deposition and conformal deposition may also be used at different times during feature fill to control deposition profiles and achieve void free fill.

Also as described above, in some implementations, selective passivation of a feature may be employed to control feature fill. Selective passivation is described, for example, in U.S. patent application Ser. Nos. 13/351,970 and 13/774,350, both of which are incorporated by reference herein, and further below, with reference to FIGS. 11 and 12.

Feature Fill with Boron Conversion

In some implementations, feature fill can include conformal boron deposition, followed by reduction of a tungsten-containing precursor (such as $WF_6$) by boron to form a layer of tungsten. An example reaction is:

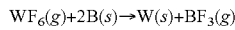

$$WF_6(g) + 2B(s) \rightarrow W(s) + BF_3(g)$$

Figure 13A:
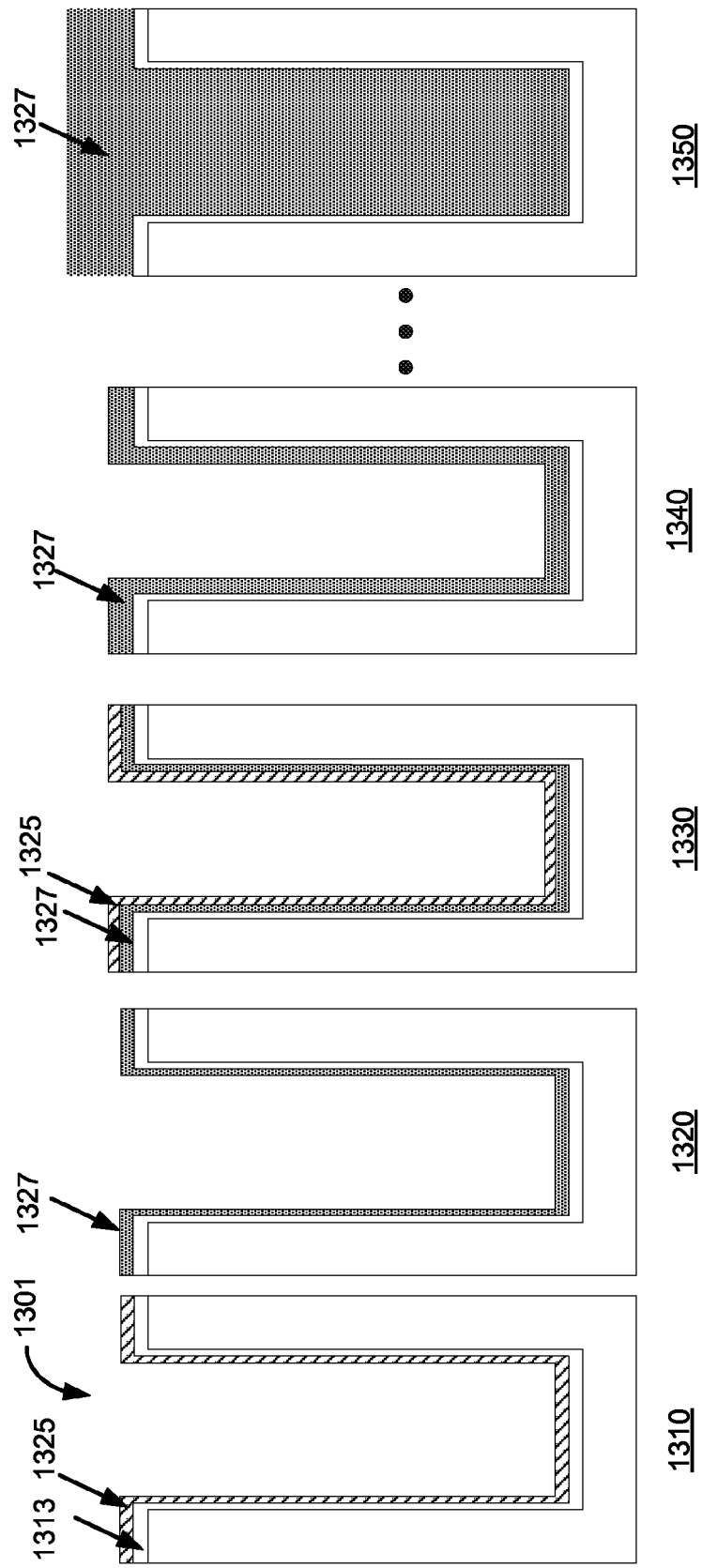
FIG. 13A is a schematic representation of a feature at various stages of feature fill employing boron conversion to tungsten.

FIG. 13A shows a flow diagram illustrating certain operations in such a method of filling a feature. First, in an operation 1310, a thin conformal layer of boron 1325 is deposited in a feature 1301 over a titanium nitride layer 1313. In an operation 1320, the thin conformal layer of boron 1325 is converted to a tungsten layer 1327, for example, by the reaction given above. The boron deposition and conversion operations are repeated at 1330 and 1340 to form another conformal layer of boron 1325 that is then converted to tungsten, such that tungsten layer 1327 grows. The deposition and conversion reactions can be repeated until the feature is completely filled with tungsten 1327. The use of multiple cycles of thin conformal boron (or another reducing material) and conversion to tungsten to deposit very conformal, small grain and smoother tungsten can reduce the seam that may otherwise form using a CVD method that results in large or uneven grain growth. In some implementations, each cycle may form a tungsten layer having a thickness up to about 10 nm. There may be an increase in volume associated with the conversion from boron to tungsten.

Any boron-containing compound that can decompose or react to form a layer capable of reducing the tungsten-containing precursor to form elemental tungsten may be used in operation 1310 and subsequent boron deposition operations. Examples include boranes including $B_nH_{n+4}$, $B_nH_{n+6}$, $B_nH_{n+8}$, $B_nH_m$, where n is an integer from 1 to 10, and m is a different integer than m. Other boron-containing compounds may also be used, e.g., alkyl boranes, alkyl boron, aminoboranes $(CH_3)_2NB(CH_2)_2$, carboranes such as $C_2B_nH_{n+2}$, and borane halides such as $B_2F_4$.

In some implementations, layer 1325 may be any material that is capable of reducing a tungsten precursor including a silicon or silicon-containing material, phosphorous or a phosphorous-containing material, germanium or a germanium-containing material, and hydrogen. Example precursors that can be used to form such layers include $SiH_4$, $Si_2H_6$, $PH_3$, $SiH_2Cl_2$, and $GeH_4$. Another example of using boron conversion in tungsten feature fill is described below with reference to FIG. 18.

The method described with reference to FIG. 13A differs from conventional ALD processes that use diborane or other reducing agents. This is because the deposited conformal boron (or other reducing agent layers) and resulting tungsten layers are significantly thicker than deposited in conventional ALD methods. For example, example thicknesses for each boron layer 1325 may range from about 1.5 nm to 10 nm, or in some implementations, 3 nm to 10 nm, or 5 nm to 10 nm.

The upper limit of thickness may be determined by the maximum thickness that can be converted to tungsten at various process conditions. For conversion at 300° C. to 400° C. and 40 Torr using $WF_6$, a limit of about 10 nm was found. The maximum thickness can vary depending on the temperature, pressure, solid reducing agents, and tungsten precursors. For example, using a higher pressure and/or temperature may allow a reducing agent layer up to 100 nm to be converted. In some implementations, the thickness of each boron (or other reducing agent) layer may between about 5 nm to 50 nm or 10 nm to 50 nm.

In some implementations, the volumetric expansion that takes place on conversion to tungsten is particularly helpful for fill. For example, each layer that is converted to tungsten from a reducing agent may be up about 5% thicker than the reducing agent layer.

Figure 13B:
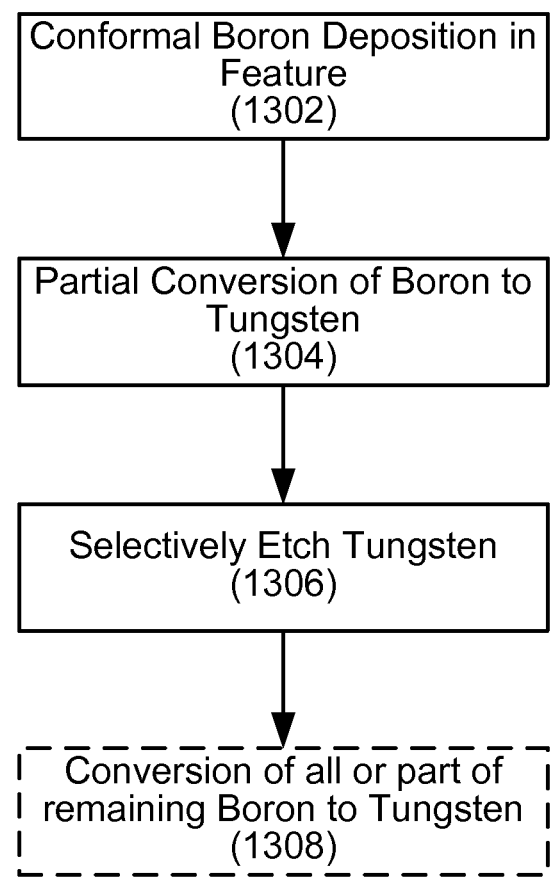
FIG. 13B is a process flow diagram illustrating certain operations in methods of filling features using partial conversion of boron to tungsten.

In some implementations, tungsten fill may be performed using boron as an etch stop. The conversion to tungsten may be limited in some implementations to about 10 nm, which can allow partial conversion to tungsten, followed by an etch selective to tungsten over boron to tailor feature fill. FIG. 13B is a flow diagram illustrating operations in an example of a method in which a boron layer is partially converted to tungsten and used as an etch stop. The method begins with conformal boron deposition in a feature (1352). According to various implementations, conformal boron deposition may occur prior to or after initial tungsten deposition in the feature. In various implementations, for example, the boron is formed on a barrier or liner layer surface, a tungsten surface, or a combination of these surfaces. Block 1352 can involve exposing the feature to a boron-containing compound. In some implementations, the boron-containing compound undergoes thermal decomposition to form elemental boron (B) or a boron-containing layer on the feature surface. The boron layer may also be deposited by a suitable chemical reaction. Example boron-containing compounds are given above.

If thermal decomposition is used to deposit boron (or other conformal material), then temperature in block 1352 is higher than the decomposition point. For $B_2H_6$, for example, the temperature is greater than 250° C. $B_2H_6$ has been successfully used with 450 sccm flow at 300° C., 375° C., and 395° C. and 40 Torr for conformal boron deposition, as examples, though flow rates, temperatures, and pressures different from these may also be used. Block 1352 can involve continuous flow or pulsing the boron-containing compound for until the desired thickness of boron is formed.

Next, the deposited boron is partially converted to tungsten, leaving a portion of the boron-film remaining (1304). Block 1304 generally involves exposing the boron layer to a tungsten-containing precursor vapor with which it will react to leave elemental tungsten. An example of a reaction between tungsten hexafluoride gas and solid boron is given above. The temperature is such that a spontaneous reaction will take place. For example, tungsten hexafluoride has been successfully used for conversion to tungsten with a flow rate of 400 sccm at 40 Torr, at 300° C. and 395° C., for example. The amount of boron converted can depend on the flow rate, pressure, temperature and duration of flow of the tungsten-containing precursor. However, the conversion to tungsten may be limited to about 10 nm. Accordingly, in some implementations, if more than 10 nm of boron is formed in block 1352, only about up to the top 10 nm of boron is converted to tungsten, leaving a boron-tungsten bilayer.

Next, tungsten is selectively etched with respect to boron (1306). In some implementations, the boron acts as an etch stop. In this manner, the feature fill may be tailored. For example, the boron layer may be used similarly to the under-layers shown in FIGS. 3A, 3B, 8 and 10 that act as etch stops in feature fill. Unlike those under-layers, in some implementations, the remaining boron may be converted to tungsten after the etch process (1308). In this manner, more of the feature is occupied by a lower resistivity material. In some implementations, boron is formed in block 1302 to a thickness of no more than about 20 nm such that it can all be converted to tungsten in two conversion operations that each convert up to about a 10 nm thick layer of boron to tungsten. Similarly, in some other implementations, boron may be formed to a thickness of no more than n x 10 nm, wherein n is the number of etch operations to be performed. An example of a process as described with reference to FIG. 13B is discussed below with reference to FIG. 19.

Controlling etch selectivity to use boron as an etch stop may involve adjusting temperature, flow rates, and other parameters, e.g., as described above with respect to W:Ti and W:TiN etch selectivities. In one example, boron acts as an etch stop using a 25° C. F-based remote plasma etch using $NF_3 \rightarrow NF_x + F^*$ chemistry. At these temperatures, the W selectively etches faster than the B, which may be related to the thermodynamics of the reactions $B+3F^* \rightarrow BF_3$ vs. $W+6F^* \rightarrow WF_6$. Other types of etches and etch chemistries may be modu The method described in FIG. 13B may also be used with other solid layers instead of or in addition to boron. For example, silicon or silicon-containing material, phosphorous or a phosphorous-containing material, germanium or a germanium-containing material may be deposited and partial converted to tungsten via a reaction with a tungsten-containing precursor as described above with respect to FIG. 13A. It should be noted that while a conversion limit of about 10 nm has been observed for $WF_6$ using particular process conditions, conversion limits may be experimentally or theoretically determined for other tungsten-containing compounds and/or other reducing agents. Accordingly, the methods described herein may be adjusted to deposit more or less reducing agent prior to partial conversion of the reducing agent to tungsten.

Feature Fill with Fluorine-Free Tungsten (FFW) and Tungsten Nitride (FFWN)

Figure 13C:
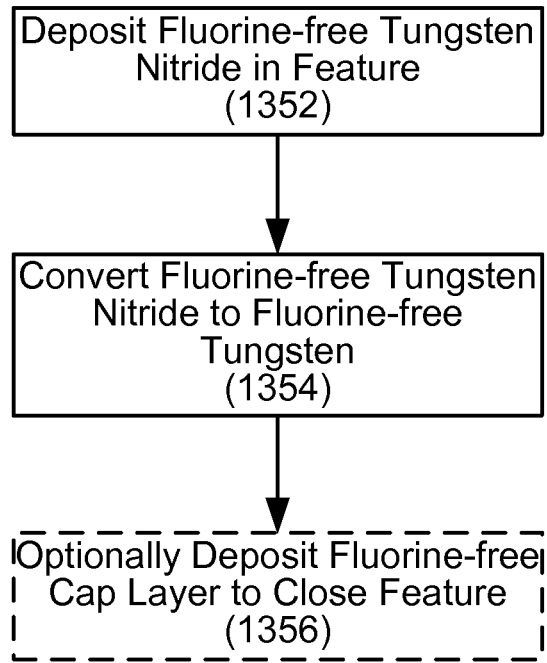
FIGS. 13C and 13D are process flow diagram illustrating certain operations in methods of filling features using fluorine-free tungsten-containing layers.
Figure 13D:
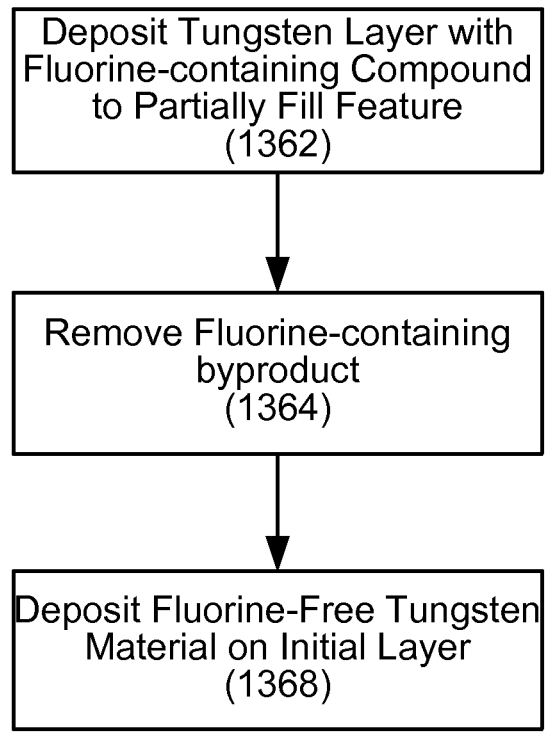

FIGS. 13C and 13D are flow diagrams showing certain operations in examples of using fluorine-free layers in feature fill. Fluorine (F) in tungsten and tungsten precursors may react during further integration operations to form highly reactive hydrofluoric acid (HF). HF can eat into oxide in oxide stacks, for example, or otherwise negatively affect integration.

FIG. 13C shows one example in which a fluorine-free tungsten nitride layer can be deposited in a feature, then converted to a fluorine-free tungsten layer. First, a fluorine-free tungsten nitride layer is deposited in a feature (1352). In some implementations, the tungsten nitride layer is deposited by a thermal ALD or PNL process in which a reducing agent, tungsten-containing precursor, and nitrogen-containing reactant are pulsed (in various orders) to form a conformal tungsten nitride layer on the feature. Examples of ALD and PNL processes to deposit tungsten nitride films are described in U.S. Pat. No. 7,005,372 and U.S. Provisional Patent Application No. 61/676,123, both of which are incorporated by reference herein.

To deposit fluorine-free layers, generally all of the reactants are fluorine-free. In some implementations, the nitrogen-containing compound acts as the reducing agent, such that a separate reducing agent may or may not be used. In some implementations, the tungsten-containing precursor may also include nitrogen, such that a separate nitrogen-containing compound may or may not be used.

Examples of fluorine-free tungsten precursors that may be used include $W(CO)_6$ and organotungsten precursors such as $W_2(NMe_2)6$, $W(OEt)_6$, $W(OnPr)_6$, $(tBuN=)_2W(NMe_2)_2$, $(tBuN=)_2W(NEtMe)_2$, $W(Cp)_2H_2$, $W(NEt_2)_2(NEt)_2$, $W(iPrCp)_2H_2$, $(tBuN=)_2W(HNMe)_2$, $W(EtCp)_2H_2$ and derivatives thereof. Further examples include ethylcyclopentadienyl-dicarbonylnitrosyl-tungsten (EDNOW), methylcyclopentadienyl-dicarbonylnitrosyl-tungsten (MDNOW), and ethylcyclopentadienyl)tricarbonylhydridotungsten (ETHW), available from Praxair, as well as tungsten bis(alkylimino)bis(alkylamino) compounds having the following structure:

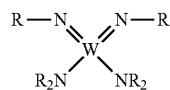

where each R may be independently selected from methyl, ethyl, propyl, butyl and tert-butyl groups. These groups may be substituted or unsubstituted, though are typically unsubstituted. For example, the tungsten-containing precursor is bis(tert-butylimino)bis(dimethylamino) tungsten (W[N$(C_4H_9)]_2[N(CH_3)_2]_2$.

Examples of reducing agents include boranes, silanes, $H_2$, $NH_3$, $N_2H_4$, $N_2H_6$, and combinations thereof. Examples of nitrogen-containing compounds include $N_2$, $NH_3$, $N_2H_4$, and $N_2H_6$. In some implementations, the deposited film is a WN film having relatively little carbon, e.g., less than about 5 atomic % or less than about 2 atomic % carbon. In some implementations, a CVD method of depositing tungsten nitride may be employed in block 1352 in addition to or instead of an ALD or PNL method. In one example, thermal ALD using an organo-tungsten precursor or $W(CO)_6$ can be used to deposit a WN layer, without pinching off a feature in block 1352.

In various implementations, the as-deposited W content in the FFWN film may range from about 20% to 80% (atomic) with the N content ranging from about 10% to 60% atomic. Some amount of carbon may be present as indicated above. Moreover, as discussed below with respect to tungsten films, other elements may be present including oxygen, boron, phosphorous, sulfur, silicon, germanium and the like, depending on the particular precursors and processes used. Above-referenced U.S. Provisional Patent Application No. 61/676,123 discusses deposition of ternary WBN films, for example.

Returning to FIG. 13C, the fluorine-free tungsten nitride is then converted to fluorine-free tungsten (1354). This is generally done by thermally annealing the tungsten nitride at temperatures of at least about 600° C. for a period of time, e.g., between about 5 seconds and 120 seconds, such that the nitrogen in the tungsten nitride film leaves as nitrogen gas ($N_2$). In some implementations, block 1352 is performed without closing off the feature to allow a flow path for the volatilized $N_2$ gas. For example, leaving at least about 1 to 2 nm open at a pinch point or constriction may allow the anneal to convert substantially all of the tungsten nitride to tungsten.

Once the tungsten nitride film is converted to tungsten, a further fluorine-free tungsten or tungsten nitride film may optionally be deposited to close off any constrictions and/or complete feature fill (1358). Deposition of a fluorine-free tungsten nitride film is described above with respect to block 1352. Deposition of a fluorine-free tungsten film may be performed using a thermal ALD or PNL process in which a reducing agent and fluorine-free tungsten-containing precursor are pulsed to form a conformal tungsten layer on the feature. According to various implementations, one or more other techniques described herein, including inside-out fill, recess etch, etch conformality modulation, and boron conversion may be used to complete void-free feature fill in some implementations, while using fluorine-free precursors and reducing agents. In some other implementations, a feature may be capped with a fluorine-free WN or W layer, while leaving a void within the feature. The cap layer may be employed to close off the gas flow pathway left in block 1352. If a fluorine free tungsten nitride layer is deposited in block 1358, it may or may not be followed by a thermal anneal to convert it to elemental tungsten. In some implementations, for example, it may not be particularly advantageous to convert a thin WN layer (e.g., 5 Å) to W. An example of a process according to FIG. 13C is described below with reference to FIG. 22.

FIG. 13C is a flow diagram illustrating certain operations in an example of a method which a fluorine-free tungsten-containing layer may be used to seal a tungsten layer deposited using a fluorine-containing gas. First, a feature is partially filled with a tungsten layer deposited with a fluorine-containing compound (1362). Block 1362 can involve depositing a tungsten nucleation layer followed by a depositing a bulk tungsten layer using a precursor such as tungsten hexafluoride. Partial fill is performed, keeping the feature open. This allows HF gas to be pumped out of the feature in block 1364 and, in some implementations, may allow a fluorine-free layer to be deposited on the layer in block 1368.

Next, any HF (or other fluorine-containing gas) generated as a reaction byproduct or otherwise present in the feature is pumped out (1364). In some implementations, some fluorine may be present in the remaining tungsten film. The tungsten film can be sealed using a HF-free process, for example depositing a fluorine-free tungsten or tungsten nitride layer as described above or using a boron conversion with a fluorine free tungsten precursor. According to various implementations, any constrictions may be sealed with a fluorine-free film and/or any exposed surface of tungsten film deposited in block 1362 may be covered with a fluorine-free film. This can prevent any fluorine that may be present in the film from forming hydrofluoric acid during integration. The method described with respect to FIG. 13D may be useful to efficiently deposit most of the tungsten in the feature with a fluorine-based process, while allowing preventing any remaining fluorine from affecting subsequent integration.

According to various implementations, the film deposited in block 1368 may close off any constrictions and/or complete feature fill. According to various implementations, one or more other techniques described herein, including inside-out fill, recess etch, etch conformality modulation, and boron conversion may be used to complete void-free feature fill in some implementations, while using fluorine-free precursors and reducing agents.

While the methods described above with reference to FIGS. 13C and 13D refer to fluorine-free tungsten and tungsten nitride, they may be generalized to halogen-free tungsten and tungsten nitride films. Similarly, the tungsten deposited in block 1362 may be deposited with a halogen-containing precursor such as $WCl_6$.

Feature Fill Examples

Aspects of the invention will now be described in the context of VNAND word line (WL) fill. While the below discussion provides a framework for various methods, the methods are not so limited and can be implemented in other applications as well, logic and memory contact fill, DRAM buried word line fill, vertically integrated memory gate/word line fill, and 3-D integration with through-silicon vias (TSVs). The processes described below may be applied to any horizontally or vertically-oriented structure including one or more constrictions, including tungsten via and trench fill.

Figure 17:
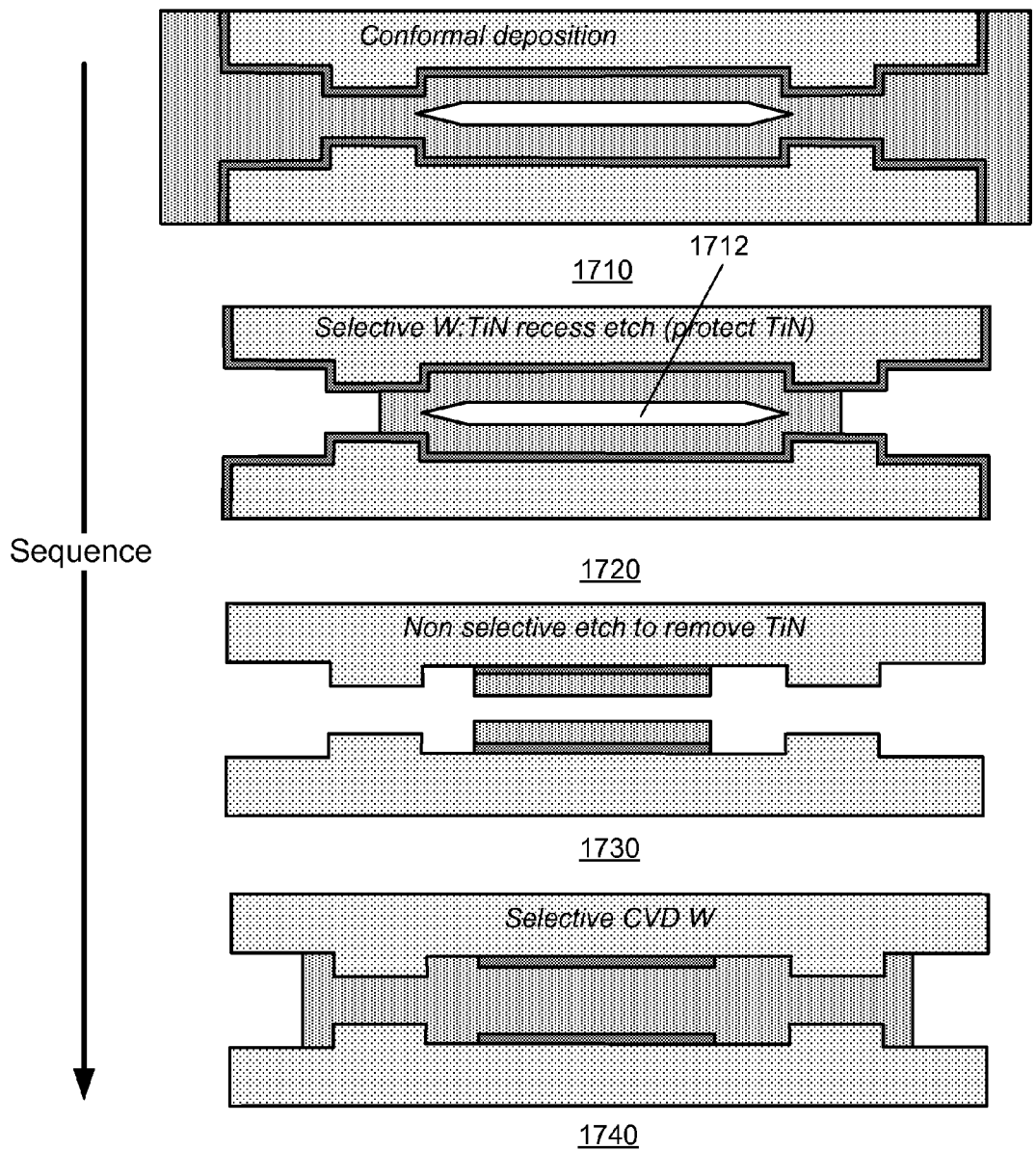

FIG. 1F, described above, provides an example of a VNAND word line structure to be filled. As discussed above, feature fill of these structures can present several challenges including constrictions presented by pillar placement. In addition, a high feature density can cause a loading effect such that reactants are used up prior to complete fill. Various methods are described below for void-free fill through the entire WL. In certain implementations, low resistivity tungsten is deposited. Also in certain implementations, the film has a low F content with no HF trapping. In some implementations, the feature may not be completely filled, with feature fill halted prior to the fill reaching the feature opening. An example is shown in FIG. 17 at 1740.

Figure 14:
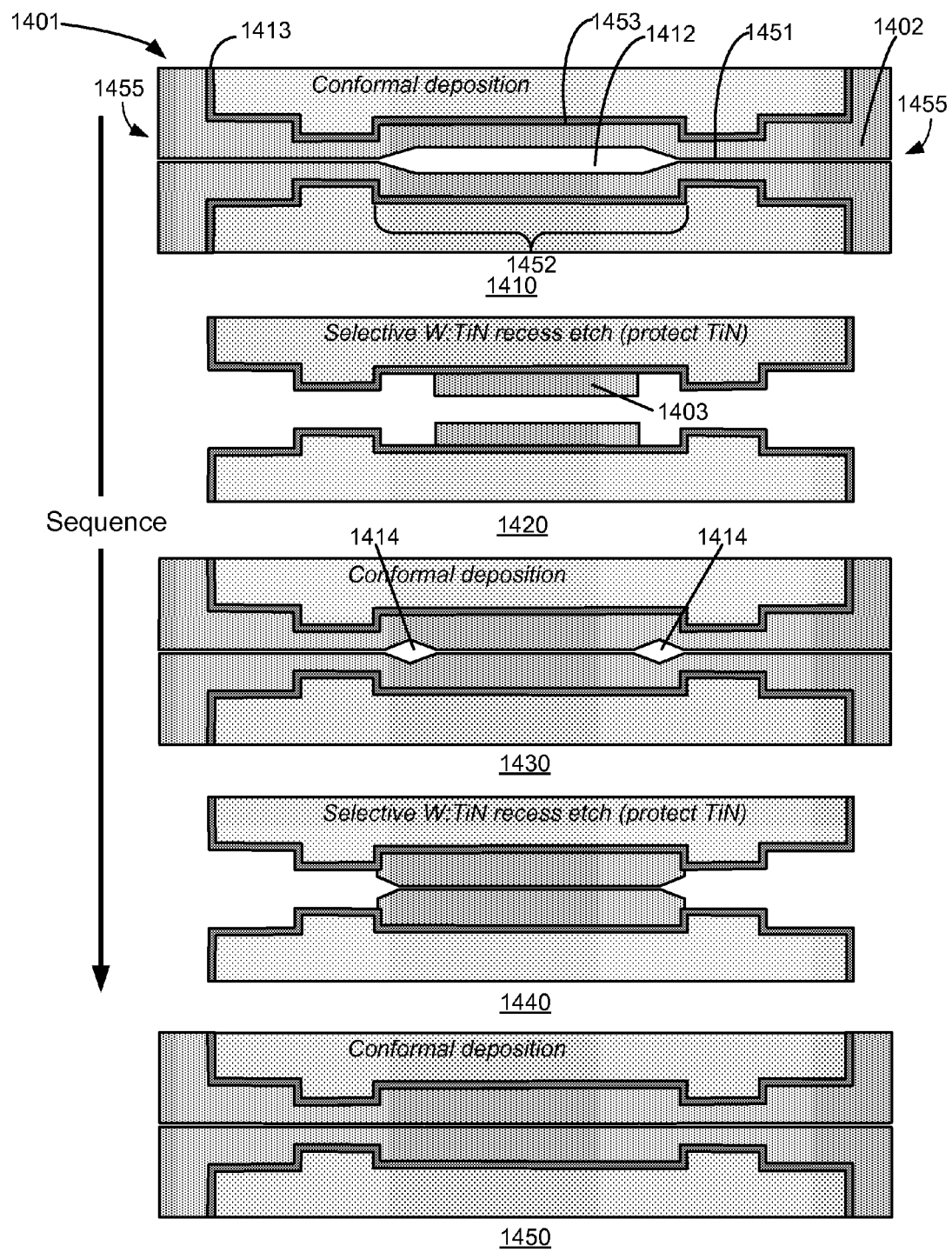
FIGS. 14-23 are schematic representations of three-dimensional vertical NAND (3-D VNAND) features at various stages of feature fill.

FIG. 14 shows a sequence in which conformal deposition operations are alternated with an etch with a high W:TiN etch selectivity in a feature. The feature 1401 includes constrictions 1451, and an interior region 1452 that may be accessible from two ends 1455. As discussed above with respect to FIG. 1G, FIG. 14 can be seen as a 2-D rendering of a 3-D feature, with the figure showing a cross-sectional depiction of an area to be filled and the constrictions 1451 representing constrictions from pillars that would be seen in a plan rather than cross-sectional view. FIGS. 1E and 1F above provide additional description of how pillars may be arranged. The feature includes an under-layer 1413, which in the example of FIG.

14 is a TiN layer, though it may be any under-layer. The sequence begins at 1410 with conformal deposition of tungsten to fill the feature, leaving a void 1412 in the interior of the feature.

An etch selective to W over the under-layer TiN is then performed at 1420 to leave tungsten 1403 within the feature, as described above with reference to FIG. 2, 7 or 8, for example. The remaining tungsten 1403 provides feature dimensions in the feature interior 1455 that are closer to the dimensions at the constrictions 1451. This allows void formation in subsequent conformal deposition to be reduced or eliminated. For example, in another conformal deposition at 1430, two voids 1414 are formed that are smaller and closer to the feature ends 1455 than void 1412 formed at 1410. A selective etch performed at 1440 can open voids 1414, re-shaping the feature profile so there is no re-entrancy in the feature. A final conformal deposition at 1450 can provide void free fill of the word line. It should be noted that in the depicted example, the deposition operations are conformal, and may involve deposition of a conformal nucleation layer in the feature. The exact profiles of the residual W left after etching can vary according to the particular implementation.

Figure 15:
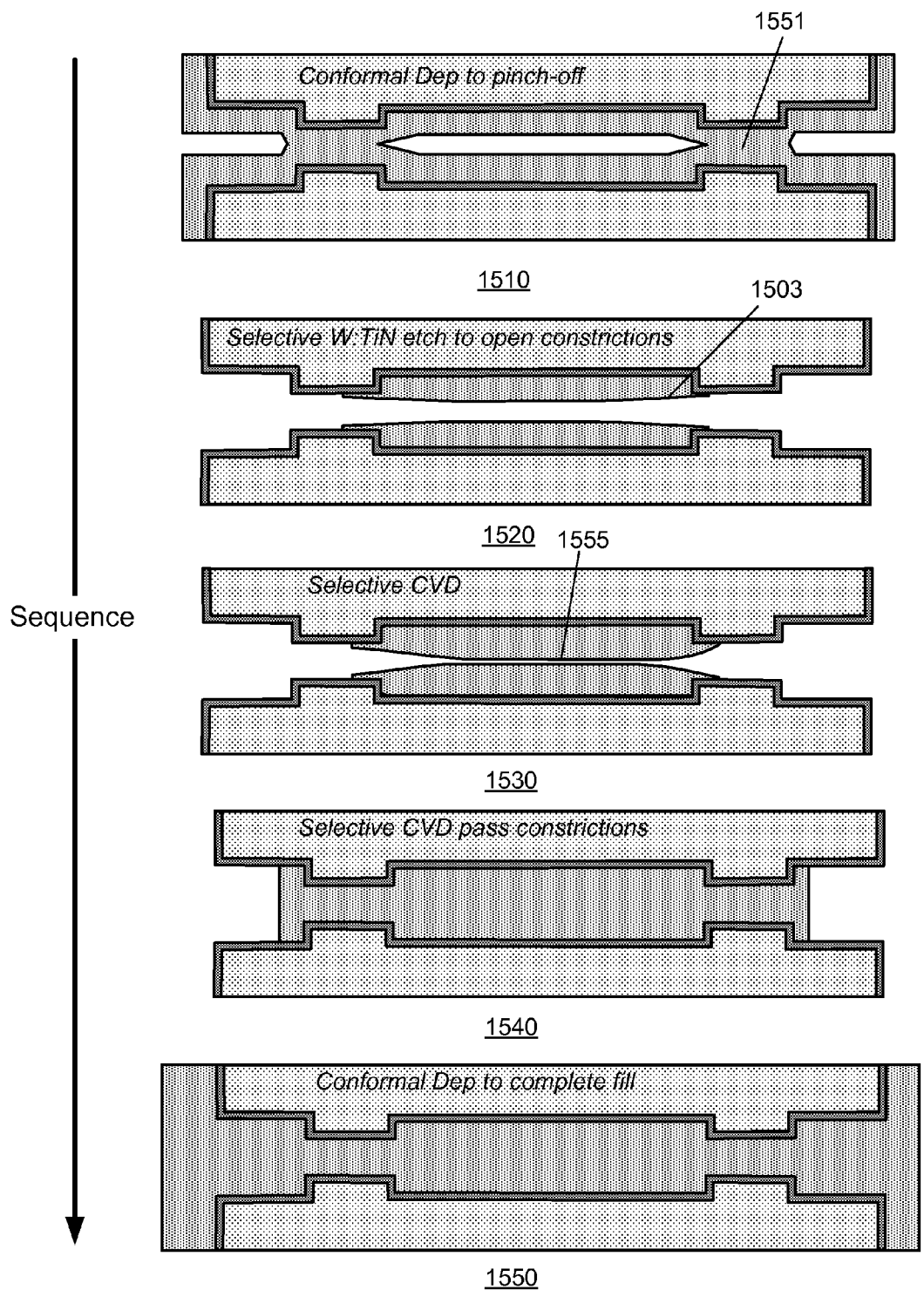

FIG. 15 shows a sequence similar to FIG. 14, but with selective rather than conformal depositions to provide inside-out fill as discussed above with reference to FIGS. 3A-4B, for example. The process begins at 1510 with a conformal deposition, e.g., a PNL nucleation layer plus CVD operation, to pinch off the feature. Next, an etch selective to W is performed at 1520 to open the constrictions, leaving an etched tungsten layer 1503. Selective deposition (typically with no new conformal nucleation layer) of tungsten is then performed to achieve inside-out fill and pass the constrictions. The progression of a CVD operation used to fill the interior region 1555 of the feature and then pass constrictions 1551 is shown at 1530 and 1540, respectively. In the depicted example, a conformal deposition can be used to complete fill at 1550. The conformal deposition can involve deposition of a tungsten nucleation layer in the unfilled end portions of the feature, followed by bulk deposition. In some implementations, the initial deposition and etch operations 1510 and 1520 in FIG. 15 may result in profiles similar to those in operations 1410 and 1420 FIG. 14 (and vice-versa). Also in some implementations, the depositions to finish fill at 1450 and/or 1550 can involve one or more of selective removal operations and/or passivation operations as described above.

Figure 16:
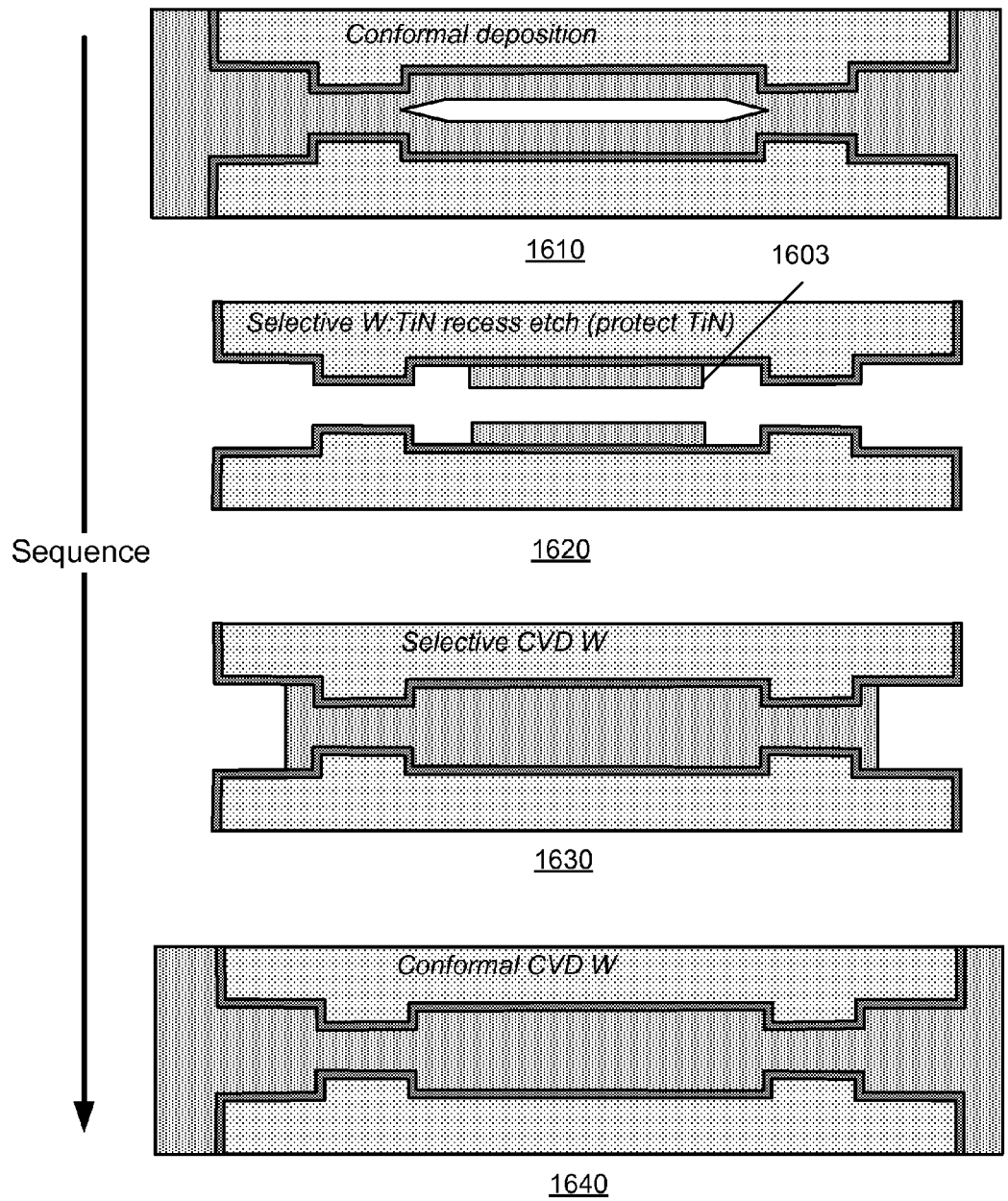

FIG. 16 shows a variation on inside out growth process shown in FIG. 15. Similar to operation 1510 in FIG. 15, the process begins at 1610 with a conformal deposition, e.g., a PNL nucleation layer plus CVD operation, to pinch off the feature. Next, an etch selective to W is performed at 1620 to open the constrictions, leaving an etched tungsten layer 1603. Selective deposition (typically with no new conformal nucleation layer) of tungsten is then performed at 1630 to achieve inside-out fill and pass the constrictions. The profile of the etched tungsten layer 1603 differs from that formed at 1520 in FIG. 15, which may affect the progression of the selective deposition. In both examples, however, the etched tungsten layer acts as a seed layer for subsequent CVD and facilitates inside-out fill. A conformal deposition can be used to complete fill at 1640. This can involve one or more of selective removal operations and/or passivation operations as described above in some implementations.

FIG. 17 shows a sequence using a selective and non-selective W/TiN etches. A film is first deposited conformally in a feature at 1710 leaving a void 1712. An initial selective etch can be used to etch into the pinch point at 1720, followed by an etch that is non-selective to W and TiN at 1730. The remaining film can be used as a seed layer for selective deposition of W at 1740.

Figure 18:
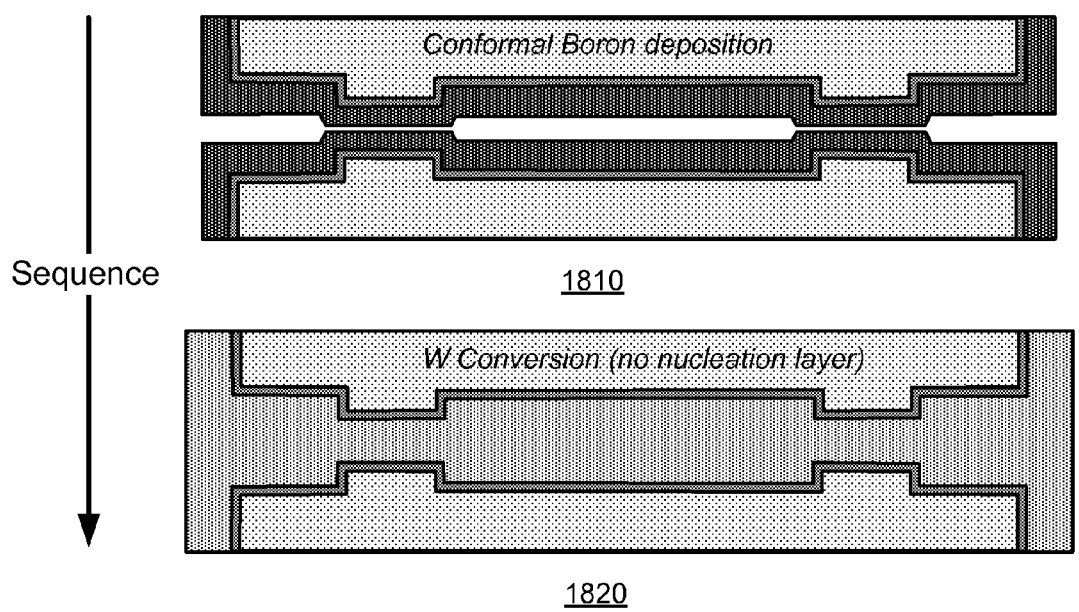

FIG. 18 shows a sequence in which a boron layer is converted to tungsten. The method can start by allowing boron to adsorb onto the substrate, e.g., using diborane or other boron-containing precursor at 1810. The thickness can be near the pinch off point, e.g., 10 nm thick. As noted above, in some implementations, 10 nm may be approaching the limit for tungsten conversion in a reasonable amount of time. Tungsten hexafluoride or other tungsten-containing precursor can then be reduced by the boron layer, to form elemental tungsten at 1820. There may a thickness expansion associated with the conversion (3.6% based on atomic volume.) According to various implementations, the conversion may or may not seal off the feature below the constrictions. In some implementations, no hydrogen is used during the conversion, such that no HF is trapped within the feature. The F concentration within the boron-converted tungsten is low. According to various implementations, the feature may be filled with tungsten without forming a tungsten nucleation layer. Also in some implementations, the boron deposition and conversion operations may be repeated, e.g., as shown in FIG. 13A. Still further, in some implementations, tungsten conversion may be followed by one or more conformal or selective tungsten deposition operations, or deposition-etch-deposition operations, to complete feature fill.

Figure 19:
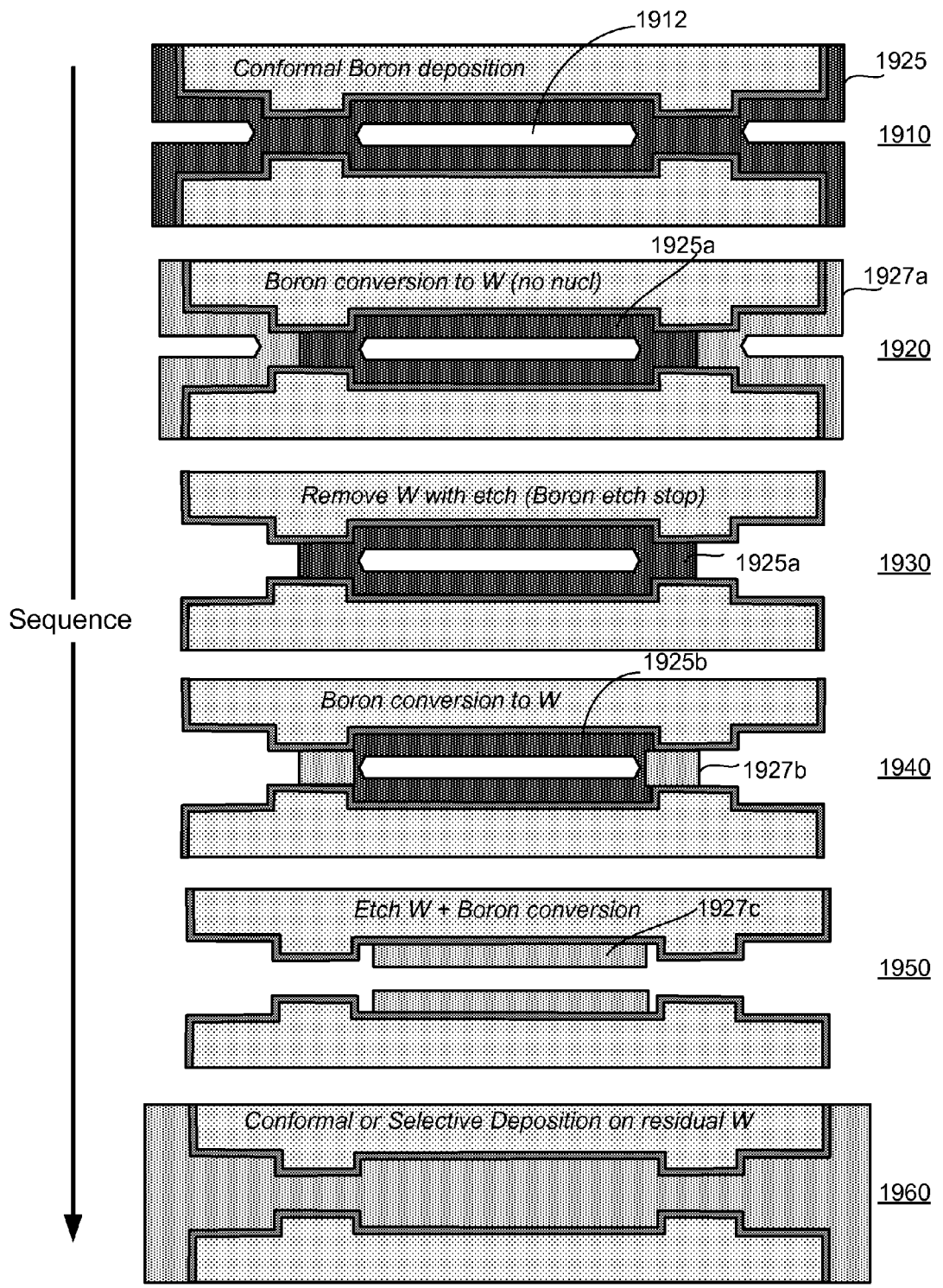

FIG. 19 shows another sequence involving boron conversion to tungsten. In the depicted example, boron is alternately used as an etch stop for etch tungsten and converted to tungsten. The tungsten can be etched to leave a starting layer for inside-out fill. One or more conformal or selective depositions or combinations thereof can be used to complete the fill. Because the conversion may be self-limiting to about 10 nm, boron deeper into the feature is left unconverted and can be used as an etch stop. In the example of FIG. 19, the process begins at 1910 with conformal deposition of an initial boron layer 1925 in the feature to close off the pinch points, leaving a void 1912. Examples of compounds that may be used to deposit boron are described above. Part of the boron layer 1925 is then converted to a tungsten layer 1927a at 1920. As noted above, in some implementations, boron up to a certain limit (e.g., 10 nm) is converted. The partial conversion leaves a residual boron layer 1925a. The tungsten layer 1927a is then selectively removed, leaving boron layer 1925a, at 1930. The boron layer 1925a is then partially converted to tungsten, forming tungsten layer 1927b and residual boron layer 1925b at 1940. In this example, boron is converted just through the pinch point so that the feature will open up in a subsequent W-selective etch. In some other implementations, one or more additional partial conversions/selective etches may be performed to open the feature due to the self-limiting nature of the conversion. The tungsten layer 1927b is selectively removed and in a subsequent operation, the remaining boron layer 1925b is converted to tungsten layer 1927c. Tungsten layer 1927c can then be the basis for conformal deposition to fill the feature (e.g., as in FIG. 16) or selective deposition to fill the feature (e.g., as in FIG. 14).

Figure 20:
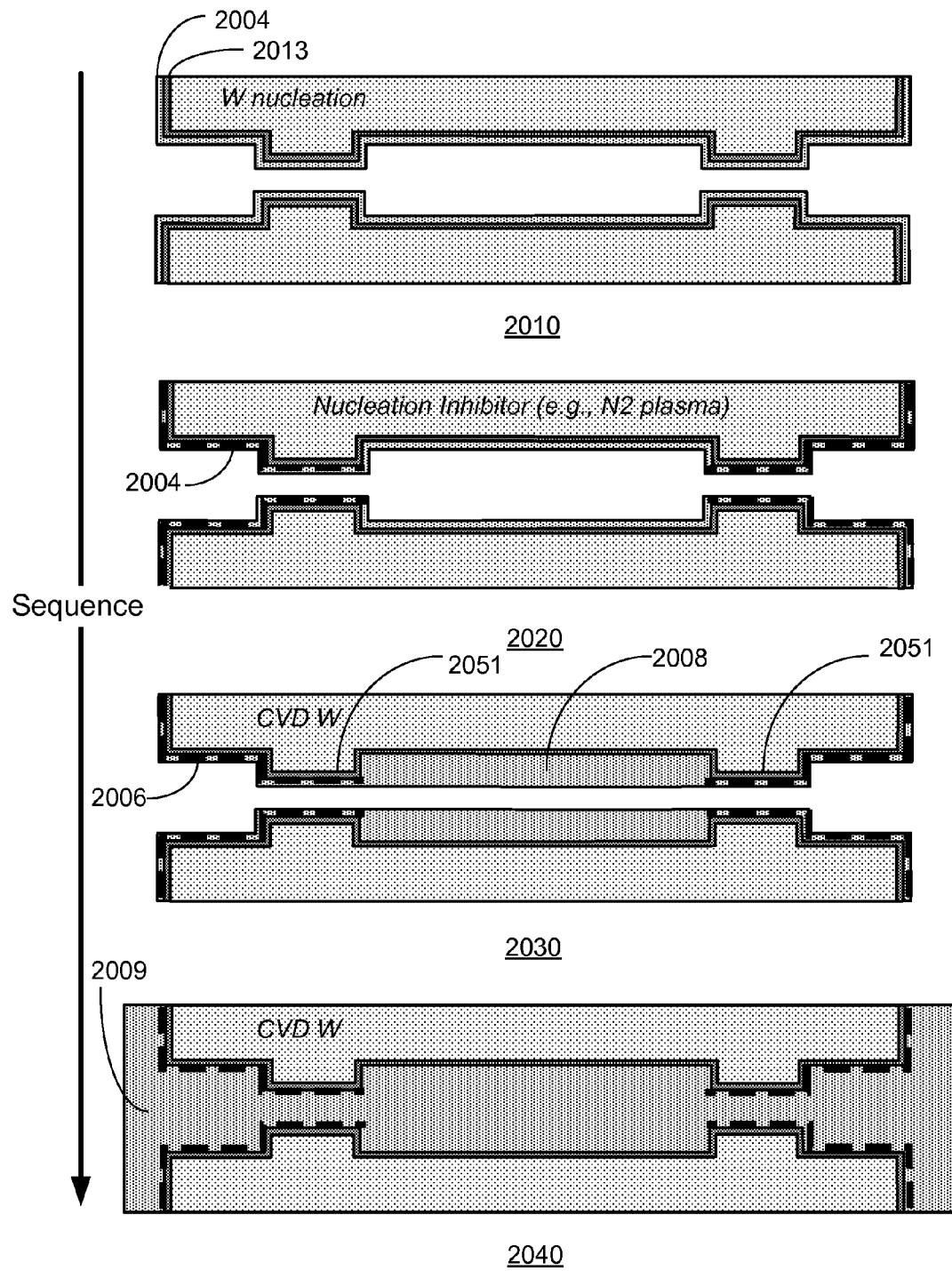

FIG. 20 shows a sequence described in U.S. patent application Ser. No. 13/774,350, incorporate by reference herein, in which non-conformal selective inhibition is used to fill in the interior of the feature before pinch off. The selective inhibition technique discussed may be used with one or more of the techniques described herein. In FIG. 20, a tungsten nucleation layer 2004 is conformally deposited on an under-layer 2013 at 2010. A PNL process as described above can be used. Note that in some implementations, this operation of depositing a conformal nucleation layer may be omitted. Next, the feature is exposed to an inhibition chemistry to selectively inhibit portions 2006 at 2020. In this example, the portions 2008 through pillar constrictions 2051 are selectively inhibited Inhibition can involve for example, exposure to a direct (in-situ) plasma generated from a gas such as $N_2$, $H_2$, forming gas, $NH_3$, $O_2$, $CH_4$, etc. Other methods of exposing the feature to inhibition species are described further below. Next, a CVD process is performed to selectively deposit tungsten in accordance with the inhibition profile: bulk tungsten 2008 is preferentially deposited on the non-inhibited portions of the nucleation layer 2004, such that hard-to-fill regions behind constrictions are filled, at 2030. The remainder of the feature is then filled with bulk tungsten 2009 at 2040. The same CVD process used to selectively deposit tungsten may be used to remainder of the feature, or a different CVD process using a different chemistry or process conditions and/or performed after a nucleation layer is deposited may be used.

Figure 21:
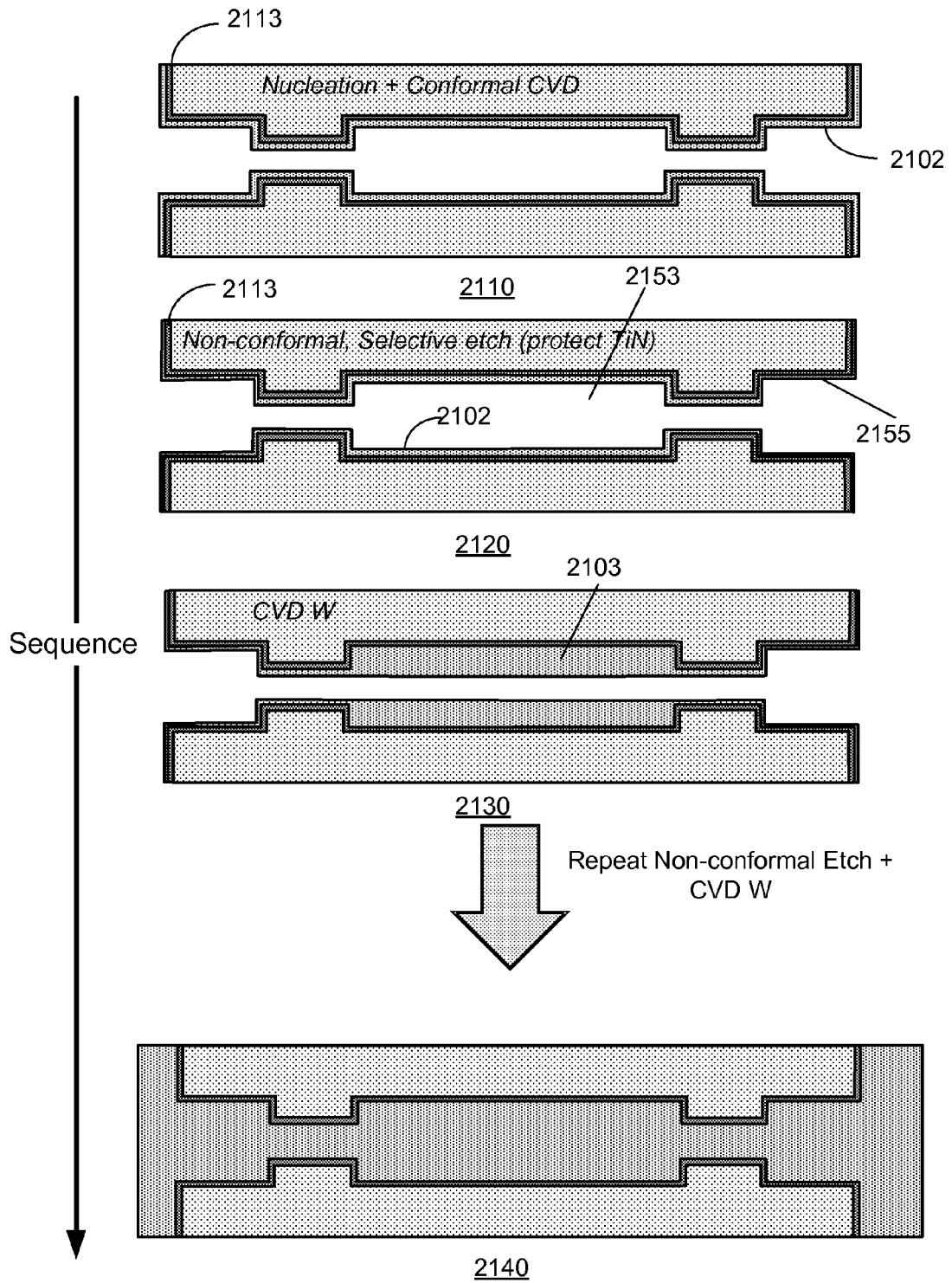

According to various implementations, any of the above examples may employ conformal or non-conformal etches to tailor feature fill according to various implementations. FIG. 21 shows an example of feature fill using a non-conformal etch. In the example of FIG. 21, PNL nucleation plus CVD W can be used to deposit a thin conformal layer of tungsten 2102 in the feature at 2110. This is followed by a non-conformal etch, with high selectivity to protect the under-layer 2113, at 2120. For example, a non-conformal etch having high W:TiN selectivity as described with reference to FIG. 9B may be performed for TiN under-layers. This leaves tungsten layer 2002 in the interior 2153 of the feature, and removes it near the feature ends 2155. CVD W deposition of another thin layer of tungsten 2103 at 2130 is followed by another non-conformal, W-selective etch. These dep-etch-dep operations can be repeated to fill the feature at 2140. According to various implementations, each subsequent deposition operation may or may not include deposition of a nucleation layer for conformal or selective deposition. In some implementations, nucleation delay (passivation), e.g., at high source power, can be used during CVD W to inhibit growth near the opening.

Figure 22:
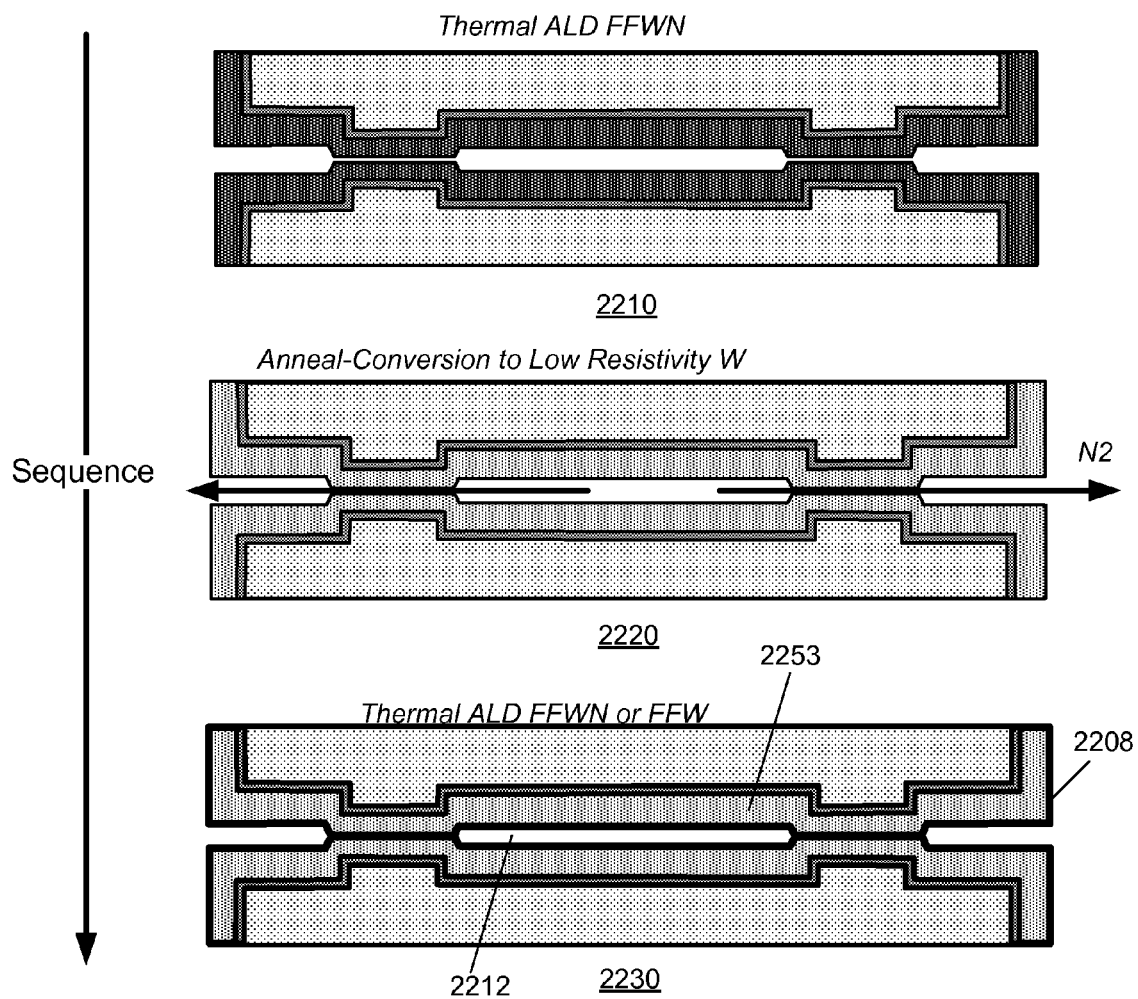

In some implementations, fluorine-free tungsten and tungsten nitride films may be used to reduce fluorine-based processing and fluorine-containing byproducts in tungsten feature fill. FIG. 22 shows an example of sequence in which a thermal ALD fluorine-free tungsten nitride (FFWN) film may be converted to fluorine free tungsten (FFW) in filling a feature. The sequence begins at 2210 with deposition of a FFWN layer by a thermal ALD or PNL, as described above with reference to FIGS. 13C and 13D. The FFWN layer is deposited without completely pinching off the interior of the structure to allow nitrogen gas to escape. The FFWN is then converted to FFW during a thermal anneal, with $N_2$ gas leaving at 2220. In the depicted example, a FFWN or FFW cap layer 2208 is then deposited to close of the feature interior 2253. Depending on the thickness of the cap layer 2208, a thermal anneal may be performed to remove convert a FFWN cap layer 2208 to FFW. In some implementations, the cap layer 2208 may be thin enough that a negligible amount of nitrogen is present in the tungsten-filled feature and no anneal is performed. It should be noted that in some implementations, cap layer 2208 may close off the interior 2253 prior to deposition of the layer within the feature. Unlike the sequence described below with reference to FIG. 23, this is acceptable from a fluorine management perspective as no fluorine is used in the process. While the sequence shown in FIG. 22 leaves a void 2212, in alternate implementations, one or more techniques described above for reducing or eliminating voids may be employed.

Figure 23:
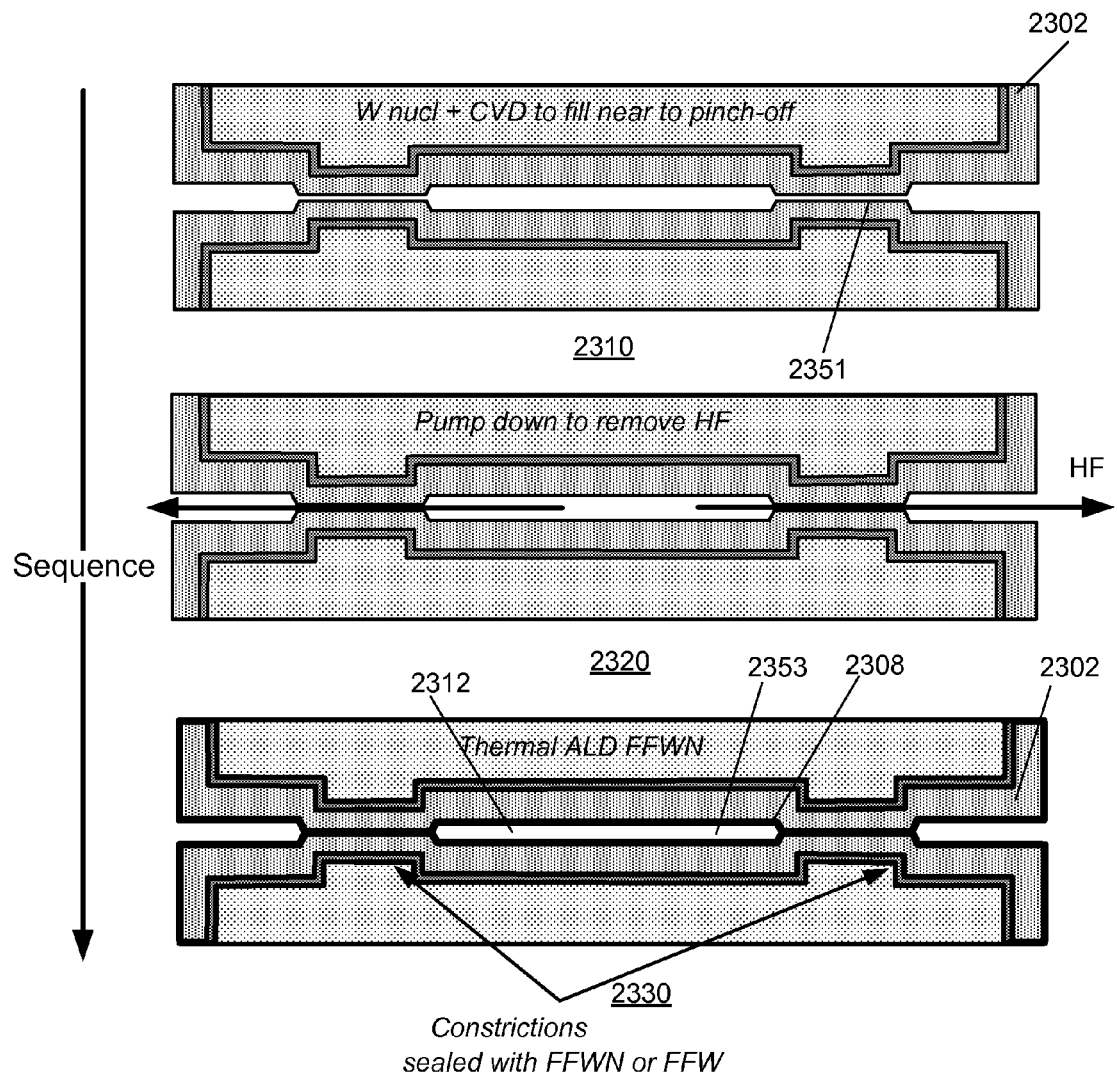

FIG. 23 shows an example of sequence in which a thermal ALD fluorine-free tungsten nitride (FFWN) or fluorine-free tungsten (FFW) film may be used in tungsten feature fill to seal a layer deposited using fluorine. The sequence begins at 2310 with conformal deposition of a tungsten layer 2302 using a fluorine- (or other halogen)-containing compound. Conformal deposition may involve for example, deposition of a tungsten nucleation layer followed by bulk deposition using tungsten hexafluoride or tungsten hexachloride. Deposition is halted prior to pinch, in some implementations, leaving at least 5-10 nm between the approaching sidewalls at the pinch point 2351. Next, at 2320, a pump down operation is performed to remove all of the fluorine-containing byproduct such as HF. A FFWN or FFW layer 2308 is then deposited to cover the tungsten layer 2302. In some implementations, this includes depositing the layer 2308 within the interior of the feature 2353 to help prevent the release of any fluorine present in the tungsten layer 2302. While the sequence shown in FIG. 23 leaves a void 2312, in alternate implementations, one or more techniques described above for reducing or eliminating voids may be employed.

According to various implementations, the etches described in the process sequences above can be conformal, mildly non-conformal or highly non-conformal as described above with respect to FIGS. 9A and 9B, according to the desired etch profile. For example, etches used to open up a pinch-off feature may use process conditions that produce conformal etches.

Nucleation Layer Deposition

In some implementations, the methods described herein involve deposition of a tungsten nucleation layer prior to deposition of a bulk layer. A nucleation layer is typically a thin conformal layer that facilitates subsequent deposition of bulk tungsten-containing material thereon. According to various implementations, a nucleation layer may be deposited prior to any fill of the feature and/or at subsequent points during fill of the feature. For example, in some implementations, a nucleation layer may be deposited following etch of tungsten in a feature.

In certain implementations, the nucleation layer is deposited using a pulsed nucleation layer (PNL) technique. In a PNL technique, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. Pat. Nos. 6,635,965; 7,005,372; 7,141,494; 7,589,017, 7,772,114, 7,955,972 and 8,058,170, and U.S. Patent Publication No. 2010-0267235, all of which are incorporated by reference herein in their entireties. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

While examples of PNL deposition are provided above, the methods described herein are not limited to a particular method of tungsten nucleation layer deposition, but include deposition of bulk tungsten film on tungsten nucleation layers formed by any method including PNL, ALD, CVD, and physical vapor deposition (PVD). Moreover, in certain implementations, bulk tungsten may be deposited directly in a feature without use of a nucleation layer. For example, in some implementations, the feature surface and/or an already-deposited under-layer supports bulk tungsten deposition. In some implementations, a bulk tungsten deposition process that does not use a nucleation layer may be performed. U.S. patent application Ser. No. 13/560,688, filed Jul. 27, 2012, incorporated by reference herein, describes deposition of a tungsten bulk layer without a nucleation layer, for example.

In various implementations, tungsten nucleation layer deposition can involve exposure to a tungsten-containing precursor such as tungsten hexafluoride ($WF_6$), tungsten hexachloride ($WCl_6$), and tungsten hexacarbonyl ($W(CO)_6$). In certain implementations, the tungsten-containing precursor is a halogen-containing compound, such as $WF_6$. Organometallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten) may also be used.

Examples of reducing agents can include boron-containing reducing agents including diborane ($B_2H_6$) and other boranes, silicon-containing reducing agents including silane ($SiH_4$) and other silanes, hydrazines, and germanes. In some implementations, pulses of tungsten-containing precursors can be alternated with pulses of one or more reducing agents, e.g., S/W/S/W/B/W, etc., W represents a tungsten-containing precursor, S represents a silicon-containing precursor, and B represents a boron-containing precursor. In some implementations, a separate reducing agent may not be used, e.g., a tungsten-containing precursor may undergo thermal or plasma-assisted decomposition.

According to various implementations, hydrogen may or may not be run in the background. Further, in some implementations, deposition of a tungsten nucleation layer may be followed by one or more treatment operations prior to tungsten bulk deposition. Treating a deposited tungsten nucleation layer to lower resistivity is described for example in U.S. Pat. Nos. 7,772,114 and 8,058,170 and U.S. Patent Publication No. 2010-0267235, incorporated by reference herein.

Bulk Deposition

In many implementations, tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain implementations, the tungsten-containing precursor is a halogen-containing compound, such as $WF_6$. In certain implementations, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

Examples of temperatures may range from 200° C. to 500° C. According to various implementations, any of the CVD W operations described herein can employ a low temperature CVD W fill, e.g., at about 250° C.-350° C. or about 300° C.

Deposition may proceed according to various implementations until a certain feature profile is achieved and/or a certain amount of tungsten is deposited. In some implementations, the deposition time and other relevant parameters may be determined by modeling and/or trial and error. For example, for an initial deposition for an inside out fill process in which tungsten can be conformally deposited in a feature until pinch-off, it may be straightforward to determine based on the feature dimensions the tungsten thickness and corresponding deposition time that will achieve pinch-off. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten. In some implementations, the films may be a mixture of metallic or elemental tungsten (W) and other tungsten-containing compounds such as tungsten carbide (WC), tungsten nitride (WN), etc.

CVD and ALD deposition of these materials can include using any appropriate precursors. For example, CVD and ALD deposition of tungsten nitride can include using halogen-containing and halogen-free tungsten-containing and nitrogen-containing compounds as described further below. CVD and ALD deposition of titanium-containing layers can include using precursors containing titanium with examples including tetrakis(dimethylamino)titanium (TDMAT) and titanium chloride ($TiCl_4$), and if appropriate, one or more co-reactants. CVD and ALD deposition of tantalum-containing layers can include using precursors such as pentakis-dimethylamino tantalum (PDMAT) and $TaF_5$ and, if appropriate, one or more co-reactants. CVD and ALD deposition of cobalt-containing layers can include using precursors such as Tris(2,2,6,6-tetramethyl-3,5-heptanedionato)cobalt, bis(cyclopentadienyl)cobalt, and dicobalt hexacarbonyl butylacetylene, and one or more co-reactants. CVD and ALD deposition of nickel-containing layers can include using precursors such as cyclopentadienylallylnickel (CpAllylNi) and $MeCp_2Ni$. Examples of co-reactants can include $N_2$, $NH_3$, $N_2H_4$, $N_2H_6$, $SiH_4$, $Si_3H_6$, $B_2H_6$, $H_2$, and $AlCl_3$.

Tungsten Etch

Etching tungsten can be performed by exposing the tungsten to one or more etchant species that can react with tungsten. Examples of etchant species include halogen species and halogen-containing species. Example of initial etchant materials that can be used for removal of tungsten-containing materials include nitrogen tri-fluoride ($NF_3$), tetra-fluoromethane ($CF_4$), tetrafluoroethylene ($C_2F_4$), hexafluoroethane ($C_2F_6$), and octafluoropropane ($C_3F_8$), tri-fluoro-methane ($CHF_3$), chlorotrifluoromethane ($CF_3Cl$), sulfur hexafluoride ($SF_6$), and molecular fluorine ($F_2$). In some implementations, the species can be activated and include radicals and/or ions. For example, an initial etchant material may be flowed through a remote plasma generator and/or subjected to an in-situ plasma. In some implementations, the tungsten may be exposed to non-plasma etchant vapor.

In addition to the examples given above, any known etchant chemistry may be used for etching non-tungsten-containing films as well as tungsten-containing films. For example, fluorine-containing compounds such as $NF_3$, may be used for titanium-containing compounds such as TiN and TiC. Chlorine-containing compounds such as $Cl_2$ and $BCl_3$ may be used in some implementations, for example to etch TiAl, TiAlN, nickel-containing compounds and cobalt-containing compounds. Further, although etching below refers chiefly to plasma and/or non-plasma vapor phase etching, in some implementations, the methods may also be implemented with wet etching techniques.

In some implementations, a remotely generated plasma may be used. The initial etchant material and, in certain implementations, inert gases, such as argon, helium and others, can be supplied to any suitable remote plasma generator. For example, remote plasma units, such as ASTRON® i Type AX7670, ASTRON® e Type AX7680, ASTRON® ex Type AX7685, ASTRON® hf-s Type AX7645, all available from MKS Instruments of Andover, Mass., may be used. A remote plasma unit is typically a self-contained device generating weakly ionized plasma using the supplied etchant. In some implementations, a high power radio frequency (RF) generator provides energy to the electrons in the plasma. This energy is then transferred to the neutral etchant molecules leading to temperature on the order of 2000K causing thermal dissociation of these molecules. A remote plasma unit may dissociate more than 60% of incoming etchant molecules because of its high RF energy and special channel geometry causing the etchant to adsorb most of this energy.

In some implementations, the activated species from the remote plasma unit delivered to the chamber in which the etch is performed are radicals and include substantially no ionic species. One of ordinary skill in the art will understand that there may be some small number of ionic species that do not contribute to the etch. This amount may be small enough to be undetectable. In some implementations, the activated species from the remote plasma unit delivered to the chamber may include a substantial number of ionic species in addition to radical species.

In some implementations, an etching operation may use a plasma generated in situ in the chamber housing the substrate such that the tungsten in exposed to a direct plasma, in addition to or instead of a remotely generated plasma. In some implementations, a radio frequency (RF) plasma generator may be used to generate a plasma between two electrodes the chamber. Examples of electrodes include a shower head and a pedestal, for example. In one example, a High Frequency (HF) generator capable of providing between about 0 W and 10,000 W at frequencies between about 1 MHz and 100 MHz may be used. In a more specific implementation, the HF generator may deliver between about 0 W to 5,000 W at about 13.56 MHz. In some implementations, a Low Frequency (LF) generator capable of providing between about 0 and 10,000 W at frequencies between about 100 kHz and 2 MHz, or between about 100 kHz and 1 MHz, e.g. 400 kHz may be used.

The plasma generator may be a capacitively coupled plasma (CCP) generator, an inductively coupled plasma (ICP) generator, a transformer coupled plasma (TCP) generator, an electron cyclotron resonance (ECR) generator, or a helicon plasma generator. In addition to RF sources, microwave sources may be used.

According to various implementations, some or all etch operations can be performed in the same chamber in which other operations including deposition and/or treatment operations are performed, or in a dedicated etch chamber. If a dedicated etch chamber is used, it may be connected to the same vacuum environment of one or more other processing chamber, or be part of a separate vacuum environment. For example, TCP etch module such as the Kiyo® conductor etch module available from Lam Research Corporation may be used in some implementations. Example etchants that may be used with such a module include $NF_3$, $CF_4$, $SF_6$, $CH_3F$, $CH_2F_2$, and $CF_4$. Example operating pressures can range from 30 mTorr to 100 mTorr. Example temperatures can range from 30° C. to 120° C.

In various implementations, etching is performed until a certain characteristic of the deposited tungsten is removed or a certain profile is achieved. For example, with inside-out fill techniques described above, the etch may proceed until the pinched-off tungsten is removed, or until a seam is removed. In some implementations, the etch endpoint for particular etch process parameters may be determined by modeling and/or trial and error for a particular feature geometry and the profile and amount of deposited tungsten being etched. In some implementations, a process chamber may be equipped with various sensors to perform in-situ metrology measurements to identify the extent of removal. Examples of in-situ metrology include optical microscopy and XRF for determining thickness of films. Further, infrared (IR) spectroscopy may be used to detect amounts of tungsten fluoride (WFx) or other byproducts generated during etching. In some implementations, an under-layer may be used as an etch-stop layer. Optical emission spectroscopy (OES) may also be used to monitor the etch. According to various implementations, an etch of tungsten may be more or less preferential (or non-preferential) to an under-layer. For example, an etch can be preferential to W with, for example, a Ti or TiN underlayer acting as an etch stop. In some implementations, the etch can etch W and Ti or TiN with an underlying dielectric acting as an etch stop. Methods of tuning etch preferentially with respect to an under-layer are described above.

Also, according to various implementations, the conformality of an etching operation may be modulated. A conformal etch is an etch in which material is removed uniformly through-out the feature. Methods of modulating etch conformality are described above. In some implementations, modulating etch conformality can include operating or not operating in a mass transport limited regime. In such a regime, the removal rate inside the feature is limited by amounts of and/or relative compositions of different etching material components (e.g., an initial etchant material, activated etchant species, and recombined etchant species) that diffuse into the feature. In certain examples, etching rates depend on various etchant components' concentrations at different locations inside the feature. It should be noted that the terms "etching" and "removal" are used interchangeably in this document.

As described in U.S. patent application Ser. No. 13/016, 656, incorporated by reference herein, mass transport limiting conditions may be characterized, in part, by overall etchant concentration variations. In certain embodiments, this concentration is less inside the feature than near its opening resulting in a higher etching rate near the opening than inside. This in turn leads to selective removal. Mass transport limiting process conditions may be achieved by supplying limited amounts of etchant into the processing chamber (e.g., use low etchant flow rates relative to the cavity profile and dimensions), while maintaining relative high etching rates in order to consume some etchant as it diffuses into the feature. In certain embodiment, a concentration gradient is substantial, which may be caused relatively high etching kinetics and relative low etchant supply. In certain embodiments, an etching rate near the opening may also be mass limited, but this condition is not required to achieve selective removal.

In addition to the overall etchant concentration variations inside high aspect ratio features, etching conformality may be influenced by relative concentrations of different etchant components throughout the feature. These relative concentrations in turn depend by relative dynamics of dissociation and recombination processes of the etching species. An initial etchant material is typically passed through a remote plasma generator and/or subjected to an in-situ plasma in order to generate activated etchant species (e.g., fluorine atoms, radicals). However, activated specifies tend to recombine into less active recombined etching species (e.g., fluorine molecules) and/or react with tungsten-containing materials along their diffusion paths. As such, different parts of the deposited tungsten-containing layer may be exposed to different concentrations of different etchant materials, e.g., an initial etchant, activated etchant species, and recombined etchant species. This provides additional opportunities for controlling etching conformality.

For example, activated fluorine species are generally more reactive with tungsten-containing materials than initial etching materials and recombined etching materials. Furthermore, the activated fluorine species may be generally less sensitive to temperature variations than the recombined fluorine species. Therefore, in some implementations, process conditions may be controlled in such a way that removal is predominantly attributed to activated fluorine species, predominantly attributed to recombined species, or includes both fluorine and recombined species. Furthermore, specific process conditions may result in activated fluorine species being present at higher concentrations near features' openings than inside the features. For example, some activated species may be consumed (e.g., react with deposited materials and/or adsorbed on its surface) and/or recombined while diffusing deeper into the features, especially in small high aspect ratio features. It should be noted that recombination of activated species also occurs outside of high aspect ratio features, e.g., in the showerhead of the processing chamber, and depends on a chamber pressure. Therefore, a chamber pressure may be controlled to adjust concentrations of activated etching species at various points of the chamber and features.

Flow rates of the etchant typically depend on a size of the chamber, etching rates, etching uniformity, and other parameters. For example, a flow rate can be selected in such a way that more tungsten-containing material is removed near the opening than inside the feature or that tungsten-containing material is removed uniformly through a feature or portion of a feature. For example, a flow rate for a 195-liter chamber per station may be between about 25 sccm and 10,000 sccm or, in more specific embodiments, between about 50 sccm and 1,000 sccm. In certain embodiments, the flow rate is less than about 2,000 sccm, less than about 1,000 sccm, or more specifically less than about 500 sccm. It should be noted that these values are presented for one individual station configured for processing a 300-mm wafer substrate. These flow rates can be scaled up or down depending on a substrate size, a number of stations in the apparatus (e.g., quadruple for a four station apparatus), a processing chamber volume, and other factors.

A temperature for the substrate can be selected in such a way to not only induce a chemical reaction between the deposited layer and various etchant species but also to control the rate of the reaction between the two. For example, a temperature may be selected to have high removal rates such that more material is removed near the opening than inside the feature or low removal rates such that material is removed from within the feature. Furthermore, a temperature may be also selected to control recombination of activated species (e.g., recombination of atomic fluorine into molecular fluorine) and/or control which species (e.g., activated or recombined species) contribute predominantly to etching. The substrate temperature may be selected based on etchant chemical compositions, a desired etching rate, desired concentration distributions of activated species, desired contributions to selective removal by different species, and other material and process parameters. In certain embodiments, a substrate is maintained at less than about 300° C., or more particularly at less than about 250° C., or less than about 150° C., or even less than about 100° C. In other embodiments, a substrate is heated to between about 300° C. and 450° C. or, in more specific embodiments, to between about 350° C. and 400° C. While these temperature ranges are provide for F-based etches, other temperature ranges may be used for different types of etchants.

Activation energy of activated fluorine species is much less than that of the recombined fluorine. Therefore, lowering substrate temperatures may result in more removal contribution from activated species. At certain temperatures (and other process conditions, e.g., flow rates and chamber pressures), a relative removal contribution of the activated species may exceed that of the recombined species.

Distribution of a material within a feature may also be characterized by its step coverage. For the purposes of this description, "step coverage" is defined as a ratio of two thicknesses, i.e., the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

As discussed above, etch conformality may be modulated such than an etched layer has a target step coverage depending on the particular architecture of the feature. In certain embodiments, a targeted step coverage of the etched layer is at least about 60%, 75%, 100%, or super-conformal (over 100%), such as 125%. In certain embodiments, a step coverage below about 50%, 25% or less may be targeted.

Selective Inhibition of Tungsten Nucleation

As described in U.S. patent application Ser. No. 13/774, 350, incorporated by reference herein, selective inhibition can involve exposure to activated species that passivate the feature surfaces. For example, in certain implementations, a tungsten (W) surface can be passivated by exposure to a nitrogen-based or hydrogen-based plasma. In some implementations, inhibition can involve a chemical reaction between activated species and the feature surface to form a thin layer of a compound material such as tungsten nitride (WN) or tungsten carbide (WC). In some implementations, inhibition can involve a surface effect such as adsorption that passivates the surface without forming a layer of a compound material. Activated species may be formed by any appropriate method including by plasma generation and/or exposure to ultraviolet (UV) radiation. In some implementations, the substrate including the feature is exposed to a plasma generated from one or more gases fed into the chamber in which the substrate sits. In some implementations, one or more gases may be fed into a remote plasma generator, with activated species formed in the remote plasma generator fed into a chamber in which the substrate sits. The plasma source can be any type of source including radio frequency (RF) plasma source or microwave source. The plasma can be inductively and/or capacitively-coupled. Activated species can include atomic species, radical species, and ionic species. In certain implementations, exposure to a remotely-generated plasma includes exposure to radical and atomized species, with substantially no ionic species present in the plasma such that the inhibition process is not ion-mediated. In other implementations, ion species may be present in a remotely-generated plasma. In certain implementations, exposure to an in-situ plasma involves ion-mediated inhibition.

For tungsten (W) surfaces, exposure to nitrogen-based and/or hydrogen-based plasmas inhibits subsequent tungsten deposition on the W surfaces. Other chemistries that may be used for inhibition of tungsten surfaces include oxygen-based plasmas and hydrocarbon-based plasmas. For example, molecular oxygen or methane may be introduced to a plasma generator. As used herein, a nitrogen-based plasma is a plasma in which the main non-inert component is nitrogen. An inert component such as argon, xenon, or krypton may be used as a carrier gas. In some implementations, no other non-inert components are present in the gas from which the plasma is generated except in trace amounts. In some implementations, inhibition chemistries may be nitrogen-containing, hydrogen-containing, oxygen-containing, and/or carbon-containing, with one or more additional reactive species present in the plasma.

Figure 11:
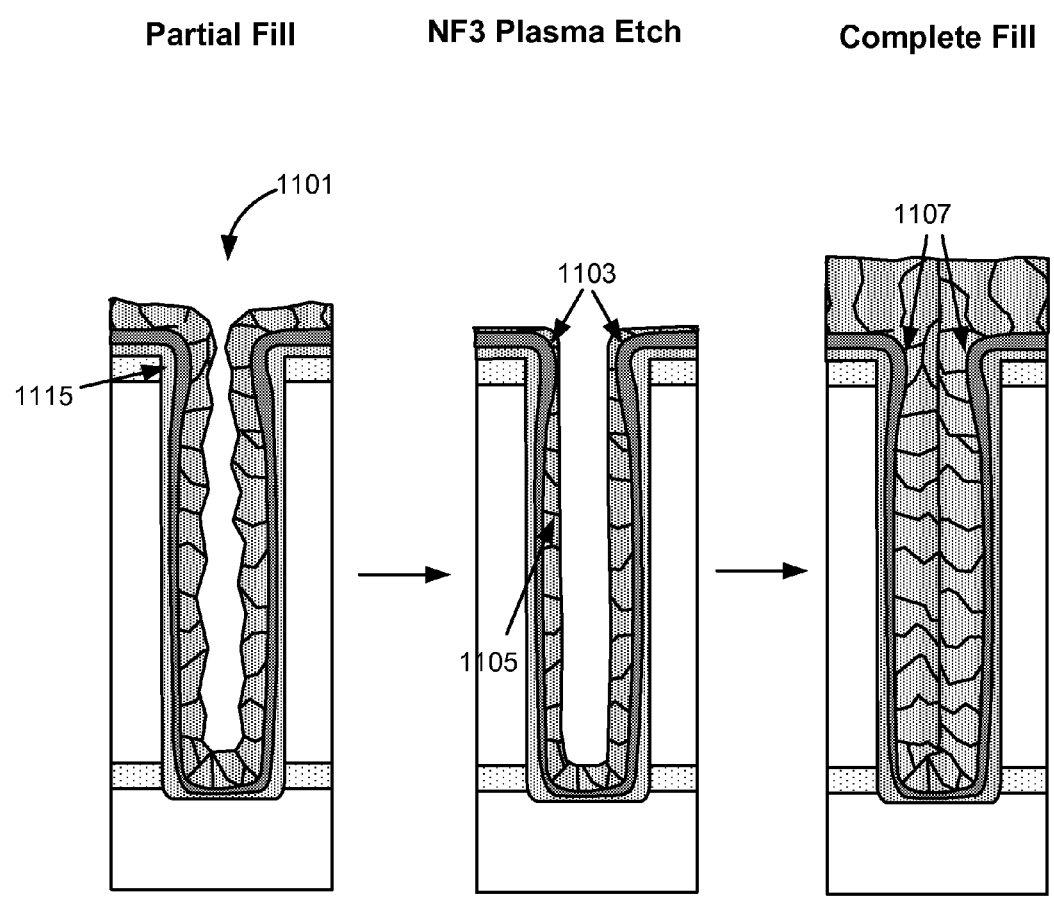
FIG. 11 is a schematic representation of a feature at various stages of feature fill employing selective inhibition of tungsten nucleation.

In U.S. patent application Ser. No. 13/351,970, for example, nitridation of a feature surface to selectively passivate the surface is described. Using a $NF_3$ plasma, for example, where activated fluorine radicals react with and remove tungsten at the feature opening, the nitrogen generated from the $NF_3$ plasma can cause nitridation of the tungsten surface forming tungsten nitride. Subsequent deposition of tungsten on a nitrided surface is significantly delayed, compared to on a regular bulk tungsten film. A longer delay allows the feature to stay open for longer before pinching off, and promoting fill improvement because more $WF_6$ molecules can reach the inside of the feature and deposit tungsten. This is illustrated in FIG. 11, which shows a partially filled feature 1101 including an overhang 1115. During an $NF_3$ plasma etch, more nitrogen species (e.g., nitrogen radicals) are present at 1103 near the top of the feature, than at 1105, further within the feature. As a result W—N forms at the top of the feature, but in the feature interior. During complete fill, tungsten deposits more readily on the tungsten (W) surface within the feature than on the W—N surface at the top of the feature. This allows the feature 1101 to stay open longer at 1107, promoting fill improvement.

In addition to $NF_3$, fluorocarbons such as $CF_4$ or $C_2F_8$ may be used. However, in certain implementations, the inhibition species are fluorine-free to prevent etching during selective inhibition.

In certain implementations, UV radiation and/or thermal energy may be used instead of or in addition to plasma generators to provide activated species. In addition to tungsten surfaces, nucleation may be inhibited on liner/barrier layers surfaces such as TiN and/or WN surfaces. Any chemistry that passivates these surfaces may be used. For TiN and WN, this can include exposure to nitrogen-based or nitrogen-containing chemistries. In certain implementations, the chemistries described above for W may also be employed for TiN, WN, or other liner layer surfaces.

Tuning an inhibition profile can involve appropriately controlling an inhibition chemistry, substrate bias power, plasma power, process pressure, exposure time, and other process parameters. For in situ plasma processes (or other processes in which ionic species are present), a bias can be applied to the substrate. Substrate bias can, in some implementations, significantly affect an inhibition profile, with increasing bias power resulting in active species deeper within the feature. For 3-D structures in which selectivity is desired in a lateral direction (tungsten deposition preferred in the interior of the structure), but not in a vertical direction, increased bias power can be used to promote top-to-bottom deposition uniformity.

While bias power can be used in certain implementations as the primary or only knob to tune an inhibition profile for ionic species, in certain situations, other performing selective inhibition uses other parameters in addition to or instead of bias power. These include remotely generated non-ionic plasma processes and non-plasma processes. Also, in many systems, a substrate bias can be easily applied to tune selectivity in vertical but not lateral direction. Accordingly, for 3-D structures in which lateral selectivity is desired, parameters other than bias may be controlled, as described above.

Figure 12:
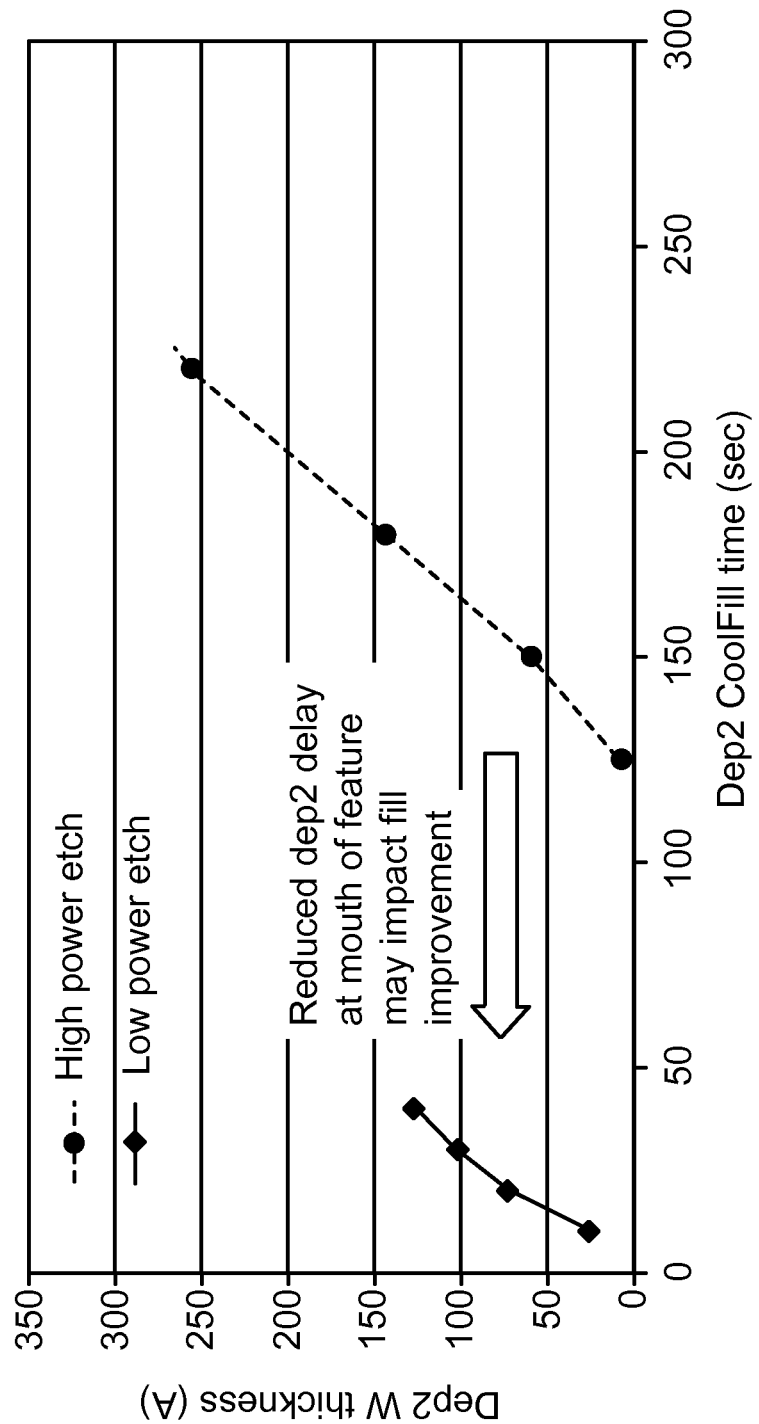
FIG. 12 is a graph showing time bulk layer growth delay for films deposited after high and low power etches.

Inhibition chemistry can also be used to tune an inhibition profile, with different ratios of active inhibiting species used. For example, for inhibition of W surfaces, nitrogen may have a stronger inhibiting effect than hydrogen; adjusting the ratio of $N_2$ and $H_2$ gas in a forming gas-based plasma can be used to tune a profile. The plasma power may also be used to tune an inhibition profile, with different ratios of active species tuned by plasma power. For example, in certain implementations described herein, nitrogen radical formation and resultant W—N formation and the related passivation effect can be modulated by varying the plasma power. Varying plasma power can also allow control of the resistivity of the final W film. FIG. 12 is a graph demonstrating the ability to control subsequent deposition delay time by varying the etch power. It can be understood that any power between "high" and "low" can be used to control the delay as desired. In FIG. 12, a remotely-generated plasma etch using $NF_3$ at low power resulted in reduced nucleation delay (faster nucleation) in a subsequent deposition, than a higher power remotely-generated plasma etch. This may be due to the presence of more nitrogen species during the high plasma power etch, increasing the formation of WN and the subsequent delay.

Process pressure can be used to tune a profile, as pressure can cause more recombination (deactivating active species) as well as pushing active species further into a feature. Process time may also be used to tune inhibition profiles, with increasing treatment time causing inhibition deeper into a feature.

In some implementations, selective inhibition can be achieved by in a mass transport limited regime. In this regime, the inhibition rate inside the feature is limited by amounts of and/or relative compositions of different inhibition material components (e.g., an initial inhibition species, activated inhibition species, and recombined inhibition species) that diffuse into the feature. In certain examples, inhibition rates depend on various components' concentrations at different locations inside the feature.

Mass transport limiting conditions may be characterized, in part, by overall inhibition concentration variations. In certain implementations, a concentration is less inside the feature than near its opening resulting in a higher inhibition rate near the opening than inside. This in turn leads to selective inhibition near the feature opening. Mass transport limiting process conditions may be achieved by supplying limited amounts of inhibition species into the processing chamber (e.g., use low inhibition gas flow rates relative to the cavity profile and dimensions), while maintaining relative high inhibition rates near the feature opening to consume some activated species as they diffuse into the feature. In certain implementation, a concentration gradient is substantial, which may be caused relatively high inhibition kinetics and relatively low inhibition supply. In certain implementations, an inhibition rate near the opening may also be mass transport limited, though this condition is not required to achieve selective inhibition.

In addition to the overall inhibition concentration variations inside features, selective inhibition may be influenced by relative concentrations of different inhibition species throughout the feature. These relative concentrations in turn can depend on relative dynamics of dissociation and recombination processes of the inhibition species. As described above, an initial inhibition material, such as molecular nitrogen, can be passed through a remote plasma generator and/or subjected to an in-situ plasma to generate activated species (e.g., atomic nitrogen, nitrogen ions). However, activated species may recombine into less active recombined species (e.g., nitrogen molecules) and/or react with W, WN, TiN, or other feature surfaces along their diffusion paths. As such, different parts of the feature may be exposed to different concentrations of different inhibition materials, e.g., an initial inhibition gas, activated inhibition species, and recombined inhibition species. This provides additional opportunities for controlling selective inhibition. For example, activated species are generally more reactive than initial inhibition gases and recombined inhibition species. Furthermore, in some cases, the activated species may be less sensitive to temperature variations than the recombined species. Therefore, process conditions may be controlled in such a way that removal is predominantly attributed to activated species. As noted above, some species may be more reactive than others. Furthermore, specific process conditions may result in activated species being present at higher concentrations near features' openings than inside the features. For example, some activated species may be consumed (e.g., reacted with feature surface materials and/or adsorbed on the surface) and/or recombined while diffusing deeper into the features, especially in small high aspect ratio features. Recombination of activated species can also occur outside of features, e.g., in the showerhead or the processing chamber, and can depends on chamber pressure. Therefore, chamber pressure may be specifically controlled to adjust concentrations of activated species at various points of the chamber and features.

Flow rates of the inhibition gas can depend on a size of the chamber, reaction rates, and other parameters. A flow rate can be selected in such a way that more inhibition material is concentrated near the opening than inside the feature. In certain implementations, these flow rates cause mass-transport limited selective inhibition. For example, a flow rate for a 195-liter chamber per station may be between about 25 sccm and 10,000 sccm or, in more specific implementations, between about 50 sccm and 1,000 sccm. In certain implementations, the flow rate is less than about 2,000 sccm, less than about 1,000 sccm, or more specifically less than about 500 sccm. It should be noted that these values are presented for one individual station configured for processing a 300-mm substrate. These flow rates can be scaled up or down depending on a substrate size, a number of stations in the apparatus (e.g., quadruple for a four station apparatus), a processing chamber volume, and other factors.

In certain implementations, the substrate can be heated up or cooled down before selective inhibition. A predetermined temperature for the substrate can be selected to induce a chemical reaction between the feature surface and inhibition species and/or promote adsorption of the inhibition species, as well as to control the rate of the reaction or adsorption. For example, a temperature may be selected to have high reaction rate such that more inhibition occurs near the opening than inside the feature. Furthermore, a temperature may be also selected to control recombination of activated species (e.g., recombination of atomic nitrogen into molecular nitrogen) and/or control which species (e.g., activated or recombined species) contribute predominantly to inhibition. In certain implementations, a substrate is maintained at less than about 300° C., or more particularly at less than about 250° C., or less than about 150° C., or even less than about 100° C. In other implementations, a substrate is heated to between about 300° C. and 450° C. or, in more specific implementations, to between about 350° C. and 400° C. Other temperature ranges may be used for different types of inhibition chemistries. Exposure time can also be selected to cause selective inhibition. Example exposure times can range from about 10 s to 500 s, depending on desired selectivity and feature depth.

Apparatus

Any suitable chamber may be used to implement this novel method. Examples of deposition apparatuses include various systems, e.g., ALTUS and ALTUS Max, available from Novellus Systems, Inc. of San Jose, Calif., or any of a variety of other commercially available processing systems.

Figure 24:
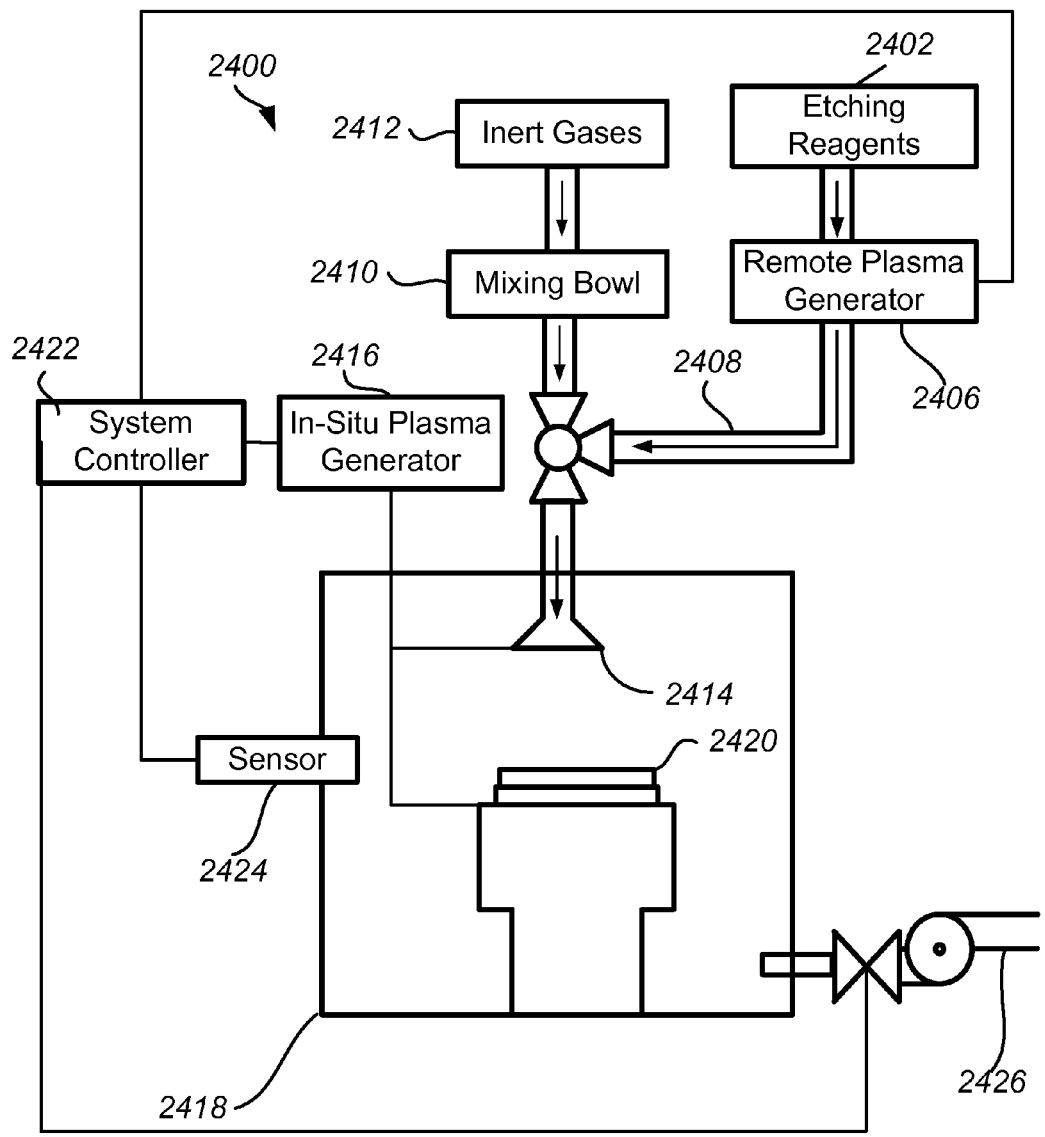
FIGS. 24-25B are schematic diagrams showing examples of apparatus suitable for practicing the methods described herein.

FIG. 24 illustrates a schematic representation of an apparatus 2400 for processing a partially fabricated semiconductor substrate in accordance with certain embodiments. The apparatus 2400 includes a chamber 2418 with a pedestal 2420, a shower head 2414, and an in-situ plasma generator 2416. The apparatus 2400 also includes a system controller 2422 to receive input and/or supply control signals to various devices.

The etchant and, in certain embodiments, inert gases, such as argon, helium and others, are supplied to the remote plasma generator 2406 from a source 2402, which may be a storage tank. Any suitable remote plasma generator may be used for activating the etchant before introducing it into the chamber 2418. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming etchant molecules because of its high RF energy and special channel geometry causing the etchant to adsorb most of this energy.

In certain embodiments, an etchant is flown from the remote plasma generator 2406 through a connecting line 2408 into the chamber 2418, where the mixture is distributed through the shower head 2414. In other embodiments, an etchant is flown into the chamber 2418 directly completely bypassing the remote plasma generator 2406 (e.g., the system 2400 does not include such generator). Alternatively, the remote plasma generator 2406 may be turned off while flowing the etchant into the chamber 2418, for example, because activation of the etchant is not needed.

The shower head 2414 or the pedestal 2420 typically may have an internal plasma generator 2416 attached to it. In one example, the generator 2416 is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 2416 may generate in-situ plasma to enhance removal of the initial tungsten layer. In certain embodiments, the RF generator 2416 is not used during the removal operations of the process.

The chamber 2418 may include a sensor 2424 for sensing various process parameters, such as degree of deposition and etching, concentrations, pressure, temperature, and others. The sensor 2424 may provide information on chamber conditions during the process to the system controller 2422. Examples of the sensor 2424 include mass flow controllers, pressure sensors, thermocouples, and others. The sensor 2424 may also include an infra-red detector or optical detector to monitor presence of gases in the chamber and control measures.

Deposition and selective removal operations generate various volatile species that are evacuated from the chamber 2418. Moreover, processing is performed at certain predetermined pressure levels the chamber 2418. Both of these functions are achieved using a vacuum outlet 2426, which may be a vacuum pump.

In certain embodiments, a system controller 2422 is employed to control process parameters. The system controller 2422 typically includes one or more memory devices and one or more processors. The processor may include a CPU or computer, analog and/or digital input/output connections, stepper motor controller boards, etc. Typically there will be a user interface associated with system controller 2422. The user interface may include a display screen, graphical software displays of the apparatus and/or process conditions, and user input devices such as pointing devices, keyboards, touch screens, microphones, etc.

In certain embodiments, the system controller 2422 controls the substrate temperature, etchant flow rate, power output of the remote plasma generator 2406, pressure inside the chamber 2418 and other process parameters. The system controller 2422 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, etchant flow rates, etc. These parameters are provided to the user in the form of a recipe, and may be entered utilizing the user interface. Signals for monitoring the process may be provided by analog and/or digital input connections of the system controller 2422. The signals for controlling the process are output on the analog and digital output connections of the apparatus 2400.

Multi-Station Apparatus

Figure 25A:
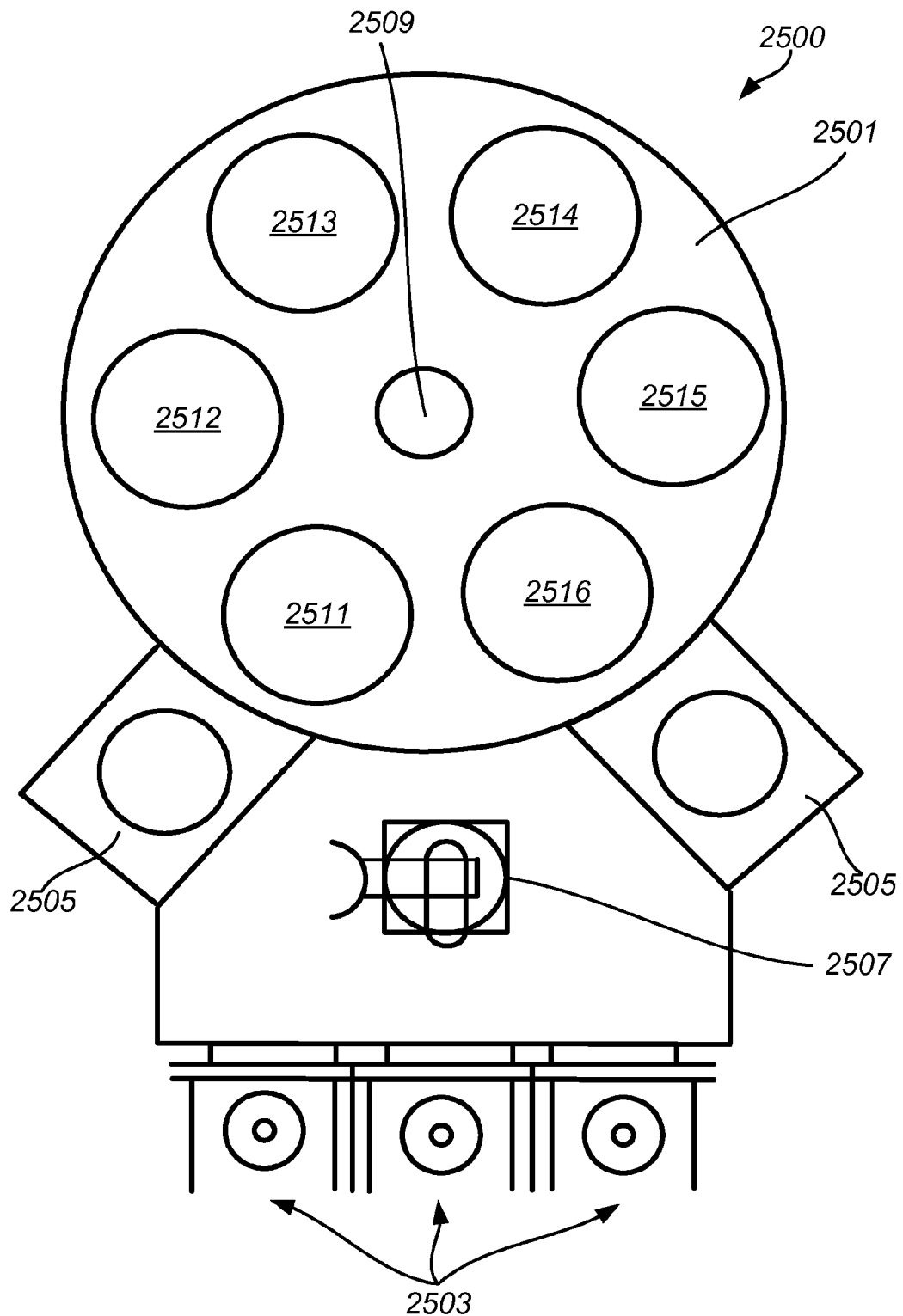

FIG. 25A shows an example of a multi-station apparatus 2500. The apparatus 2500 includes a process chamber 2501 and one or more cassettes 2503 (e.g., Front Opening Unified Pods) for holding substrates to be processed and substrates that have completed processing. The chamber 2501 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 25A illustrates the process chamber 2501 that includes six stations, labeled 2511 through 2516. All stations in the multi-station apparatus 2500 with a single process chamber 2503 are exposed to the same pressure environment. However, each station may have a designated reactant distribution system and local plasma and heating conditions achieved by a dedicated plasma generator and pedestal, such as the ones illustrated in FIG. 24.

A substrate to be processed is loaded from one of the cassettes 2503 through a load-lock 2505 into the station 2511. An external robot 2507 may be used to transfer the substrate from the cassette 2503 and into the load-lock 2505. In the depicted embodiment, there are two separate load locks 2505. These are typically equipped with substrate transferring devices to move substrates from the load-lock 2505 (once the pressure is equilibrated to a level corresponding to the internal environment of the process chamber 2503) into the station 2511 and from the station 2516 back into the load-lock 2505 for removal from the processing chamber 2503. An mechanism 2509 is used to transfer substrates among the processing stations 2511-516 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 24. For example, a station 2511 may receive a substrate from a load-lock and be used to pre-heat the substrate before being further processed. Other stations may be used for filling high aspect ratio features including deposition and etching operations.

After the substrate is heated or otherwise processed at the station 2511, the substrate is moved successively to the processing stations 2512, 2513, 2514, 2515, and 2516, which may or may not be arranged sequentially. The multi-station apparatus 2500 is configured such that all stations are exposed to the same pressure environment. In so doing, the substrates are transferred from the station 2511 to other stations in the chamber 2501 without a need for transfer ports, such as load-locks.

In certain embodiments, one or more stations may be used to fill features with tungsten-containing materials. For example, stations 2512 may be used for an initial deposition operation, station 2513 may be used for a corresponding selective removal operation. In the embodiments where a deposition-removal cycle is repeated, stations 2514 may be used for another deposition operations and station 2515 may be used for another partial removal operation. Section 2516 may be used for the final filling operation. It should be understood that any configurations of station designations to specific processes (heating, filling, and removal) may be used.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective removal of the deposited layer is then performed. The process may continue with one or more deposition-removal cycles and with the final filling operation all performed on the same station. Alternatively, a single station apparatus may be first used to perform only one of the operation in the new method (e.g., depositing, selective removal, final filling) on multiple wafers after which the substrates may be returned back to the same station or moved to a different station (e.g., of a different apparatus) to perform one or more of the remaining operations.

Multi-Chamber Apparatus

Figure 25B:
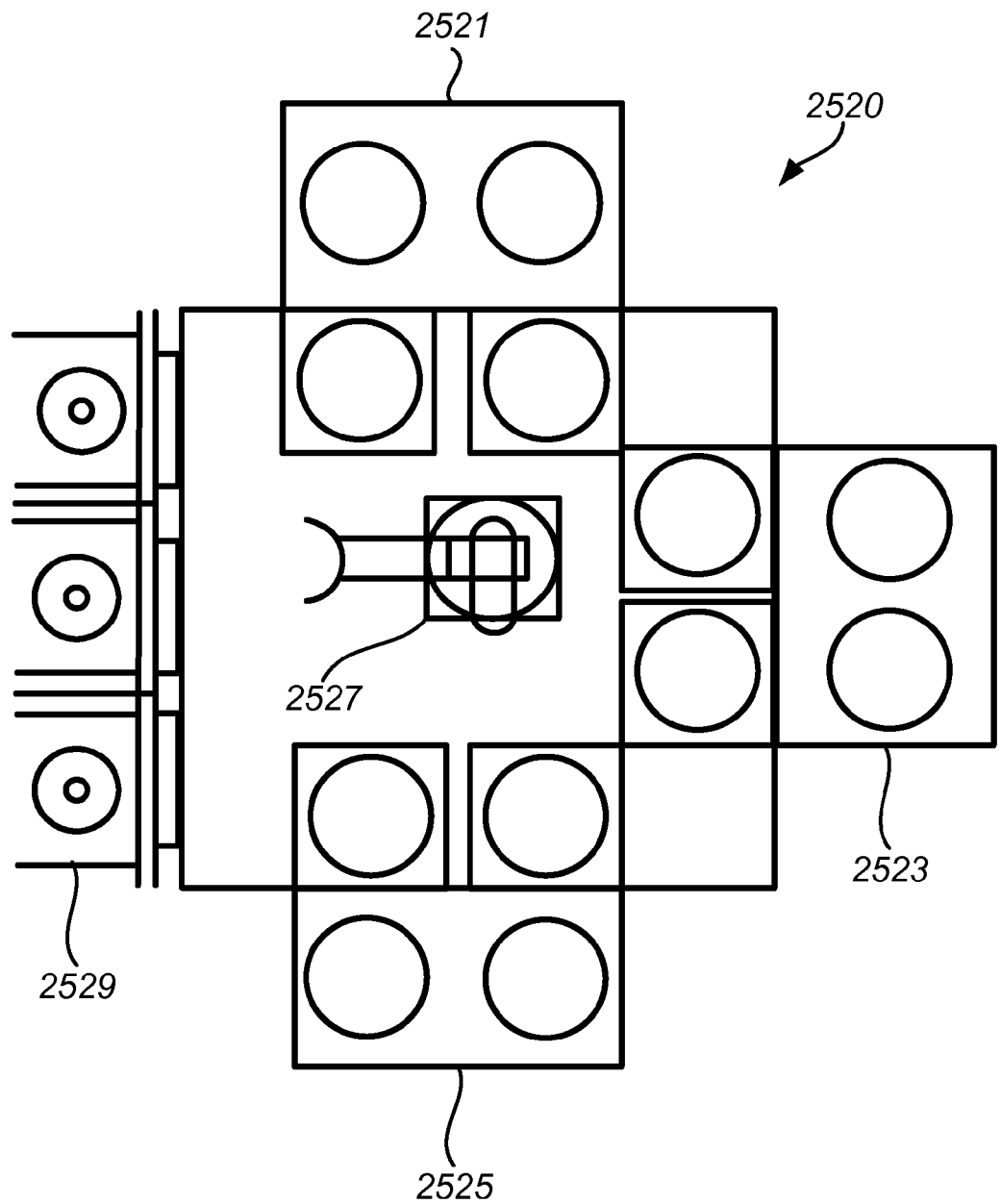

FIG. 25B is a schematic illustration of a multi-chamber apparatus 2520 that may be used in accordance with certain embodiments. As shown, the apparatus 2520 has three separate chambers 2521, 2523, and 2525. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 2521-525 has its own pressure environment, which is not shared between chambers. Each chamber may have one or more corresponding transfer ports (e.g., load-locks). The apparatus may also have a shared substrate handling robot 2527 for transferring substrates between the transfer ports one or more cassettes 2529.

As noted above, separate chambers may be used for depositing tungsten containing materials and selective removal of these deposited materials in later operations. Separating these two operations into different chambers can help to substantially improve processing speeds by maintaining the same environmental conditions in each chamber. In other words, a chamber does not need to change its environment from conditions used for deposition to conditions used for selective removal and back, which may involve different precursors, different temperatures, pressures, and other process parameters. In certain embodiments, it is faster to transfer partially manufactured semiconductor substrates between two or more different chambers than changing environmental conditions of these chambers.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. A method comprising:
   providing a substrate including a feature having sidewalls;
   conformally depositing tungsten in the feature to fill the feature with a first bulk tungsten layer to cover the sidewalls;
   etching a portion of the first bulk tungsten layer to leave an etched tungsten layer in the feature, including removing tungsten from a portion of the sidewalls of the feature to expose the portion of the sidewalls; and
   selectively depositing a second bulk tungsten layer on the etched tungsten layer.

2. The method of claim 1, wherein the conformally depositing tungsten includes allowing a void to be formed within the first bulk tungsten layer.

3. The method of claim 2, wherein etching the portion of the first bulk tungsten layer includes opening the void.

4. The method of claim 1, wherein the conformally depositing tungsten includes allowing a seam running along the axis of the feature in the first bulk tungsten layer to be formed.

5. The method of claim 4, wherein etching the portion of the first bulk tungsten layer includes etching the first tungsten bulk layer to remove tungsten through the point of seam formation.

6. The method of claim 1, wherein selectively depositing a second bulk tungsten layer on the etched tungsten layer includes depositing the second bulk tungsten layer on the etched tungsten layer without forming a nucleation layer in the feature after etching the portion of the first bulk tungsten layer.

7. The method of claim 1, wherein the feature is a vertical feature.

8. The method of claim 1, wherein the feature is a horizontal feature.

9. The method of claim 1, wherein etching the portion of the first tungsten bulk layer includes exposing the first tungsten bulk layer to radical species.

10. The method of claim 1, wherein etching the portion of the first tungsten bulk layer includes exposing the first tungsten bulk layer to a remotely-generated plasma.

11. The method of claim 1, wherein etching a portion of the first bulk tungsten layer includes non-conformal etching of the first bulk tungsten layer.

12. The method of claim 1, wherein etching a portion of the first bulk tungsten layer includes conformal etching of the first bulk tungsten layer.

13. The method of claim 1, wherein etching a portion of the first bulk tungsten layer includes selectively etching tungsten with respect to an under-layer lining the feature on which the first tungsten bulk layer is deposited.

14. A method comprising:
   providing a substrate including a feature including a constriction;
   depositing tungsten in the feature through the constriction;
   etching the deposited tungsten through the constriction to leave an etched tungsten layer in the feature below the constriction and to expose sidewalls of the feature above the constriction; and
   selectively depositing a second bulk tungsten layer on the etched tungsten layer.

15. A method comprising:

providing a substrate including a feature;

depositing a first bulk tungsten layer in the feature;

etching the first bulk tungsten layer to form an etched tungsten layer, wherein etching the first bulk tungsten layer includes removing tungsten in the feature up to a recess depth thereby leaving exposed sidewalls of the feature; and depositing a second bulk tungsten layer in the feature.

16. The method of claim 15, wherein the first bulk layer only partially fills the feature.

17. The method of claim 16, wherein etching the first bulk layer comprises lateral etching of a region of the first bulk layer.

18. The method of claim 15, wherein the second bulk tungsten layer is selectively deposited on the etched tungsten layer.

19. The method of claim 1, wherein removing tungsten from a portion of the sidewalls of the feature to expose the portion of the sidewalls comprises removing tungsten to leave a discontinuous film of tungsten on the sidewalls.

20. The method of claim 15 wherein etching the deposited tungsten through the constriction to exposing sidewalls of the feature above the contriction comprises leaving a discontinuous film of tungsten on the sidewalls.

* * * * *